US012414296B2

(12) United States Patent
Mukae et al.

(10) Patent No.: US 12,414,296 B2
(45) Date of Patent: Sep. 9, 2025

(54) THREE DIMENSIONAL MEMORY DEVICE AND METHOD OF MAKING THEREOF BY FORMING CHANNEL AND MEMORY FILM AFTER WORD LINE REPLACEMENT

(71) Applicant: SANDISK TECHNOLOGIES LLC, Addison, TX (US)

(72) Inventors: Yusuke Mukae, Nagoya (JP); Naoki Takeguchi, Nagoya (JP); Yujin Terasawa, Yokkaichi (JP); Tatsuya Hinoue, Yokkaichi (JP); Ramy Nashed Bassely Said, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 974 days.

(21) Appl. No.: 17/523,418

(22) Filed: Nov. 10, 2021

(65) Prior Publication Data

US 2022/0352199 A1 Nov. 3, 2022

Related U.S. Application Data

(63) Continuation-in-part of application No. 17/244,186, filed on Apr. 29, 2021, now Pat. No. 11,968,826.

(51) Int. Cl.
*H10B 43/27* (2023.01)
*H10B 41/27* (2023.01)

(52) U.S. Cl.
CPC ............ *H10B 43/27* (2023.02); *H10B 41/27* (2023.02)

(58) Field of Classification Search
None
See application file for complete search history.

(56) References Cited

U.S. PATENT DOCUMENTS 8,349,681 B2 1/2013 Alsmeier et al.
8,658,499 B2 2/2014 Makala et al.
8,847,302 B2 9/2014 Alsmeier et al.
9,230,976 B2 1/2016 Alsmeier
(Continued)

FOREIGN PATENT DOCUMENTS

WO WO 2021/118627 A1 6/2021

OTHER PUBLICATIONS

USPTO Office Communication, Non-Final Office Action for U.S. Appl. No. 17/244,186, mailed Feb. 28, 2023, 17 pages.
(Continued)

*Primary Examiner* — Nilufa Rahim
(74) *Attorney, Agent, or Firm* — THE MARBURY LAW GROUP PLLC

(57) ABSTRACT

A method of forming a three-dimensional memory device includes forming an alternating stack of insulating layers and sacrificial material layers over a substrate, forming a memory opening extending through the alternating stack, forming a sacrificial memory opening fill structure in the memory opening, replacing the sacrificial material layers with electrically conductive layers, removing the sacrificial memory opening fill structure selective to the electrically conductive layers, and forming a memory opening fill structure the memory opening after replacing the sacrificial material layers with electrically conductive layers and after removing the sacrificial memory opening fill structure. The memory opening fill structure includes a memory film and a vertical semiconductor channel.

10 Claims, 71 Drawing Sheets

(56) References Cited

U.S. PATENT DOCUMENTS 9,230,983 B1 1/2016 Sharangpani et al.
9,252,151 B2 2/2016 Chien et al.
9,343,507 B2 5/2016 Takaki
9,356,031 B2 5/2016 Lee et al.
9,397,046 B1 7/2016 Sharangpani et al.
9,397,093 B2 7/2016 Makala et al.
9,419,012 B1 8/2016 Shimabukuro et al.
9,449,982 B2 9/2016 Lu et al.
9,496,419 B2 11/2016 Sharangpani et al.
9,570,455 B2 2/2017 Sharangpani et al.
9,576,975 B2 2/2017 Zhang et al.
9,627,399 B2 4/2017 Kanakamedala et al.
9,646,975 B2 5/2017 Peri et al.
9,691,884 B2 6/2017 Makala et al.
9,698,223 B2 7/2017 Sharangpani et al.
9,748,174 B1 8/2017 Amano
9,780,182 B2 10/2017 Peri et al.
9,793,139 B2 10/2017 Sharangpani et al.
9,799,671 B2 10/2017 Pachamuthu et al.
9,842,907 B2 12/2017 Makala et al.
9,875,929 B1 1/2018 Shukla et al.
9,984,963 B2 5/2018 Peri et al.
10,083,983 B2 9/2018 Shigemura et al.
10,103,169 B1 10/2018 Ge et al.
10,115,732 B2 10/2018 Yu et al.
10,192,784 B1 1/2019 Cui et al.
10,229,931 B1 3/2019 Hinoue et al.
10,256,247 B1 4/2019 Kanakamedala et al.
10,276,583 B2 4/2019 Sharangpani et al.
10,283,513 B1 5/2019 Zhou et al.
10,290,648 B1 5/2019 Zhou et al.
10,290,650 B1 5/2019 Iwai
10,290,652 B1 5/2019 Sharangpani et al.
10,304,852 B1 5/2019 Cui et al.
10,319,680 B1 6/2019 Sel et al.
10,361,213 B2 7/2019 Sharangpani et al.
10,381,362 B1 8/2019 Cui et al.
10,381,366 B1 8/2019 Takahashi et al.
10,510,738 B2 12/2019 Kim et al.
10,529,620 B2 1/2020 Sharangpani et al.
10,608,010 B2 3/2020 Terasawa et al.
10,615,123 B2 4/2020 Hinoue et al.
10,700,078 B1 6/2020 Cui et al.
10,700,090 B1 6/2020 Cui et al.
10,707,233 B1 7/2020 Cui et al.
10,741,572 B2 8/2020 Sharangpani et al.
10,818,542 B2 10/2020 Cui et al.
11,063,063 B2 7/2021 Zhang et al.
11,101,288 B2 8/2021 Zhang et al.
2010/0163968 A1 7/2010 Kim et al.
2010/0189846 A1 7/2010 Irie et al.
2012/0001249 A1 1/2012 Alsmeier et al.
2012/0092926 A1* 4/2012 Whang .............. H10D 30/0411 365/185.01
2013/0264631 A1 10/2013 Alsmeier et al.
2014/0070300 A1 3/2014 Jang et al.
2014/0225181 A1 8/2014 Makala et al.
2015/0008505 A1 1/2015 Chien et al.
2015/0035035 A1 2/2015 Matsuda
2015/0294978 A1 10/2015 Lu et al.
2015/0371997 A1 12/2015 Higuchi et al.
2016/0043093 A1 2/2016 Lee et al.
2016/0086972 A1 3/2016 Zhang et al.
2016/0149002 A1 5/2016 Sharangpani et al.
2016/0172370 A1 6/2016 Makala et al.
2016/0225866 A1 8/2016 Peri et al.
2016/0300848 A1 10/2016 Pachamuthu et al.
2016/0351497 A1 12/2016 Peri et al.
2017/0025431 A1 1/2017 Kanakamedala et al.
2017/0084618 A1 3/2017 Peri et al.
2017/0098656 A1 4/2017 Son et al.
2017/0125538 A1 5/2017 Sharangpani et al.
2017/0243879 A1 8/2017 Yu et al.
2017/0352669 A1 12/2017 Sharangpani et al.
2017/0373079 A1 12/2017 Sharangpani et al.
2018/0033646 A1 2/2018 Sharangpani et al.
2018/0090373 A1 3/2018 Sharangpani et al.
2018/0138194 A1 5/2018 Shigemura et al.
2019/0139973 A1 5/2019 Zhou et al.
2019/0164989 A1 5/2019 Lee et al.
2019/0221557 A1 7/2019 Kim et al.
2019/0259772 A1 8/2019 Takahashi et al.
2019/0280001 A1 9/2019 Terasawa et al.
2019/0287916 A1 9/2019 Sharangpani et al.
2019/0287982 A1 9/2019 Hinoue et al.
2019/0288192 A1 9/2019 Takahashi et al.
2020/0006131 A1 1/2020 Shimabukuro et al.
2020/0119030 A1 4/2020 Dasgupta et al.
2021/0082955 A1 3/2021 Rajashekhar et al.
2021/0104546 A1* 4/2021 Xiao .................... H10D 64/037
2021/0193674 A1 6/2021 Said et al.
2021/0202703 A1 7/2021 Rajashekhar et al.
2021/0265372 A1 8/2021 Kanakamedala et al.
2021/0265385 A1 8/2021 Rajashekhar et al.
2022/0085060 A1 3/2022 Narasaki et al.
2022/0130862 A1 4/2022 Lue
2022/0293618 A1 9/2022 Kim et al.
2022/0310522 A1 9/2022 Greenlee et al.
2022/0344362 A1 10/2022 Cui et al.

OTHER PUBLICATIONS

U.S. Appl. No. 16/987,717, filed Aug. 7, 2020, SanDisk Technologies LLC.
U.S. Appl. No. 17/085,735, filed Oct. 30, 2020, SanDisk Technologies LLC.
U.S. Appl. No. 17/134,997, filed Dec. 28, 2020, SanDisk Technologies LLC.
U.S. Appl. No. 17/153,972, filed Jan. 21, 2021, SanDisk Technologies LLC.
Endoh et al., "Novel Ultra High Density Memory with a Stacked-Surrounding Gate Transistor (S-SGT) Structured Cell," IEDM Proc. (2001) pp. 33-36.
Groenen, P. A. C., "The reaction mechanism of W-CVD on Si", Technische Universiteit Eindhoven, (1993), https://doi.org/10.6100/iR391180.
U.S. Appl. No. 17/166,393, filed Feb. 3, 2021, SanDisk Technologies LLC.
U.S. Appl. No. 17/237,447, filed Apr. 22, 2021, SanDisk Technologies LLC.
U.S. Appl. No. 17/244,186, filed Apr. 29, 2021, SanDisk Technologies LLC.
U.S. Appl. No. 17/351,756, filed Jun. 18, 2021, SanDisk Technologies LLC.
U.S. Appl. No. 17/351,789, filed Jun. 18, 2021, SanDisk Technologies LLC.
U.S. Appl. No. 17/351,811, filed Jun. 18, 2021, SanDisk Technologies LLC.
U.S. Appl. No. 17/378,196, filed Jul. 16, 2021, SanDisk Technologies LLC.
U.S. Appl. No. 17/507,224, filed Oct. 21, 2021, SanDisk Technologies LLC.
U.S. Appl. No. 17/509,323, filed Oct. 25, 2021, SanDisk Technologies LLC.
U.S. Appl. No. 17/512,383, filed Oct. 27, 2021, SanDisk Technologies LLC.
U.S. Appl. No. 17/523,447, filed Nov. 10, 2021, SanDisk Technologies LLC.
U.S. Appl. No. 17/523,487, filed Nov. 10, 2021, SanDisk Technologies LLC.
ISR—Notification of Transmittal of the International Search Report and Written Opinion of the International Searching Authority for International Patent Application No. PCT/US2021/065564, mailed Apr. 10, 2022, 15 pages.
USPTO Office Communication, Non-Final Office Action for U.S. Appl. No. 17/523,447, mailed Jun. 27, 2024, 30 pages.

(56) References Cited

OTHER PUBLICATIONS

USPTO Office Communication, Non-Final Office Action for U.S. Appl. No. 17/244,186, mailed Sep. 14, 2023, 19 pages.

* cited by examiner

THREE DIMENSIONAL MEMORY DEVICE AND METHOD OF MAKING THEREOF BY FORMING CHANNEL AND MEMORY FILM AFTER WORD LINE REPLACEMENT

RELATED APPLICATIONS

This application is a continuation-in-part application of U.S. application Ser. No. 17/244,186 filed on Apr. 29, 2021, the entire contents of which are incorporated herein by reference.

FIELD

The present disclosure relates generally to the field of semiconductor devices, and particularly to a three-dimensional memory device and methods of making the same.

BACKGROUND

A three-dimensional memory device including a three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of forming a three-dimensional memory device includes forming an alternating stack of insulating layers and sacrificial material layers over a substrate, forming a memory opening extending through the alternating stack, forming a sacrificial memory opening fill structure in the memory opening, replacing the sacrificial material layers with electrically conductive layers, removing the sacrificial memory opening fill structure selective to the electrically conductive layers, and forming a memory opening fill structure the memory opening after replacing the sacrificial material layers with electrically conductive layers and after removing the sacrificial memory opening fill structure. The memory opening fill structure includes a memory film and a vertical semiconductor channel.

According to another aspect of the present disclosure, a three-dimensional memory device comprises an alternating stack of insulating layers and electrically conductive layers; a memory opening extending through the alternating stack; and a memory opening fill structure located in the memory opening and comprising a vertical semiconductor channel and a memory film, wherein each electrically conductive layer within a subset of the electrically conducive layers comprises: a metallic fill material layer comprising a metal and contacting a first surface portion of the memory film; a lower metallic liner contacting a bottom surface of the metallic fill material layer; and an upper metallic liner contacting a top surface of the metallic fill material layer.

According to yet another aspect of the present disclosure, a three-dimensional memory device is provided, which comprises: an alternating stack of insulating layers and electrically conductive layers; a memory opening extending through the alternating stack; and a memory opening fill structure located in the memory opening and comprising a vertical semiconductor channel and a memory film, wherein each of the electrically conductive layers comprises: a metallic fill material layer comprising a metal; a lower metallic liner comprising a first portion of a metallic liner material and contacting a bottom surface of the metallic fill material layer; and an upper metallic liner comprising a second portion of the metallic liner material and contacting a top surface of the metallic fill material layer, wherein the metallic fill material layer, the lower metallic liner, and the upper metallic liner are more distal than the insulating layers from a vertical axis passing through a geometrical center of the memory opening fill structure.

According to still another aspect of the present disclosure, a method of forming a three-dimensional memory device is provided, which comprises: forming an alternating stack of insulating layers and sacrificial material layers over a substrate; forming a memory opening extending through the alternating stack; forming a sacrificial memory opening fill structure in the memory opening; replacing the sacrificial material layers with electrically conductive layers; removing the sacrificial memory opening fill structure selective to the electrically conductive layers, wherein a memory cavity is formed within a volume of the memory opening; laterally recessing the electrically conductive layers selective to the insulating layers around the memory cavity by performing a selective isotropic etch process; and forming a memory opening fill structure in the memory cavity, wherein the memory opening fill structure comprises a memory film and a vertical semiconductor channel.

According to even another aspect of the present disclosure, a three-dimensional memory device is provided, which comprises: an alternating stack of insulating layers and electrically conductive layers; memory openings extending through the alternating stack; and memory opening fill structures located in the memory openings and comprising a respective vertical semiconductor channel and a respective memory film, wherein each electrically conductive layer within a subset of the electrically conducive layers comprises: a metallic fill material layer comprising a metal; and a metallic liner comprising an upper horizontally-extending portion overlying the metallic fill material layer, a lower horizontally-extending portion underlying the metallic fill material layer, and a vertically-extending portion connecting the upper horizontally-extending portion and the lower horizontally-extending portion and having a greater vertical extent than a vertical distance between a top surface of the upper horizontally-extending portion and a bottom surface of the lower horizontally-extending portion.

According to further another aspect of the present disclosure, a method of forming a three-dimensional memory device is provided, which comprises: forming an alternating stack of insulating layers and sacrificial material layers over a substrate; forming a memory opening extending through the alternating stack; forming a dielectric liner on a sidewall of the memory opening; forming a sacrificial memory opening fill material portion in the memory opening over the dielectric liner; forming backside recesses by removing the sacrificial material layers selective to the insulating layers; etching portions of the dielectric liner at levels of the backside recesses selective to the insulating layers and the sacrificial memory opening fill material portion such that the backside recesses are expanded in volume; forming electrically conductive layers in the backside recesses; removing the sacrificial memory opening fill material portion selective to the electrically conductive layers, wherein a memory cavity is formed within a volume of the memory opening; and forming a memory opening fill structure in the memory cavity, wherein the memory opening fill structure comprises a memory film and a vertical semiconductor channel.

According to one embodiment, a three-dimensional memory device includes an alternating stack of insulating layers and electrically conductive layers, memory openings extending through the alternating stack, and memory opening fill structures located in the memory openings and containing a respective vertical semiconductor channel and a respective memory film. Each of the electrically conductive layers includes a tubular metallic liner in contact with a respective outer sidewall segment of a respective one of the memory opening fill structures, an electrically conductive barrier layer contacting the respective tubular metallic liner and two of the insulating layers, and a metallic fill material layer contacting the electrically conductive barrier layer, and not contacting the tubular metallic liner or any of the insulating layers.

According to another embodiment, a method of forming a three-dimensional memory device comprises forming an alternating stack of insulating layers and sacrificial material layers over a substrate, forming memory openings through the alternating stack, and forming sacrificial memory opening fill structures in the memory openings, wherein each of the sacrificial memory opening fill structures comprises a respective nucleation material liner. The method also includes forming backside recesses by removing the sacrificial material layers selective to the insulating layers, forming tubular metallic liners by reacting a metal-containing precursor gas with surface portions of the nucleation material liners that are physically exposed to the backside recesses, forming a metallic fill material layer in the backside recesses, removing the sacrificial memory opening fill structures from the memory openings, outgassing a halogen from the metallic fill material layer through the memory opening fill structures, and forming memory opening fill structures in the memory openings after the step of outgassing. Each of the memory opening fill structures comprises a respective memory film and a respective vertical semiconductor channel.

DETAILED DESCRIPTION

Figure 1:
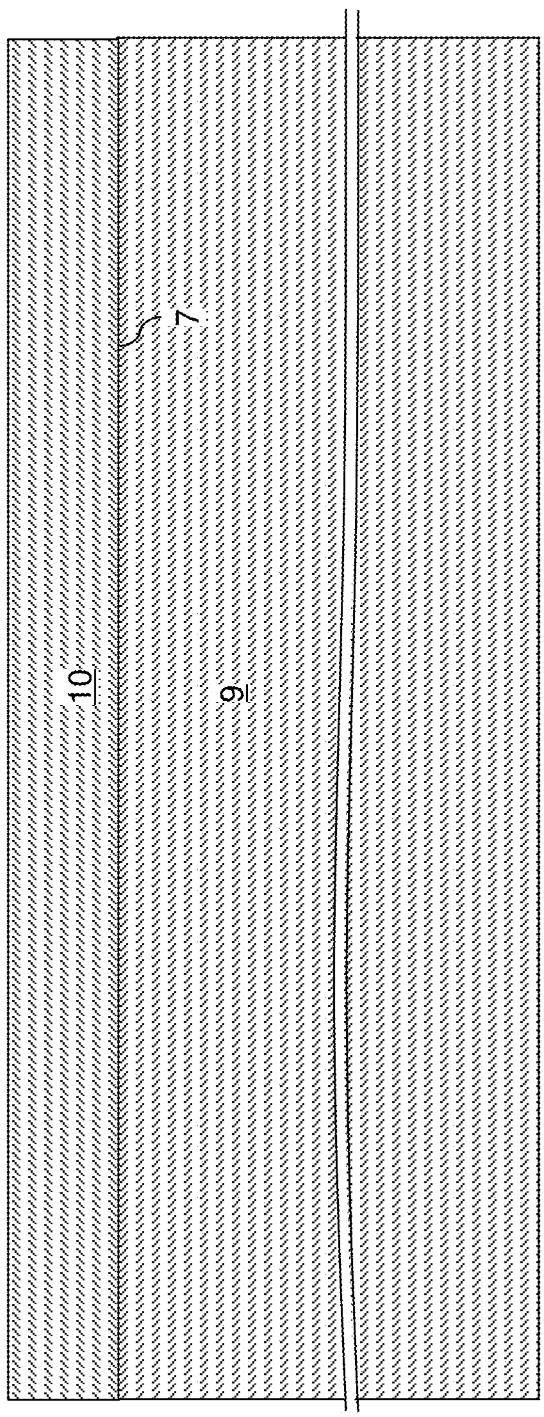
FIG. 1 is a schematic vertical cross-sectional view of a first exemplary structure including a substrate layer and an optional semiconductor material layer according to an embodiment of the present disclosure.

As discussed above, the embodiments of the present disclosure are directed to three-dimensional memory devices in which the word line replacement process may occur prior to forming the memory film and the vertical semiconductor channel. The embodiments of the present disclosure can be used to form various structures including a multilevel memory structure, non-limiting examples of which include semiconductor devices, such as three-dimensional memory devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein. As used herein, a first electrical component is electrically connected to a second electrical component if there exists an electrically conductive path between the first electrical component and the second electrical component.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many external commands as the total number of dies therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. Each plane contains a number of memory blocks (or "blocks"), which are the smallest unit that can be erased by in a single erase operation. Each memory block contains a number of pages, which are the smallest units that can be selected for programming.

Referring to FIG. 1, a first exemplary structure according to an embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate layer 9 and an optional semiconductor material layer 10. The substrate layer 9 maybe a semiconductor wafer (such as a silicon wafer) or a silicon-on-insulator substrate. The substrate layer 9 can include a major surface 7, which can be a planar surface. In one embodiment, the major surface 7 can be a single crystalline semiconductor surface, such as a single crystalline silicon surface.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm.

An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Figure 2:
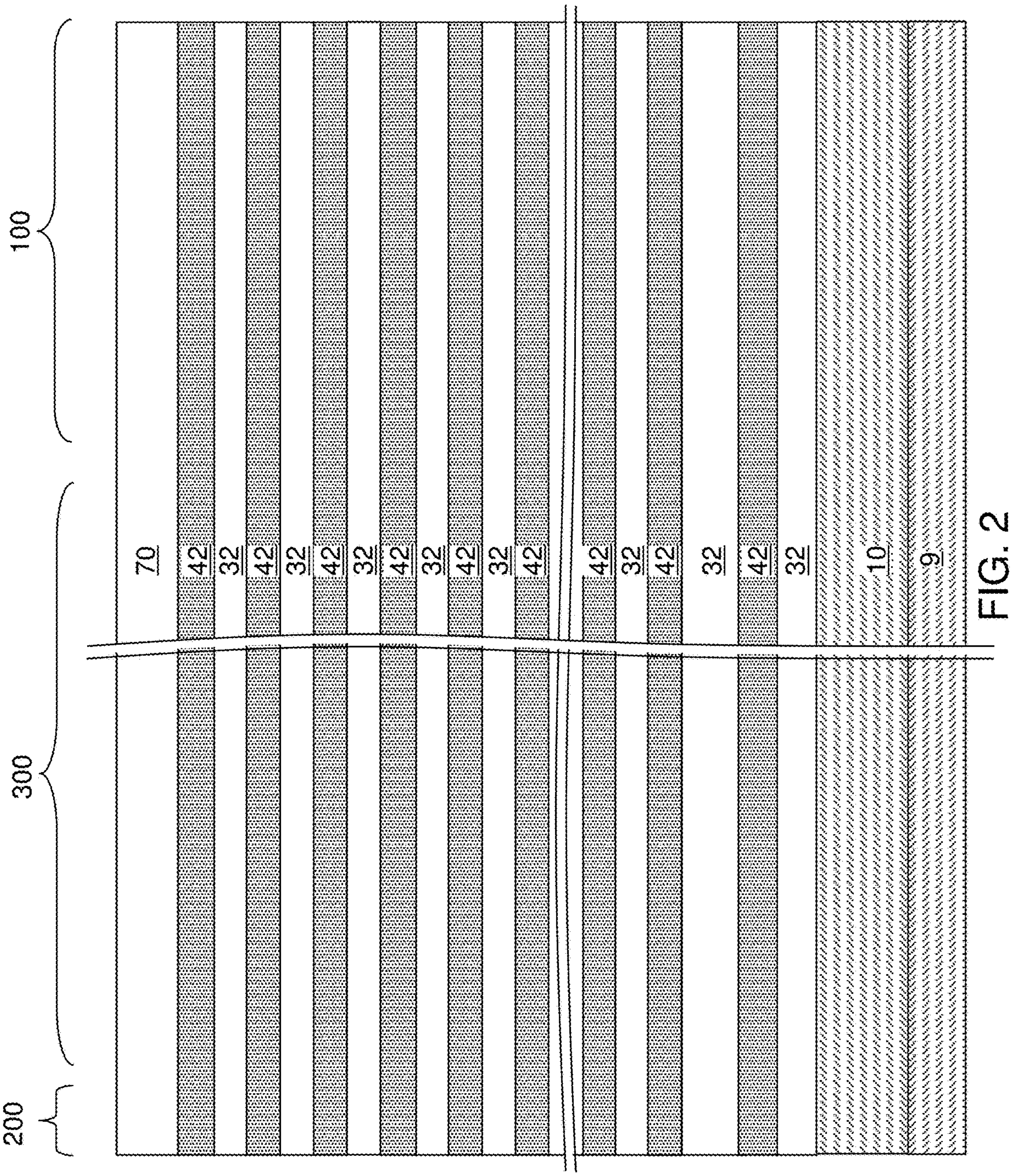
FIG. 2 is a schematic vertical cross-sectional view of the first exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

The first exemplary structure may include a memory array region 100 in which memory stack structures are subsequently formed, a contact region 300 in which stepped surfaces are subsequently formed, and a peripheral region 200.

Figure 3:
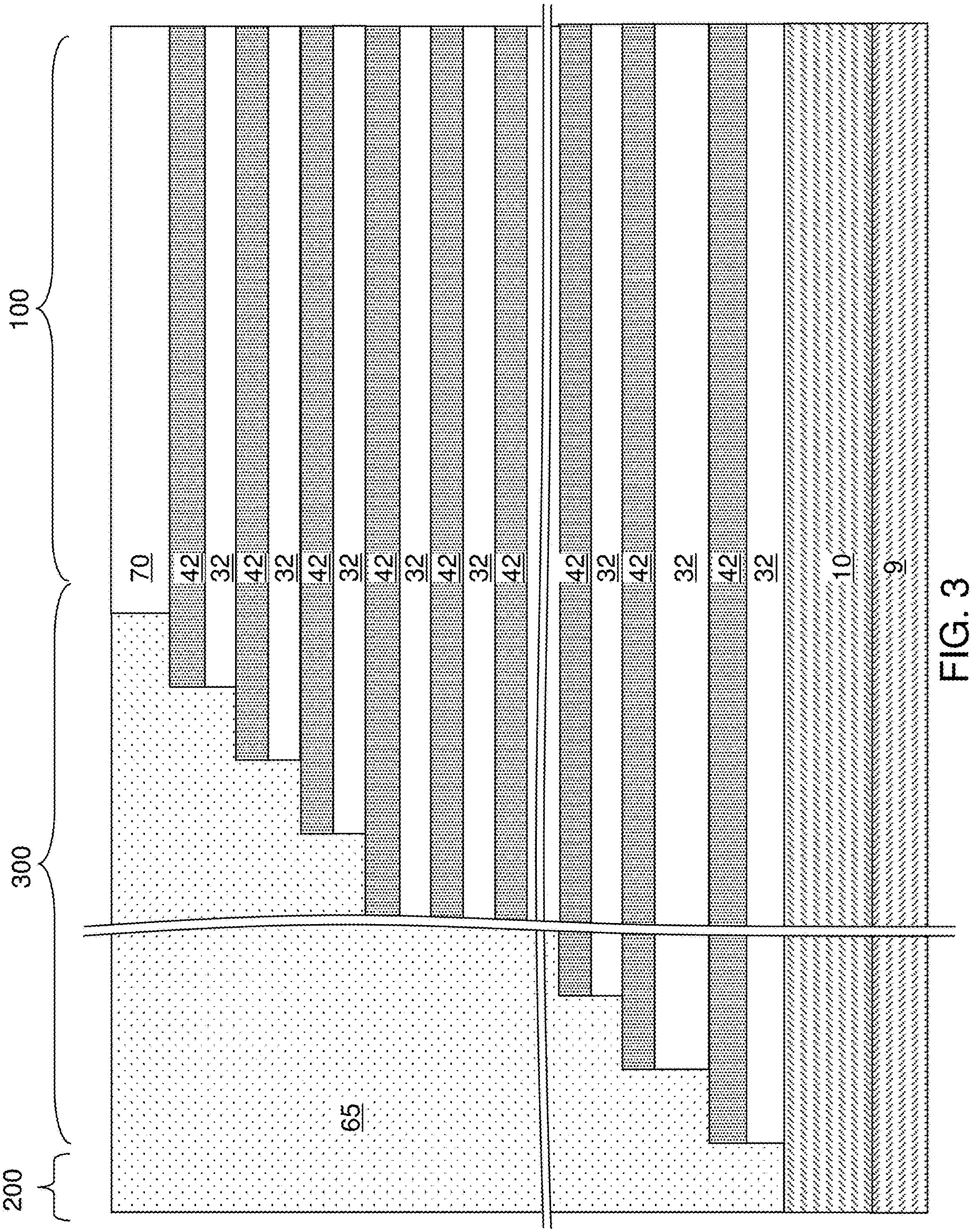
FIG. 3 is a schematic vertical cross-sectional view of the first exemplary structure after formation of stepped terraces and a retro-stepped dielectric material portion according to an embodiment of the present disclosure.

Referring to FIG. 3, stepped surfaces are formed in the alternating stack (32, 42) in the contact region 300, which may also be referred to as a staircase region or a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
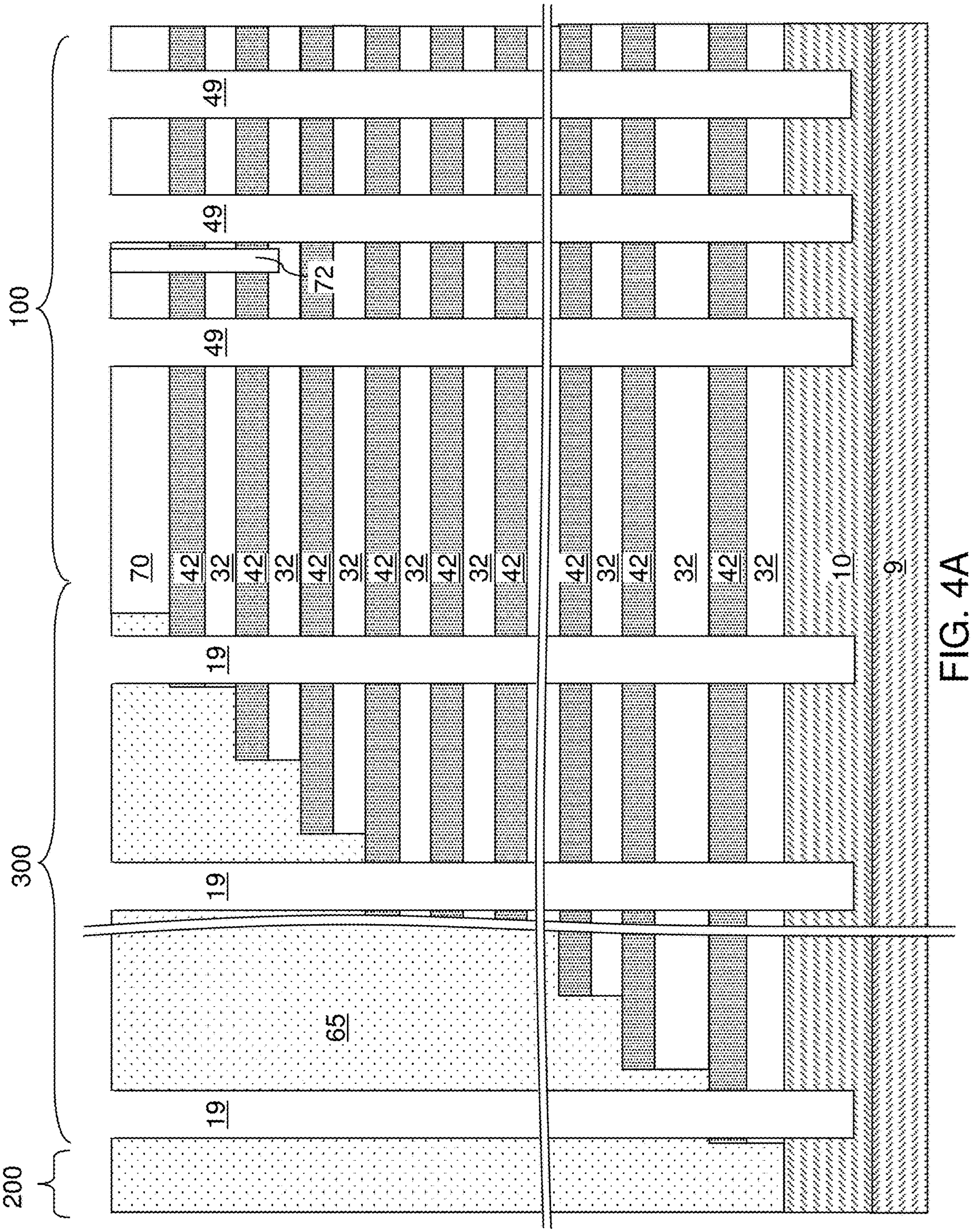
FIG. 4A is a schematic vertical cross-sectional view of the first exemplary structure after formation of memory openings and support openings according to an embodiment of the present disclosure.
Figure 4B:
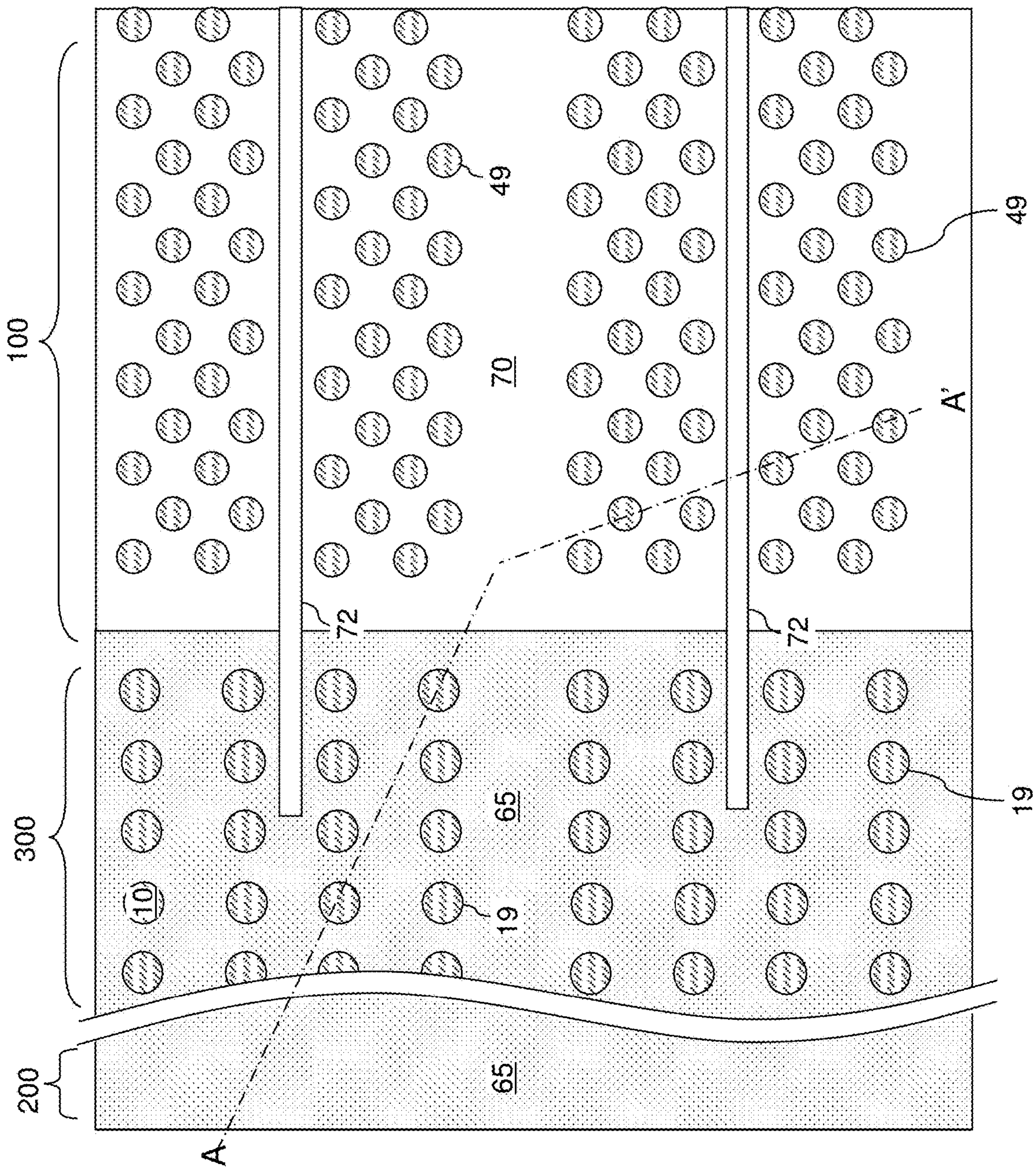
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate layer 9.

Figure 5:
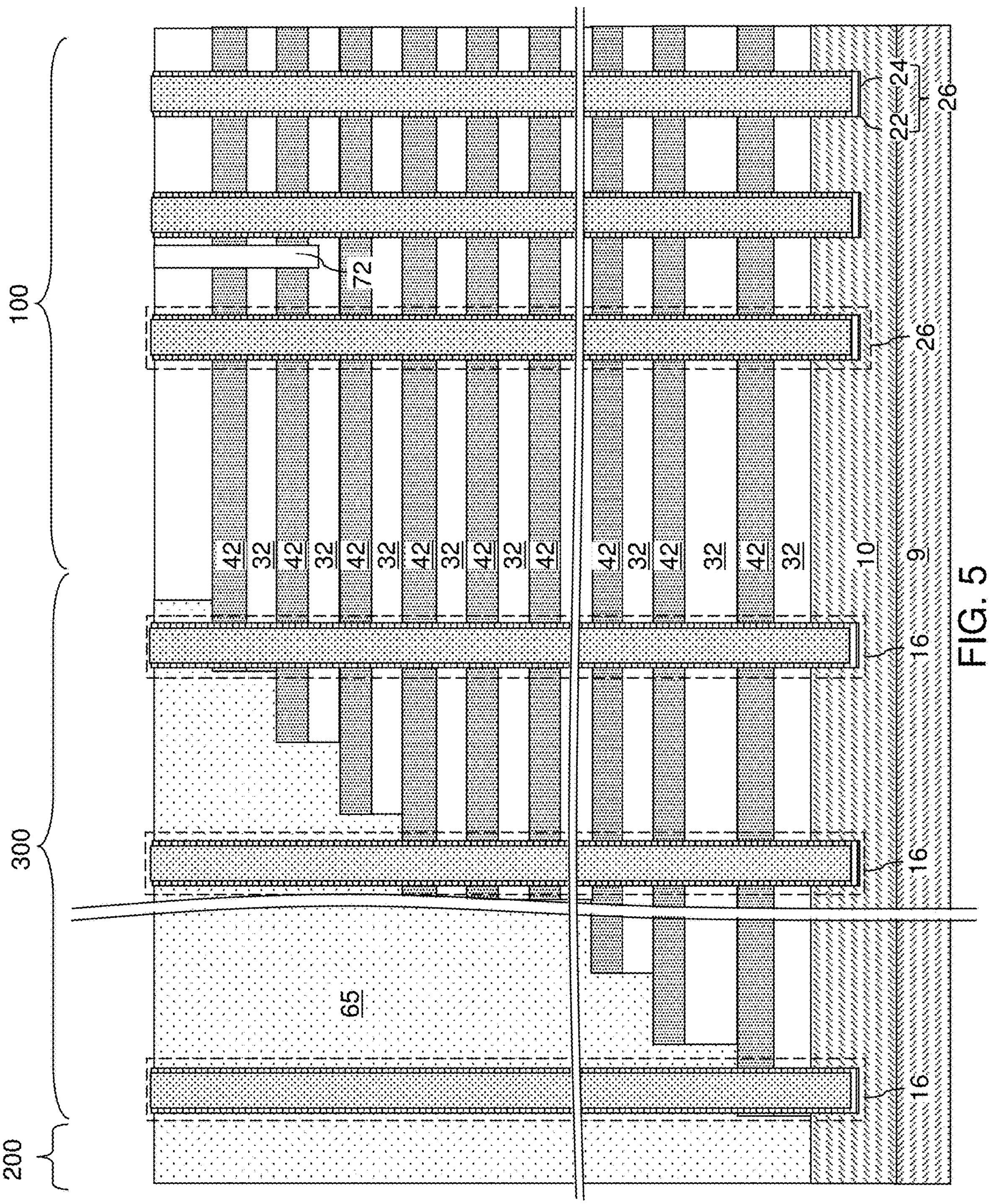
FIG. 5 is a schematic vertical cross-sectional view of the first exemplary structure after formation of sacrificial memory opening fill structures and sacrificial support opening fill structures according to an embodiment of the present disclosure.

Referring to FIG. 5, a material that can induce nucleation of a metallic material can be conformally deposited in the memory openings 49 and the support openings 19 to form a nucleation material liner 22. The nucleation material liner may include a semiconductor material that can react with a metal-containing precursor gas to induce deposition of a metal, such as tungsten from the metal-containing precursor gas, such as tungsten hexafluoride or tungsten pentachloride.

In an illustrative example, the nucleation material liner 22 may include, and/or may consist essentially of, a semiconductor material such as silicon, for example polysilicon or amorphous silicon. Alternatively, the nucleation material liner 22 may include, and/or may consist essentially of, boron, boron nitride, or a boron-silicon alloy. The thickness of the nucleation material liner 22 can be selected to be less than one half of the average thickness of the insulating layers 32, and may be in a range from 0.1% to 5%, such as from 0.2% to 2% of the average thickness of the insulating layers 32. In one embodiment, the thickness of the nucleation material liner 22 may be in a range from 0.5 nm to 5 nm, such as from 1 nm to 3 nm, although lesser and greater thicknesses may also be employed.

A sacrificial fill material can be deposited in remaining volumes of the memory openings 49 and the support openings 19 by a conformal or non-conformal deposition process. The sacrificial fill material may be any material that can be removed selective to the material of the insulating layers 32. In an illustrative example, the sacrificial fill material may include a carbon-based material, such as amorphous carbon or diamond-like carbon (DLC), a glass material, such as borosilicate glass or organosilicate glass that provide high etch rates in dilute hydrofluoric acid, or a semiconductor material, such as germanium or a silicon-germanium alloy.

Excess portions of the sacrificial fill material and the nucleation material liner 22 can be removed from above the horizontal plane including the top surface of the insulating cap layer 70 by performing a planarization process, which may employ a chemical mechanical polishing process and/or a recess etch process. The nucleation material liner 22 can be divided into multiple nucleation material liners 22 located within a respective one of the memory openings 49 or the support openings 19. Each remaining portion of the sacrificial fill material located in a memory opening 49 or in a support opening 19 constitutes a sacrificial fill material portion 24. Each combination of a nucleation material liner 22 and a sacrificial fill material portion 24 located in a memory opening 49 constitutes a sacrificial memory opening fill structure 26. Each combination of a nucleation material liner 22 and a sacrificial fill material portion 24 located in a support opening 19 constitutes a sacrificial support opening fill structure 16.

Figure 6A:
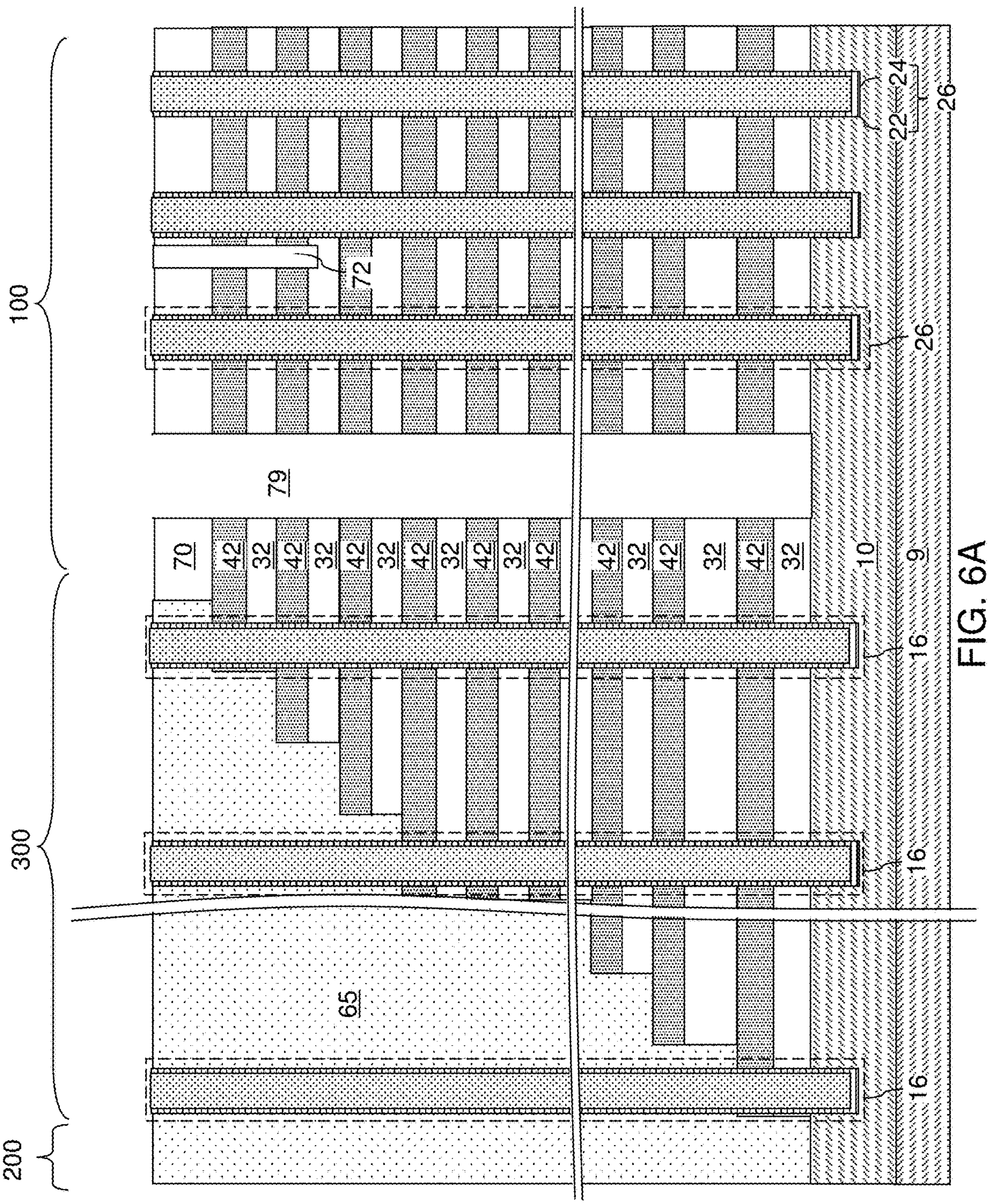
FIG. 6A is a schematic vertical cross-sectional view of the first exemplary structure after formation of backside trenches according to an embodiment of the present disclosure.
Figure 6B:
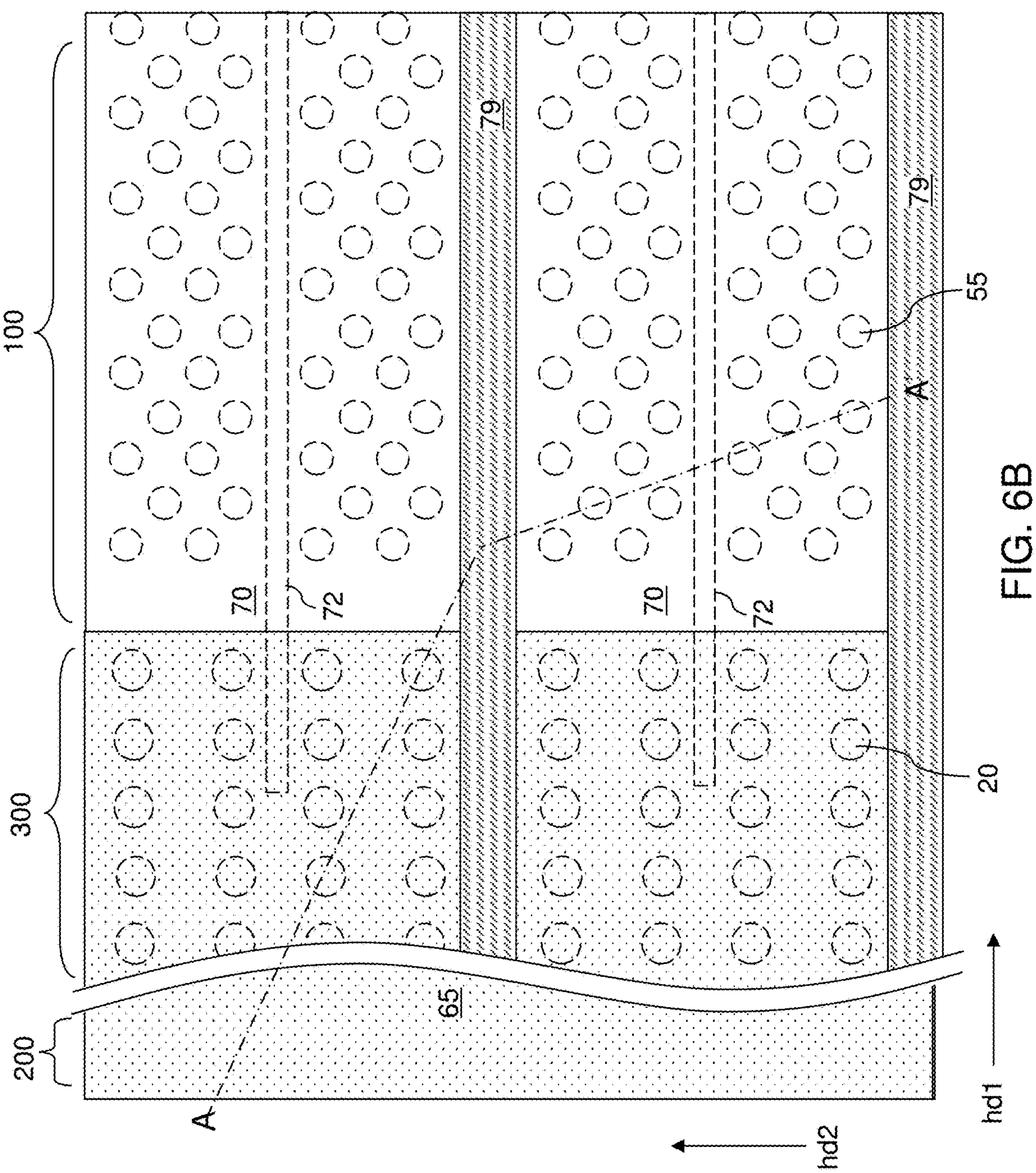
FIG. 6B is a top-down view of the first exemplary structure of FIG. 6A. The vertical plane A-A' is the plane of the cross-section for FIG. 6A.

Referring to FIGS. 6A and 6B, a photoresist layer (not shown) can be applied over the alternating stack (32, 42), and can be lithographically patterned to form openings in areas between clusters of sacrificial memory opening fill structures 26. The pattern in the photoresist layer can be transferred through the alternating stack (32, 42) and the retro-stepped dielectric material portion 65 employing an anisotropic etch to form backside trenches 79, which vertically extend from the top surface of the insulating cap layer 70 at least to the top surface of the substrate (9, 10), and laterally extend through the memory array region 100 and the contact region 300.

In one embodiment, the backside trenches 79 can laterally extend along a first horizontal direction (e.g., word line direction) hd1 and can be laterally spaced apart from each other along a second horizontal direction (e.g., bit line direction) hd2 that is perpendicular to the first horizontal direction hd1. The sacrificial memory opening fill structures 26 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of sacrificial memory opening fill structures 26 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

Figure 7:
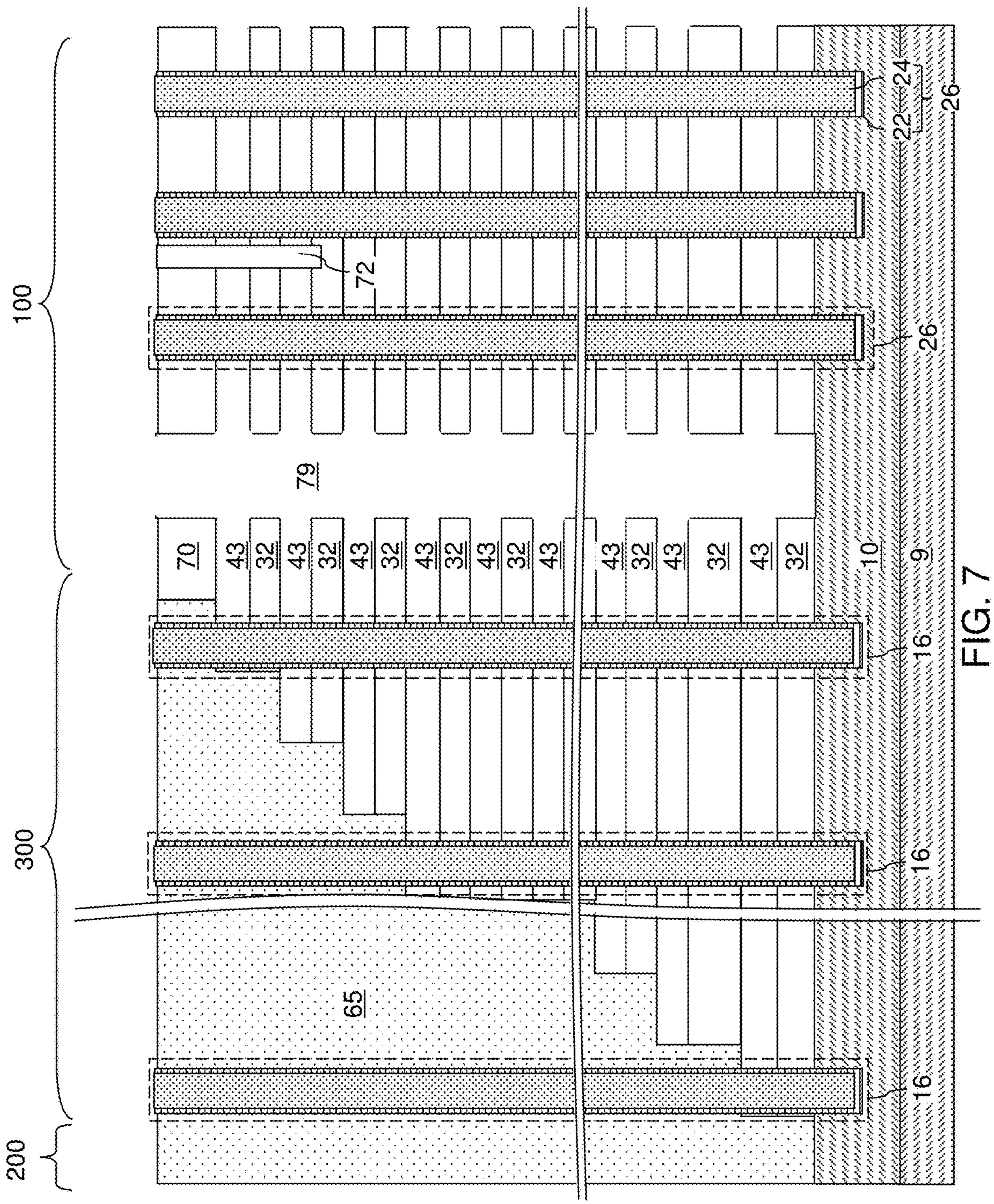
FIG. 7 is a schematic vertical cross-sectional view of the first exemplary structure after formation of backside recesses according to an embodiment of the present disclosure.

Referring to FIG. 7, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the nucleation material liners 22. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the nucleation material liners 22 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, boron, boron alloys, and various other materials employed in the art. The sacrificial support opening fill structures 16, the retro-stepped dielectric material portion 65, and the sacrificial memory opening fill structures 26 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the sacrificial memory opening fill structures 26 are present are herein referred to as front-side openings or front-side cavities in contrast with the backside recesses 43. In this case, each backside recess 43 can define a space for receiving a respective word line of an array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 8:
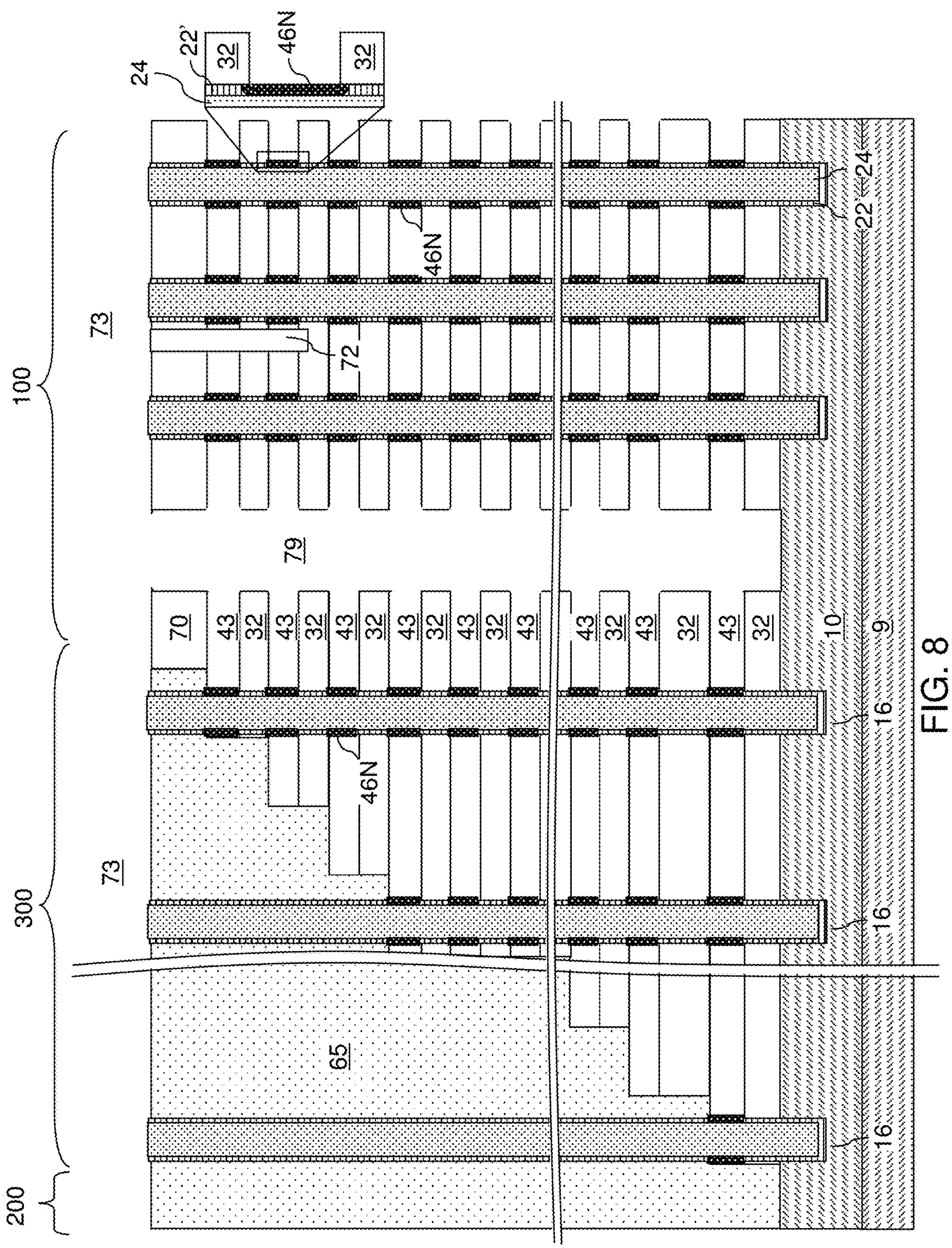
FIG. 8 is a schematic vertical cross-sectional view of the first exemplary structure after formation of tubular metallic liners according to an embodiment of the present disclosure.

Referring to FIG. 8, the first exemplary structure can be disposed in a vacuum process chamber, and a first metal-containing precursor gas can be flowed into the process chamber. The first metal-containing precursor gas can be supplied into the backside trenches 79 and into the backside recesses 43 in a deposition process, which may include an atomic layer deposition (ALD) process or a chemical vapor deposition (CVD) process. The molecules of the first metal-containing precursor gas include a first metallic element that can react with surface portions of the nucleation material liners 22 that are physically exposed to the backside recesses 43 and can form a first metallic material, i.e., a conductive material including at least one metal element.

In one embodiment, the first metal-containing precursor gas may include a transition metal element (such as tungsten, ruthenium, cobalt, molybdenum, titanium, tantalum, etc.) and a halide element such as fluorine or chlorine. In an illustrative example, the first metal-containing precursor gas may include tungsten hexafluoride or tungsten pentachloride.

Tubular metallic liners 46N can be formed by reacting the first metal-containing precursor gas including the first metallic element with surface portions of the nucleation material liners 22 that are physically exposed to the backside recesses 43. The first metallic material of the tubular metallic (i.e., electrically conductive) liners 46N comprises atoms of the first metallic element derived from the first metal-containing precursor gas. Unreacted portions of the nucleation material liners 22 comprise annular portions 22' of the nucleation material liners 22. The annular portions 22' of the nucleation material liners 22 contact an inner sidewall of a respective one of the insulating layers 32. Annular portions 22' of the nucleation material liners 22 located in a same memory opening 49 can be vertically spaced from each other, and can consist essentially of the material of the nucleation material liners 22 as initially formed. The annular portions 22' of the nucleation material liners 22 can contact a respective inner sidewall of the insulating layers 32 after formation of the tubular metallic liners 46N. A vertically alternating stack of metallic liners 46N and annular portions 22' of the nucleation material liners 22 is formed surrounding the respective memory openings 49 and support openings 19.

A plurality of tubular metallic liners 46N can be formed surrounding each memory opening 49. Each of the plurality of tubular metallic liners 46N can comprise a cylindrical outer sidewall having a closed upper edge and a closed lower edge and physically exposed to a respective one of the backside recesses 43. As used herein, a closed edge refers to an edge that does not have an end point. Each of the plurality of tubular metallic liners 46N can comprise an inner sidewall including a straight inner sidewall segment (which may, or may not, contact a cylindrical surface of a sacrificial fill material portion 24), an upper tilted convex surface segment connecting an upper edge of the straight inner sidewall segment to the closed upper edge of the cylindrical outer sidewall, and a lower tilted convex surface segment connecting a lower edge of the straight inner sidewall segment to the closed lower edge of the cylindrical outer sidewall. In one embodiment, the straight inner sidewall segment can contact a sidewall of a sacrificial fill material portion 24, the upper tilted convex surface segment may contact a concave surface of an annular portions 22' of the nucleation material liners 22, and the lower tilted convex surface segment may contact a concave surface of another annular portion 22' of the nucleation material liners 22. In one embodiment, at least one, and/or each, of the plurality of tubular metallic liners 46N can have a greater vertical extent than the backside recesses 43 to which the respective tubular metallic liner 46N is physically exposed.

In one embodiment, the first metallic element comprises tungsten. In this case the portions of the nucleation material liners 22 exposed in the backside recesses act as a seed for the tungsten deposition. For example, silicon, boron, boron nitride or boron-silicon alloy liners can act as a seed for tungsten deposition from tungsten hexafluoride or tungsten pentachloride. In this embodiment, the tungsten halide gas reacts with the silicon or boron liners to form tungsten metal tubular metallic liners 46N and a silicon halide or boron halide containing gas. The gas is removed from the device through the backside recesses 43 and the backside trenches 79. For example, tungsten hexafluoride source gas and a silicon seed material form a tungsten layer and silicon hexafluoride and/or tungsten silicon fluoride gas. Alternatively, tungsten pentafluoride source gas and a silicon or boron seed material form a tungsten layer and either a respective silicon tetrachloride gas or boron trichloride gas. In this embodiment, the seed material liner 22 is replaced with the tungsten metallic liner 46N.

The tungsten liners 46N may contain a residual trapped halogen (e.g., fluorine or chloride) and an optional silicon or boron alloying element from the nucleation material liners 22. For example, if the material of the nucleation material liners 22 comprises and/or consists essentially of silicon, then an average atomic percentage of silicon within the tubular metallic liners 46N may be at least 0.1%. For example, the average atomic percentage of silicon within the tubular metallic liners 46N may be in a range from 0.1% to 5.0%, such as 0.5% to 2% with the balance tungsten and other unavoidable impurities (e.g., trapped fluorine).

Alternatively, if the material of the nucleation material liners 22 comprises and/or consists essentially of boron, then an average atomic percentage of boron within the tubular metallic liners 46N may be at least 0.1%. For example, the average atomic percentage of boron within the tubular metallic liners 46N may be in a range from 0.1% to 5.0%, such as 0.5% to 2% with the balance tungsten and other unavoidable impurities (e.g., trapped fluorine).

In another alternative embodiment, the first metallic element comprises a silicide forming metal, such as Co, Mo or Ru, and the material of the nucleation material liners 22 comprises and/or consists essentially of silicon. In this embodiment, the silicide forming metal reacts with the silicon to form metal silicide tubular metallic liners 46N. The metal silicide may comprise cobalt silicide (e.g., $CoSi_2$, Co2Si, CoSi or non-stoichiometric versions thereof), molybdenum silicide ($MoSi_2$ or non-stoichiometric versions thereof) or ruthenium silicide (e.g., $Ru_2Si_3$ or non-stoichiometric versions thereof).

Thus, the tubular metallic liners 46N are selectively deposited in the backside recesses 43 around the memory openings 49 which are filled with the sacrificial memory opening fill structures 26. The lateral thickness of each tubular metallic liner 46N may be about the same as or greater than the thickness of the nucleation material liner 22. For example, the lateral thickness of each tubular metallic liner 46N may be in a range from 0.5 nm to 5 nm, such as from 1 nm to 3 nm, although lesser and greater thicknesses may also be employed.

Figure 9:
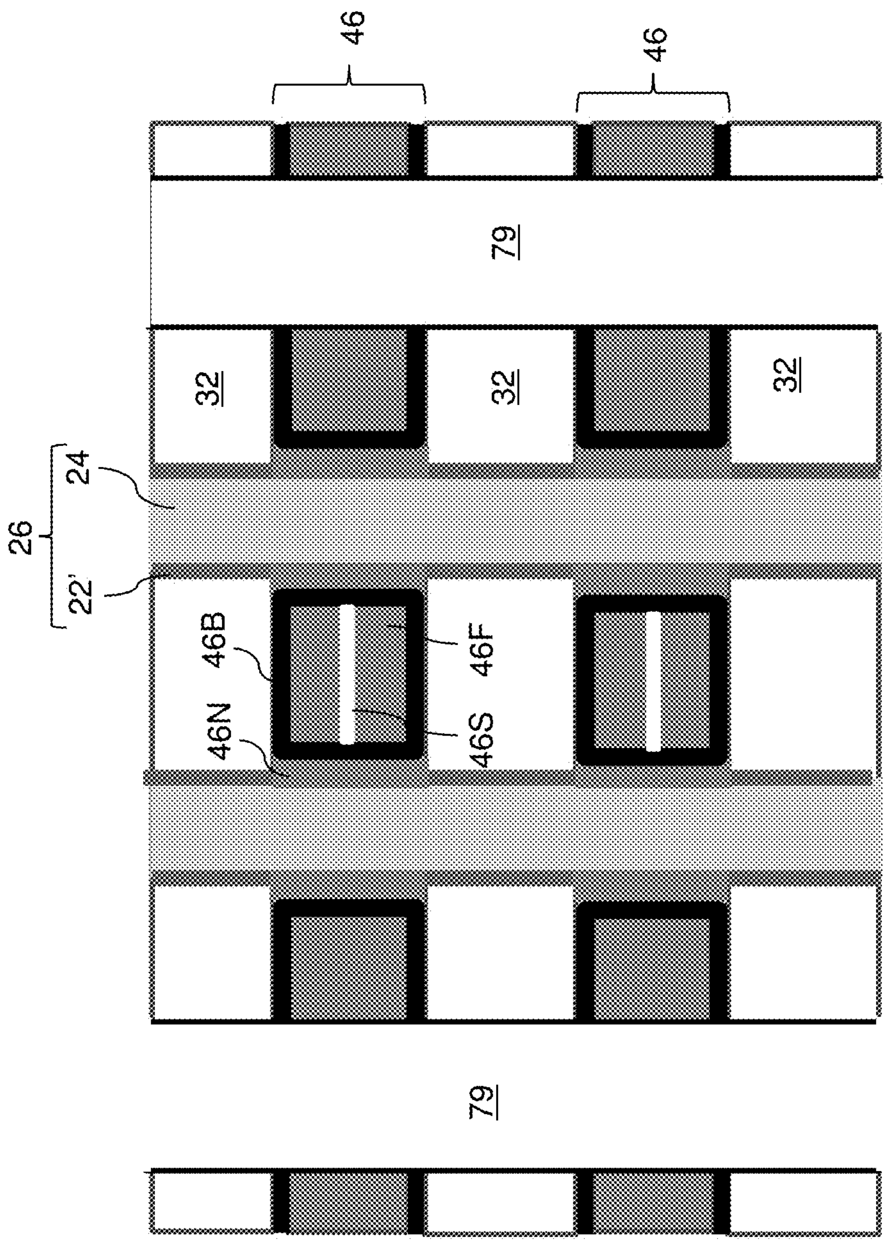
FIG. 9 is a schematic vertical cross-sectional view of a portion of the first exemplary structure of FIG. 8 after formation of metallic fill material layers according to an embodiment of the present disclosure.

Referring to FIG. 9, an electrically conductive barrier layer 46B and a metallic fill material layer 46F can be non-selectively deposited in the backside recesses 43 on the physically exposed surfaces of the tubular metallic liners 46N through the backside trenches 79. The electrically conductive barrier layer 46B may be deposited directly on the tubular metallic liners 46N and on the exposed surfaces of the insulating layers 32 in the backside recesses 43. The electrically conductive barrier layer 46B may comprise titanium nitride, tungsten nitride, tungsten boronitride or tungsten carbonitride.

The metallic fill material layer 46F can be deposited in the remaining spaces of the backside trenches 79 directly on the electrically conductive barrier layer 46B. The metallic fill material layer 46F can have the same or a different material composition than the tubular metallic liners 46N. The metallic fill material layer 46F may comprise W, Ti, Ta, Co, Mo or Ru. The metallic fill material layer 46F and the electrically conductive barrier layer 46B may be deposited by ALD or CVD.

An anisotropic etch process can be performed to remove excess portions of the metallic fill material layers 46F and the electrically conductive barrier layer 46B that laterally protrude into volumes of the backside trenches 79. Sidewalls of remaining portions of the metallic fill material layers 46F around the backside trenches 79 may be vertically coincident with sidewalls of the insulating layers 32 around the backside trenches 79.

In one embodiment, the metallic fill material layer 46F entirely fills the remaining volume of the backside recesses 43. In an alternatively embodiment, the metallic fill material layer 46F does not completely fill the remaining volume of the backside recesses 43. Laterally-extending seams (e.g., air-gaps) 46S can be formed at locations at which vertical growth surfaces of the metallic fill material layers 46F merge. The laterally-extending seams 46S can be equidistant from a respective most proximal pair of the sacrificial memory opening fill structures 26.

Each contiguous combination of a metallic fill material layer 46F, an electrically conductive barrier layer 46B and a respective plurality of tubular metallic liners 46N constitutes an electrically conductive layer 46. In one embodiment, an electrically conductive layer 46 may comprise at least one laterally-extending seam 46S therein. In one embodiment, each of the electrically conductive layers 46 may comprise a plurality of tubular metallic liners 46N in contact with a respective outer sidewall segment of each of the sacrificial memory opening fill structures 26, an electrically conductive barrier layer 46B contacting each of the plurality of tubular metallic liners 46N, and a metallic fill material layer 46F contacting the electrically conductive barrier layers 46B. In one embodiment, the tubular metallic liners 46N include at least one element (such as silicon or boron) that is not present within the a metallic fill material layer 46F.

In one embodiment, the tubular metallic liners 46N comprise, and/or consist essentially of a metal silicide, and the metallic fill material layers 46F comprise, and/or consist essentially of tungsten. In another embodiment, the tubular metallic liners 46N comprise, and/or consists essentially of, silicon-doped and/or boron-doped tungsten, and the metallic fill material layers 46F comprise, and/or consist essentially of tungsten that is not doped with silicon or boron.

Figure 10:
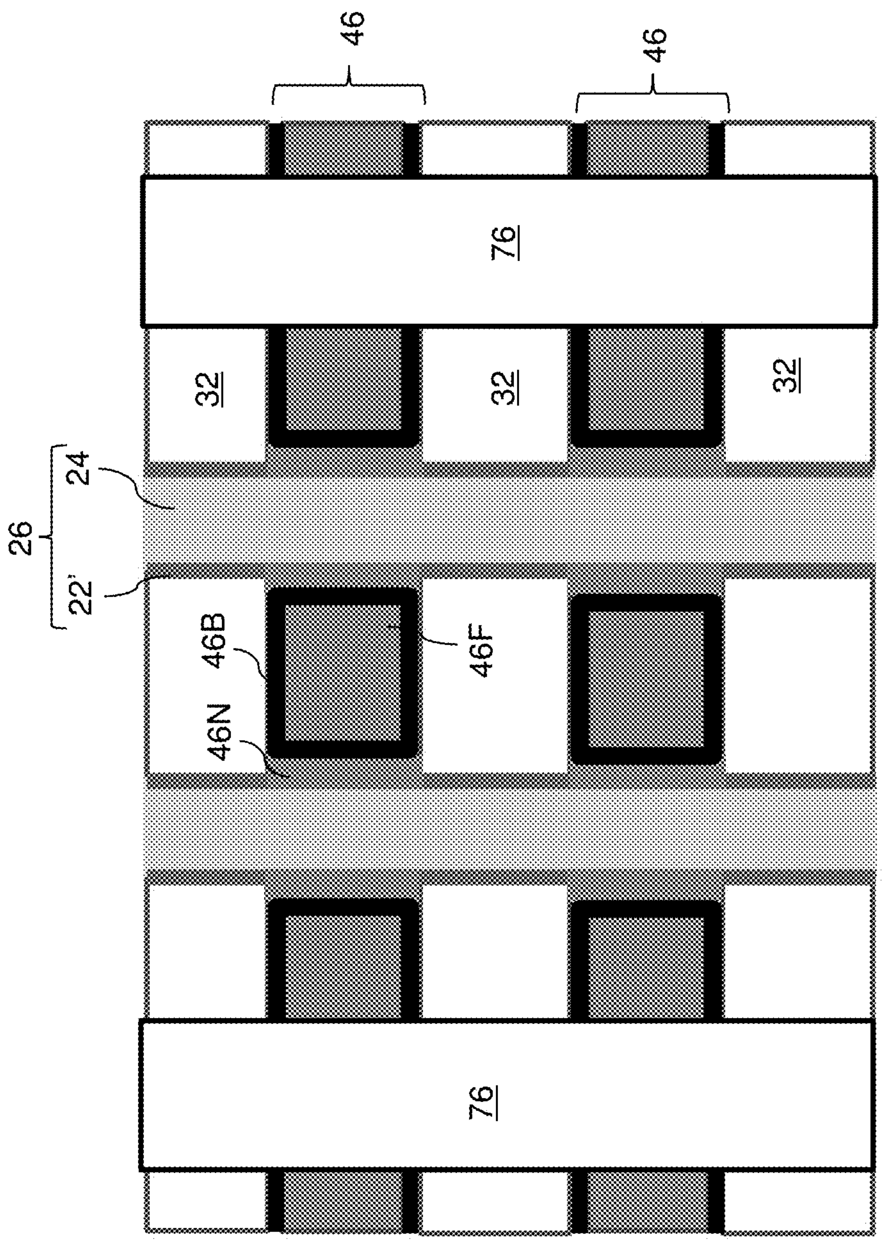
FIG. 10 is a schematic vertical cross-sectional view of the first exemplary structure after formation of backside trench fill structures according to an embodiment of the present disclosure.

Referring to FIG. 10, backside trench fill structures 76 can be formed in the backside trenches 79, for example, by conformally depositing a dielectric material such as silicon oxide in the backside trenches. Alternatively, the backside trench fill structures 76 may comprise a dielectric spacer (e.g., a silicon oxide spacer) and an electrically conductive local interconnect.

Figure 11:
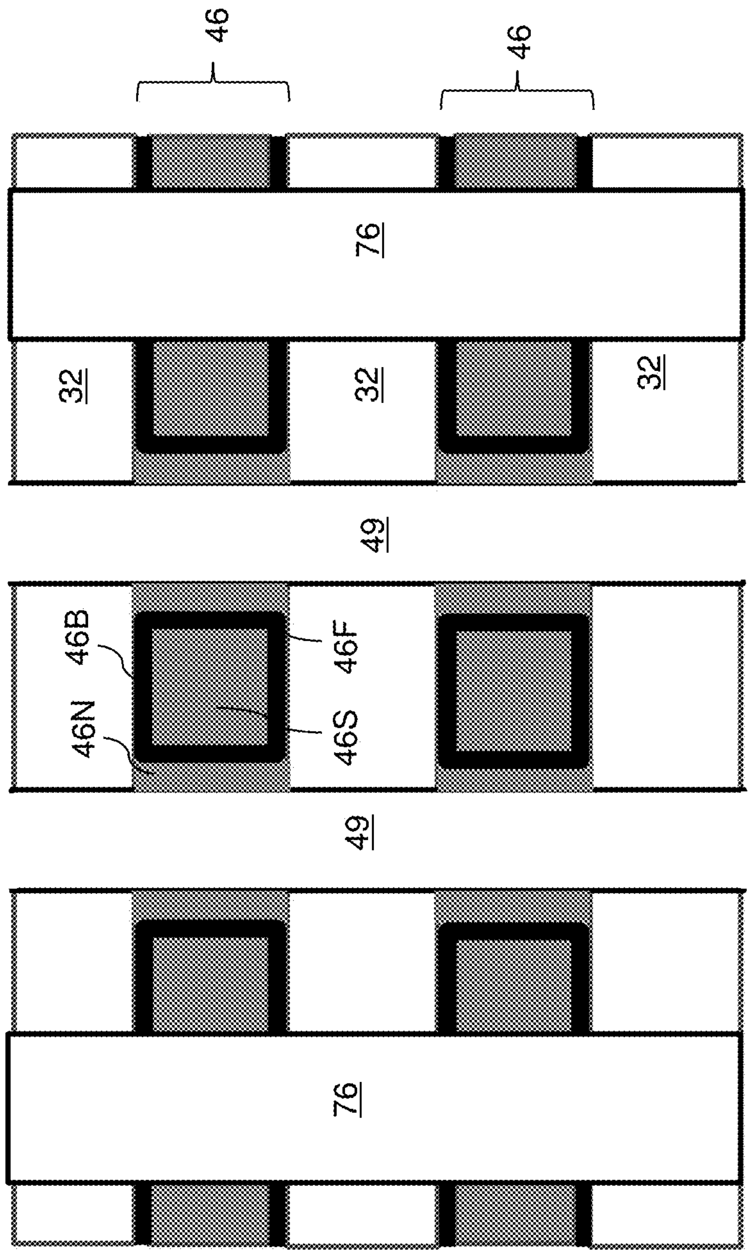
FIG. 11 is a schematic vertical cross-sectional view of the first exemplary structure after removal of sacrificial memory opening fill structures and sacrificial support opening fill structures according to an embodiment of the present disclosure.

Referring to FIG. 11, the sacrificial memory opening fill structures 26 and sacrificial support opening fill structures 16 can be removed selective to the materials of the insulating layers 32 and the electrically conductive layers 46 to expose the support openings 19 and the memory openings 49. For example, an etch process or an ashing process may be performed to remove the sacrificial fill material portions 24 selective to the material of the tubular metallic liners 46N. The etch process or the ashing process may be selective to the remaining portions of the nucleation material liners 22, i.e., the annular portions 22' of the nucleation material liners 22. Subsequently, the annular portions 22' of the nucleation material liners 22 may be removed by performing an isotropic etch process that etches the material of the nucleation material liners 22 selective to the material of the tubular metallic liners 46N and selective to the insulating layers 32. For example, if the annular portions 22' of the nucleation material liners 22 comprise silicon, then a wet etch process employing a KOH solution, a hot trimethyl-2 hydroxyethyl ammonium hydroxide ("hot TMY") solution, and/or a tetramethyl ammonium hydroxide (TMAH) solution may be employed.

Figure 12:
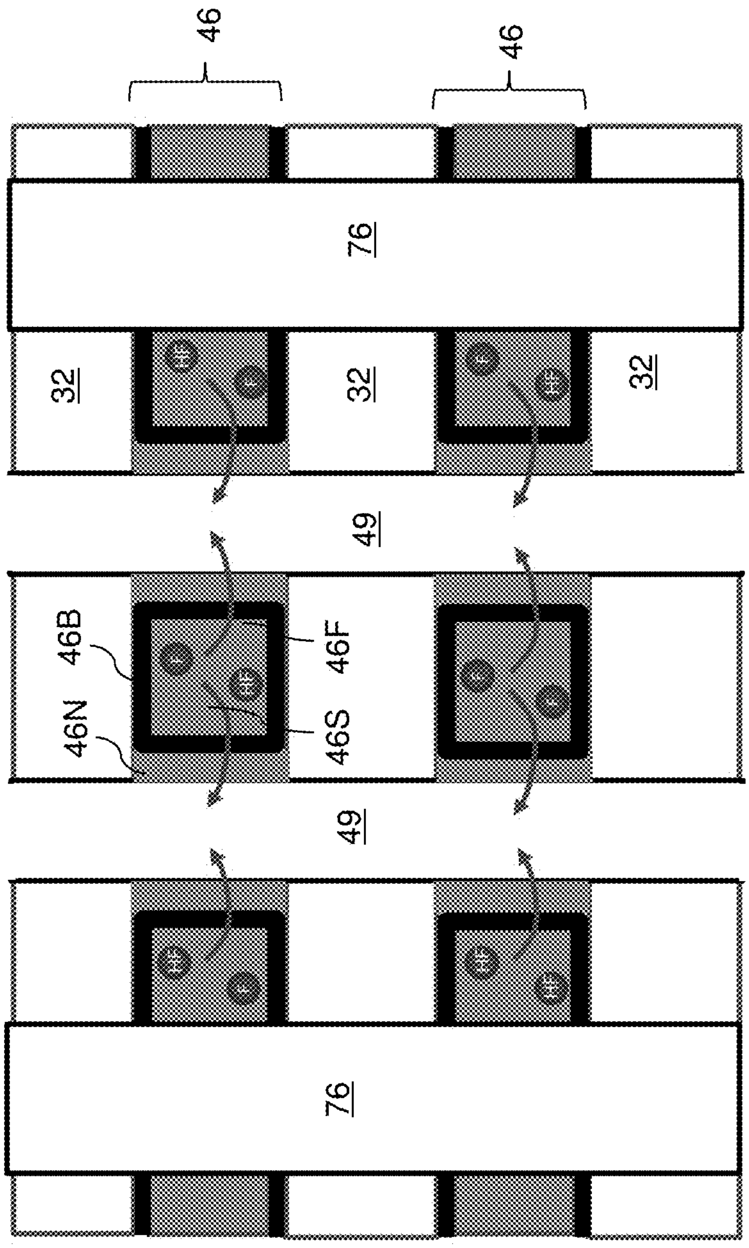
FIG. 12 is a schematic vertical cross-sectional view of the first exemplary structure during a halogen outgassing anneal.

Referring to FIG. 12, a halogen outgassing anneal may be performed to remove the halogen trapped in the seams 46S and/or in the metallic fill material layers 46F. The anneal may be conducted at a temperature of at least 800 degrees Celsius, such as 800 to 1,000 degrees Celsius. During the anneal, the halogen, such as fluorine, chlorine and/or hydrofluoric acid vapor that remains from the tungsten hexafluoride or tungsten pentachloride source gas is removed through the unfilled support openings 19 and memory openings 49. The halogen can degas through grain boundaries of the polycrystalline electrically conductive barrier layer 46B and tubular metallic liner 46N.

Figure 13A:
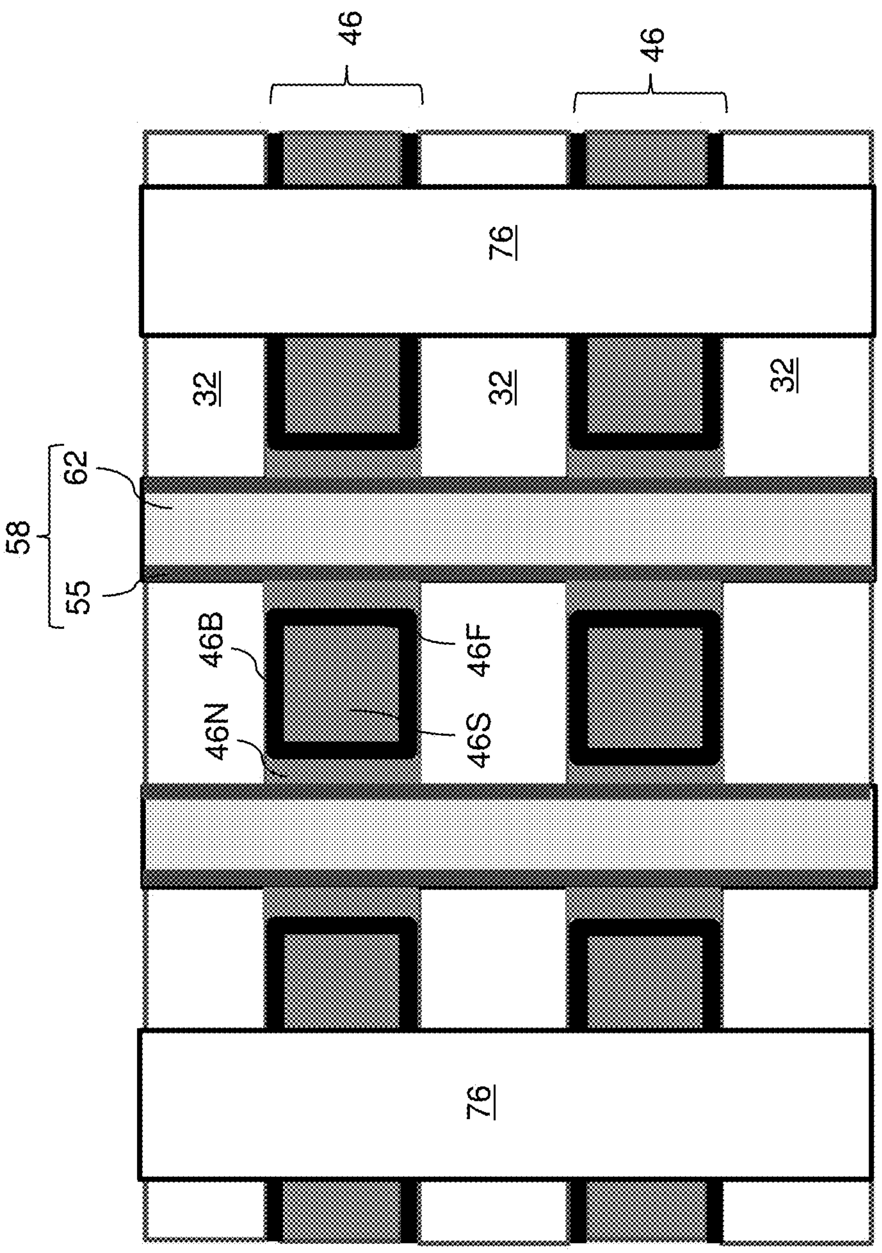
FIG. 13A is a schematic vertical cross-sectional view of the first exemplary structure after formation of memory opening fill structures.
Figure 13B:
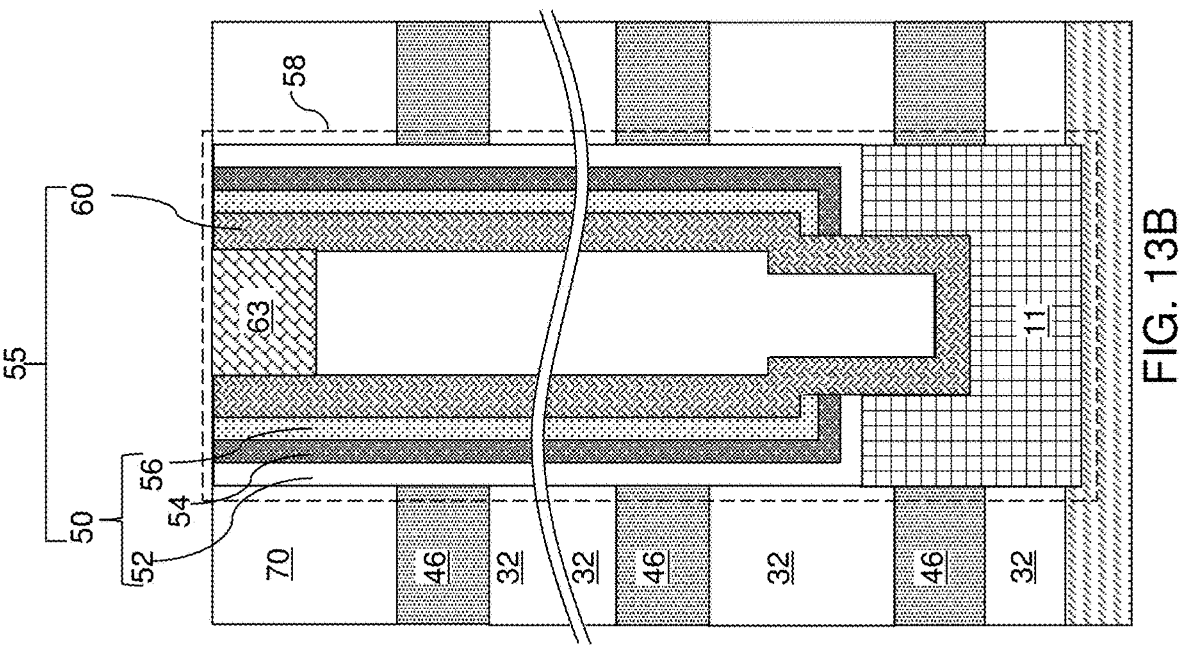
FIG. 13B is close-up schematic vertical cross-sectional view of the memory opening fill structure of FIG. 13A.
Figure 14:
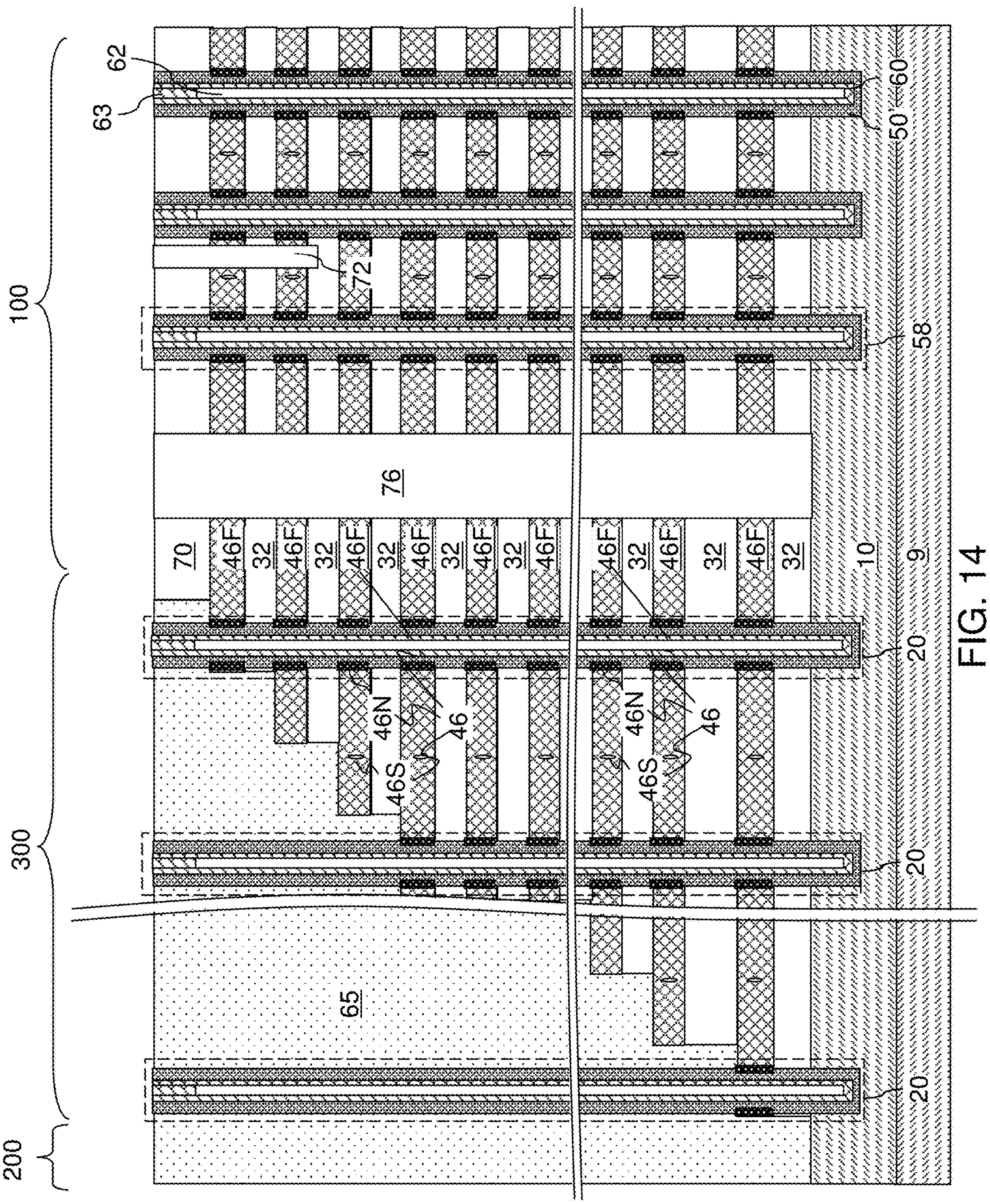
FIG. 14 is a schematic vertical cross-sectional view of the first exemplary structure after formation of memory stack structures and support pillar structures according to an embodiment of the present disclosure.

FIG. 13A is a schematic vertical cross-sectional views of memory openings within a portion of the first exemplary structure after formation of a memory opening fill structure 58. FIG. 13B is a close up view of the layers of the memory opening fill structure 58. FIG. 14 is an expanded view of the first exemplary structure after formation of the memory opening fill structures 58.

A stack of layers for forming a memory film and a vertical semiconductor channel within each memory opening 49 may be formed by conformal deposition processes. The stack of layers can comprise a blocking dielectric layer 52, a memory material layer 54, an optional tunneling dielectric layer 56, and a vertical semiconductor channel 60.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can include an aluminum oxide and a silicon oxide bilayer.

Subsequently, the memory material layer 54 can be formed. Generally, the memory material layer 54 can include any material that can store data in the form of presence or absence of electrical charges therein, a direction of ferroelectric polarization, or resistivity of a material therein. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates). In another embodiment, the memory material layer 54 includes a ferroelectric material layer, such as orthorhombic hafnium oxide doped with at least one of Zr, Si or Al. In one embodiment, the sacrificial material layers 42 and the insulating layers 32 can have vertically coincident sidewalls, and the memory material layer 54 can be formed as a single continuous layer.

The tunneling dielectric layer 56, if present, includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The tunneling dielectric layer 56, the memory material layer 54, and the blocking dielectric layer 52 collectively comprise a memory film 50 located within a respective one of the memory openings 49 or the support openings 19.

The vertical semiconductor channel 60 includes a semiconductor material, such as at least one elemental semiconductor material, at least one III-V compound semiconductor material, at least one II-VI compound semiconductor material, at least one organic semiconductor material, or other semiconductor materials known in the art. In one embodiment, the vertical semiconductor channel 60 includes amorphous silicon or polysilicon. The vertical semiconductor channel 60 can be formed by a conformal deposition method such as low pressure chemical vapor deposition (LPCVD) and have a thickness in a range from 2 nm to 30 nm, although lesser and greater thicknesses can also be employed.

In case the memory opening 49 is not completely filled by the vertical semiconductor channel 60, an optional dielectric core 62 fills any remaining portion of the memory opening. The dielectric core 62 includes a dielectric material such as silicon oxide or organosilicate glass. The dielectric core 62 can be deposited by a conformal deposition method such as low pressure chemical vapor deposition (LPCVD), or by a self-planarizing deposition process such as spin coating.

A drain region 63 comprising a semiconductor material a doping of a second conductivity type that is the opposite of the first conductivity type of the vertical semiconductor channel 60 is located in a recessed region above the dielectric core 62. For example, if the first conductivity type is p-type, the second conductivity type is n-type, and vice versa. The dopant concentration in the drain regions 63 can be in a range from $5.0\times10^{18}/cm^3$ to $2.0\times10^{21}/cm^3$, although lesser and greater dopant concentrations can also be employed. The doped semiconductor material can be, for example, doped polysilicon.

Each combination of a memory film 50 and a vertical semiconductor channel 60 constitutes a memory stack structure 55. A contiguous combination of a memory film 50, a vertical semiconductor channel 60, a dielectric core 62, and a drain region 63 in a memory opening 49 constitutes a memory opening fill structure 58. A contiguous combination of a memory film 50, a vertical semiconductor channel 60, a dielectric core 62, and a drain region 63 in a support opening 19 constitutes a support pillar structure 20 which is shown in FIG. 14. In one embodiment, each memory film 50 can store electrical charges with a macroscopic retention time. As used herein, a macroscopic retention time refers to a retention time suitable for operation of a memory device as a permanent memory device such as a retention time in excess of 24 hours.

In one embodiment, each of the memory films 50 comprises a respective blocking dielectric layer 52 and a respective memory material layer 54. In one embodiment, the respective blocking dielectric layer 52 and the respective memory material layer 54 can have a lesser maximum lateral extent at a level of one of the electrically conductive layers 46 than at a level of an insulating layer 32 contacting a top surface of the one of the electrically conductive layers 46, and than at a level of another insulating layer 32 contacting a bottom surface of the one of the electrically conductive layers 46. In one embodiment, the respective blocking dielectric layer 52 and the respective memory material layer 54 can have a lesser maximum lateral extent at each level of the electrically conductive layers 46 than at a level of a respective overlying insulating layer (which may be an insulating layer 32 or an insulating cap layer 70) contacting a top surface of a respective electrically conductive layer 46, and than at a level of another insulating layer 32 contacting a bottom surface of the respective electrically conductive layers 46.

Referring to FIG. 14, the first exemplary structure is illustrated after the processing steps of FIGS. 13A and 13B. A memory opening fill structure 58 is present within each memory opening 49, and a support pillar structure 20 is present within each support opening 19.

Figure 15A:
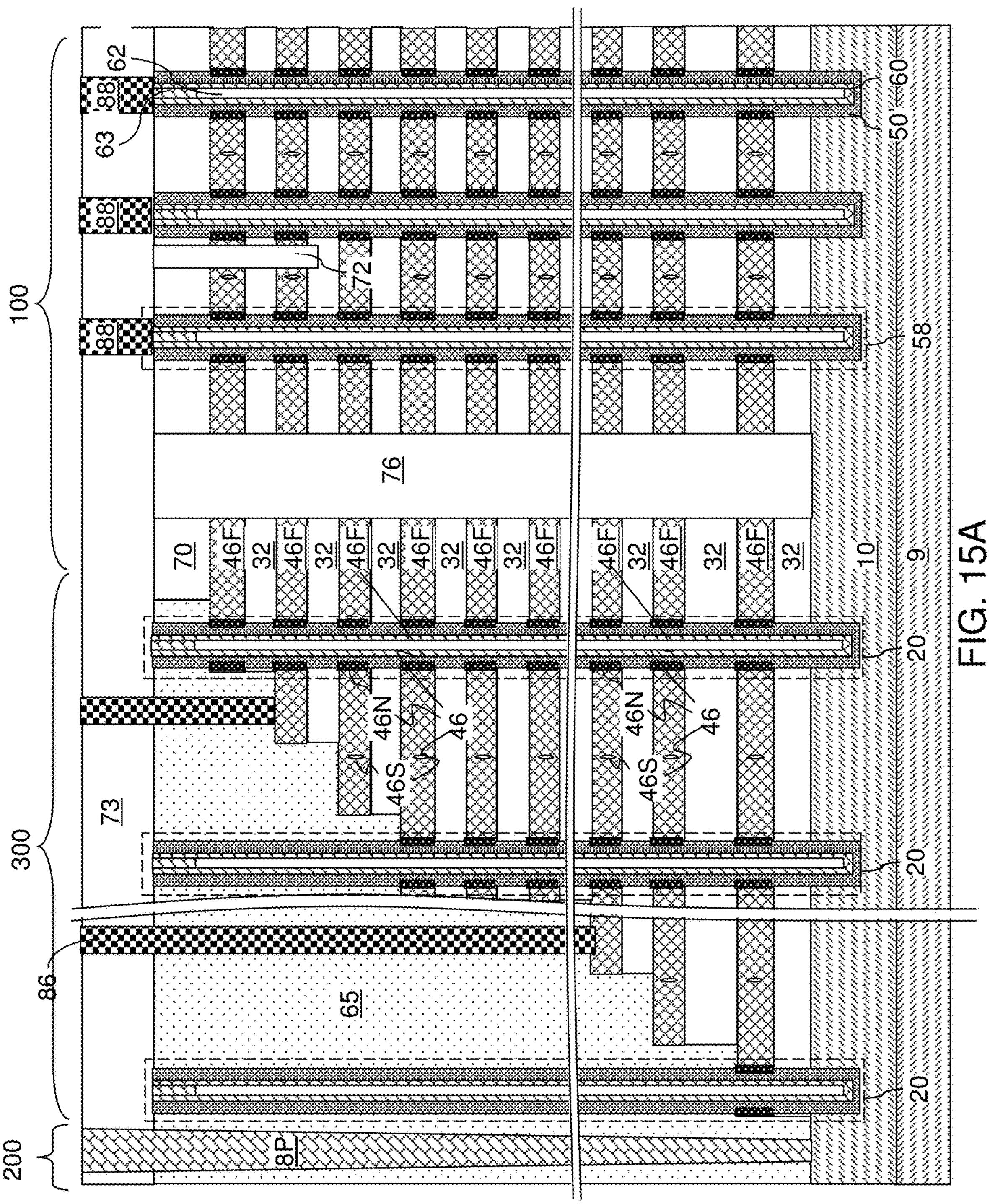
FIG. 15A is a schematic vertical cross-sectional view of the first exemplary structure after formation of additional contact via structures according to an embodiment of the present disclosure.
Figure 15B:
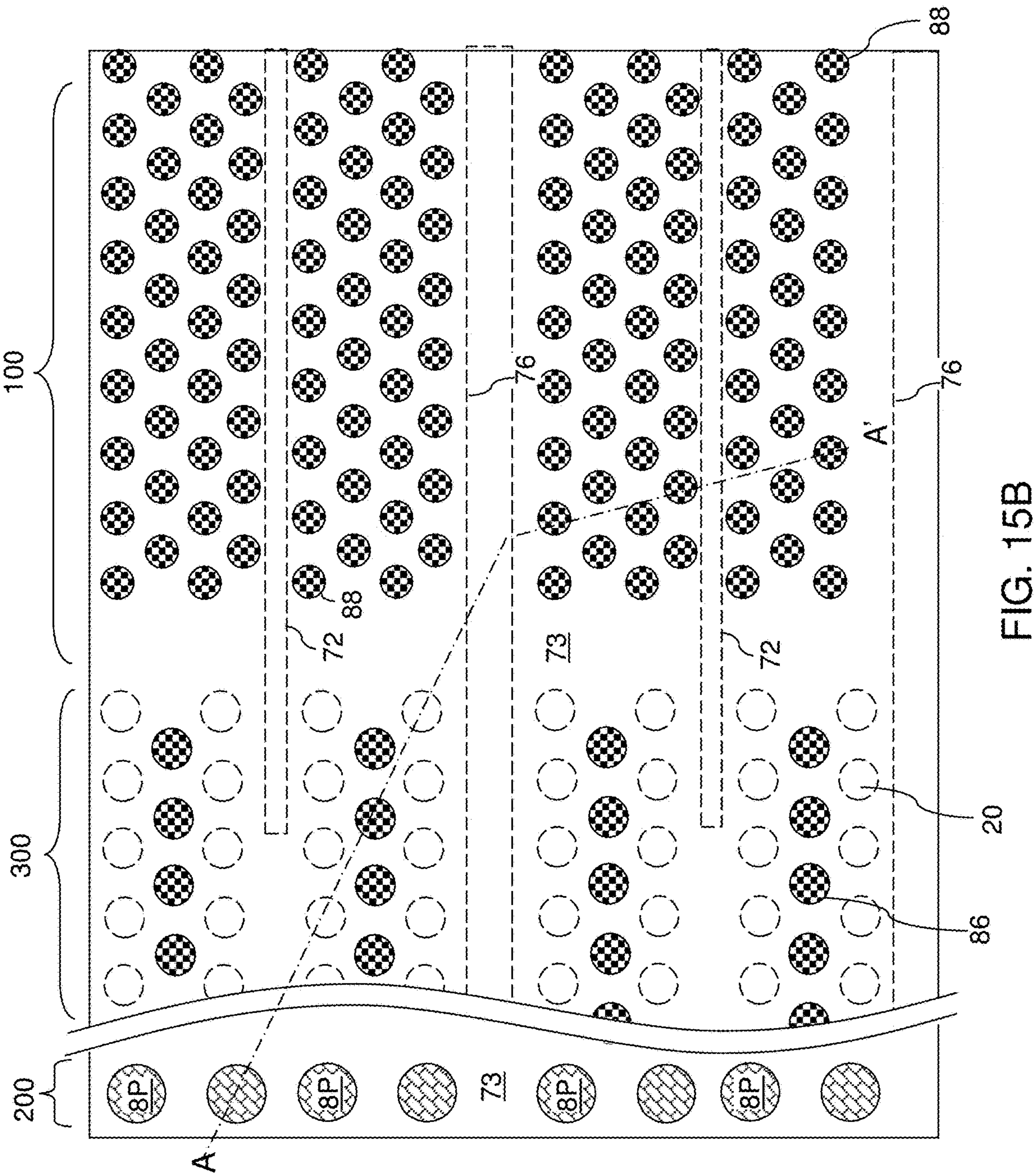
FIG. 15B is a top-down view of the first exemplary structure of FIG. 15A. The vertical plane A-A' is the plane of the schematic vertical cross-sectional view of FIG. 15A.

Referring to FIGS. 15A and 15B, a contact-level dielectric layer 73 can be formed over the alternating stack of insulating layers 32 and electrically conductive layers 46 and over the retro-stepped dielectric material portion 65 by deposition of a dielectric material such as silicon oxide. Contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73 and the retro-stepped dielectric material portion 65. Pass-through via structures 8P can be formed through the contact-level dielectric layer 73 and the retro-stepped dielectric material portion 65 directly on a top surface of the semiconductor material layer 10 in the peripheral region 200.

Figure 16A:
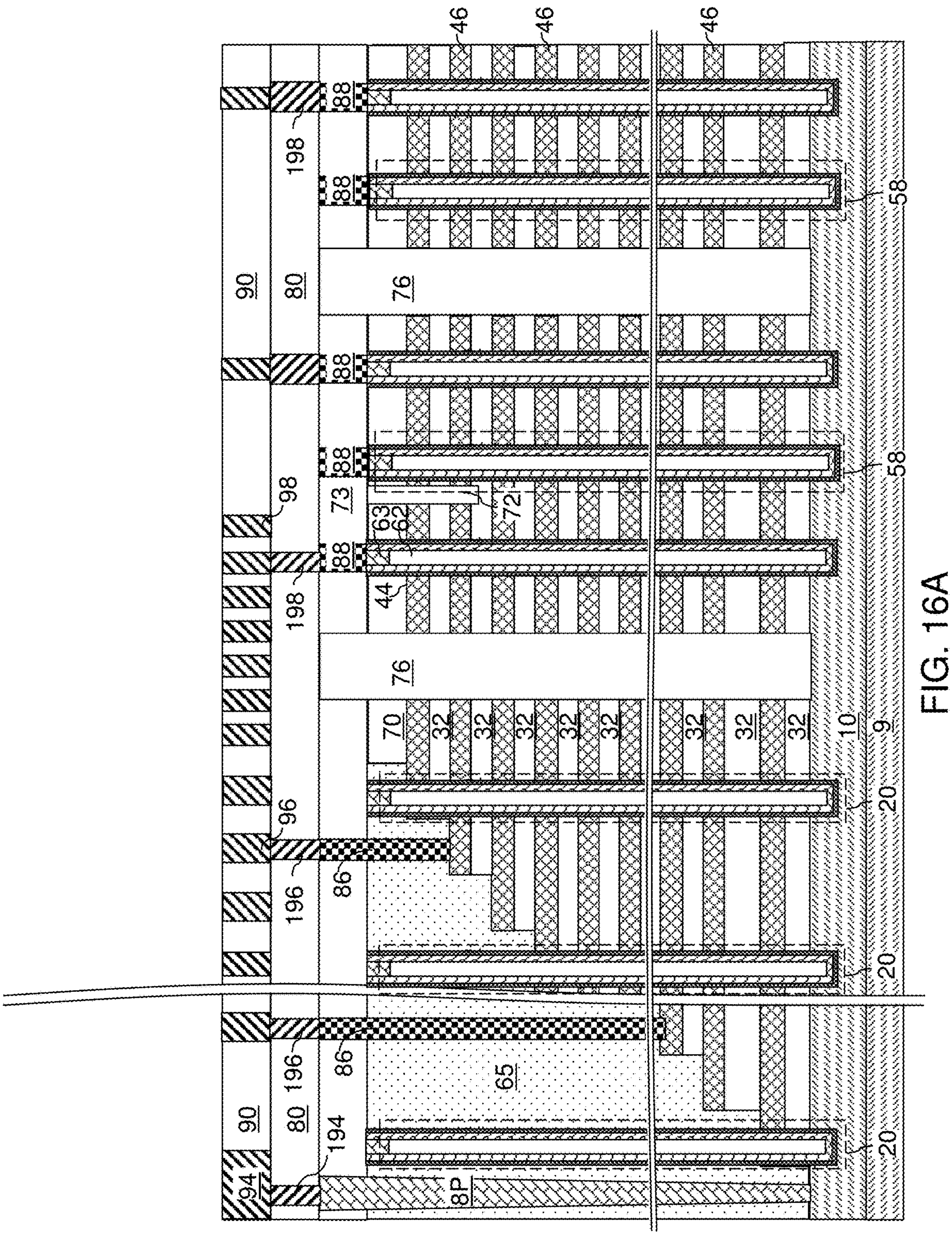
FIG. 16A is a schematic vertical cross-sectional view of the first exemplary structure after formation of first via level metal interconnect structures and first line level metal interconnect structures according to an embodiment of the present disclosure.
Figure 16B:
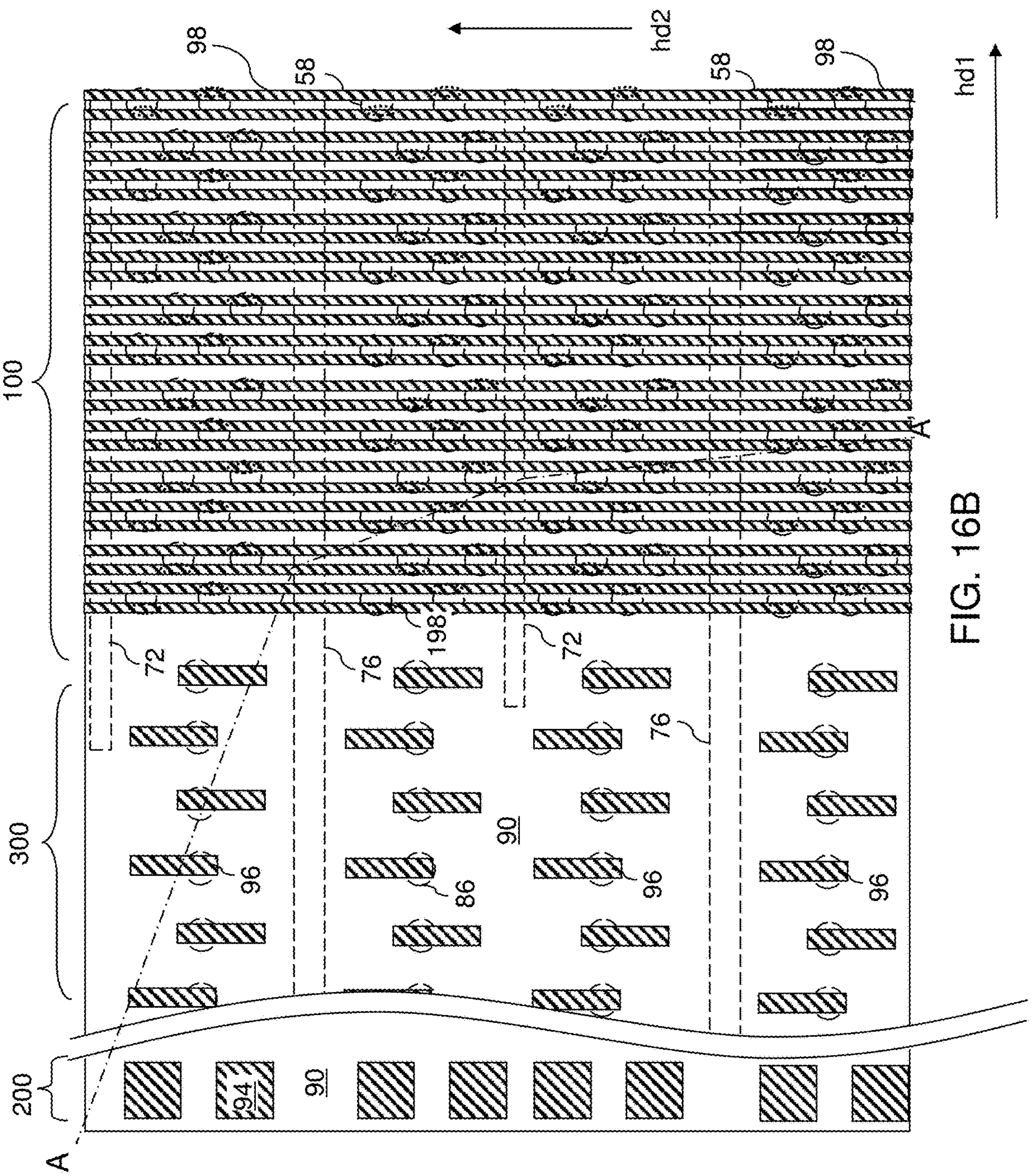
FIG. 16B is a partial see-through top-down view of the first exemplary structure of FIG. 16A. The vertical plane A-A' is the plane of the schematic vertical cross-sectional view of FIG. 16A.

Referring to FIGS. 16A and 16B, a via-level dielectric layer 80 is formed over the contact-level dielectric layer 73. Various contact via structures (198, 196, 194) can be formed through the via-level dielectric layer 80. For example, bit line connection via structures 198 can be formed on the drain contact via structures 88, word line connection via structures 196 can be formed on the word line contact via structures 86, and peripheral extension via structures 194 can be formed on the pass-through via structures 8P.

A first line-level dielectric layer 90 is deposited over the via-level dielectric layer 80. Various metal line structures (98, 96, 94) are formed in the first line-level dielectric layer 90. The metal line structures (98, 96, 94) are herein referred to as first line level metal interconnect structures. The various metal line structure (98, 96, 94) include bit lines 98 that are electrically connected to a respective plurality of the drain contact via structures 88 (for example, through the bit line connection via structures 198), a word-line-connection metal interconnect lines 98 that are electrically connected to a respective one of the word line contact via structures 86 (for example, through a bit line connection via structure 198), and peripheral metal interconnect lines 94 that are electrically connected to a respective one of the pass-through via structures 8P (for example, through a peripheral extension via structure 194).

The bit lines 98 are electrically connected to upper ends of a respective subset of the vertical semiconductor channels 60 in the memory stack structures 55 through the drain regions 63 in the memory array region 100. In one embodiment, the memory stack structures 55 are arranged in rows that extend along the first horizontal direction hd1, and the bit lines 98 laterally extend along the second horizontal direction hd2.

Figure 17:
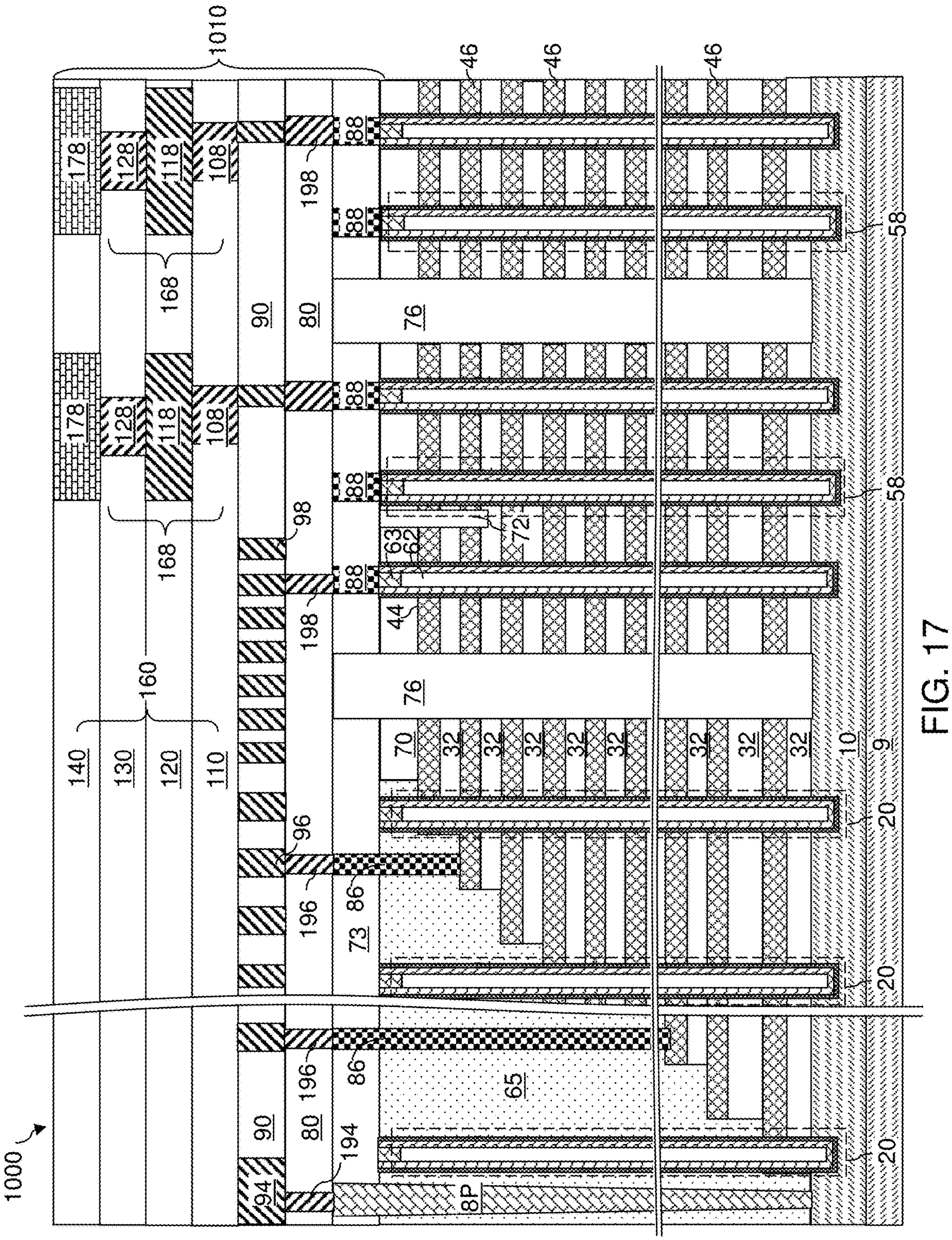
FIG. 17 is a schematic vertical cross-sectional view of the first exemplary structure after formation of additional metal interconnect structures according to an embodiment of the present disclosure.

Referring to FIG. 17, a first semiconductor die, which can be a memory die 1000, is provided by performing additional processing steps on the first exemplary structure. Specifically, additional metal interconnect structures 168 and front-side bonding structures 178 included in additional interconnect-level dielectric layers 160 are formed. In an illustrative example, the additional interconnect-level dielectric layers 160 can include a via-level dielectric layer 110, a second line-level dielectric layer 120, a second via-level dielectric layer 130, and a metallic pad structure-level dielectric layer 140. The metal interconnect structures 168 can include first metal via structures 108 included in the first via-level dielectric layer 110, second metal line structures 118 included within the second line-level dielectric layer 120, and second metal via structures 128 included in the second via-level dielectric layer 130. The front-side bonding structures 178 (such as metallic pad structures) are included in the metallic pad structure-level dielectric layer 140. While the present disclosure is described using an example in which the additional interconnect-level dielectric layers 160 include the first via-level dielectric layer 110, the second line-level dielectric layer 120, the second via-level dielectric layer 130, and the metallic pad structure-level dielectric layer 140, embodiments are expressly contemplated herein in which the additional interconnect-level dielectric layers 160 include a different number and/or different combinations of dielectric material layers. The memory die 1000 includes a three-dimensional array of memory elements. Electrical connection paths can be provided by each combination of a front-side bonding structure 178 and a set of metal interconnect structures {(194, 94, 108, 118, 128), (196, 96, 108, 118, 128), or (198, 98, 108, 118, 128)}. The combination of dielectric material layers located above the insulating cap layer 70 and the set of all metal interconnect structures and the front-side bonding structures 178 embedded within the dielectric material layers located above the insulating cap layer 70 is herein referred to as a front-side interconnect assembly 1010.

Figure 18:
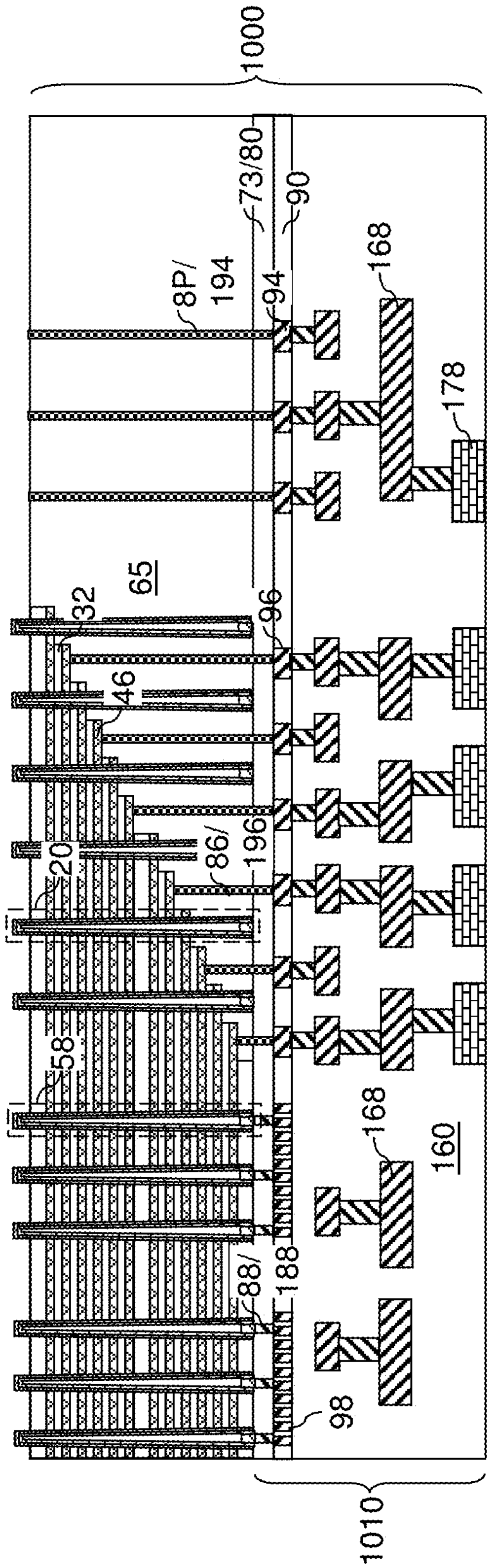
FIG. 18 is a schematic vertical cross-sectional view of the first exemplary structure after removal of the substrate layer and the semiconductor material layer according to an embodiment of the present disclosure.

Referring to FIG. 18, the substrate layer 9 can optionally be removed from the backside of the memory die 1000, for example, by grinding, polishing, cleaving, an anisotropic etch process, and/or an isotropic etch process. Subsequently, the semiconductor material layer 10 can be removed selective to the materials of the insulating layers 32 and the retro-stepped dielectric material portion, for example, by an isotropic etch process such as a wet etch process employing a KOH solution, a hot trimethyl-2 hydroxyethyl ammonium hydroxide ("hot TMY") solution, and/or a tetramethyl ammonium hydroxide (TMAH) solution. A planar surface of a most distal one of the insulating layers 32 (i.e., the bottommost insulating layer 32 formed directly on the semiconductor material layer 10 at the processing steps of FIG. 2) within the alternating stack (32, 46) is physically exposed upon removal of the semiconductor material layer 10. A planar surface of the stepped dielectric material portion 65 is physically exposed upon removal of the semiconductor material layer 10. A series of isotropic etch processes can be performed to remove portions of the memory films 50 that protrude outward from the horizontal plane including a physically exposed surface of a topmost insulating layer 32 (when the memory die 1000 is oriented such that the front-side bonding structures 178 are located at the bottom side). End surfaces of the vertical semiconductor channels 60 can be physically exposed.

Figure 19:
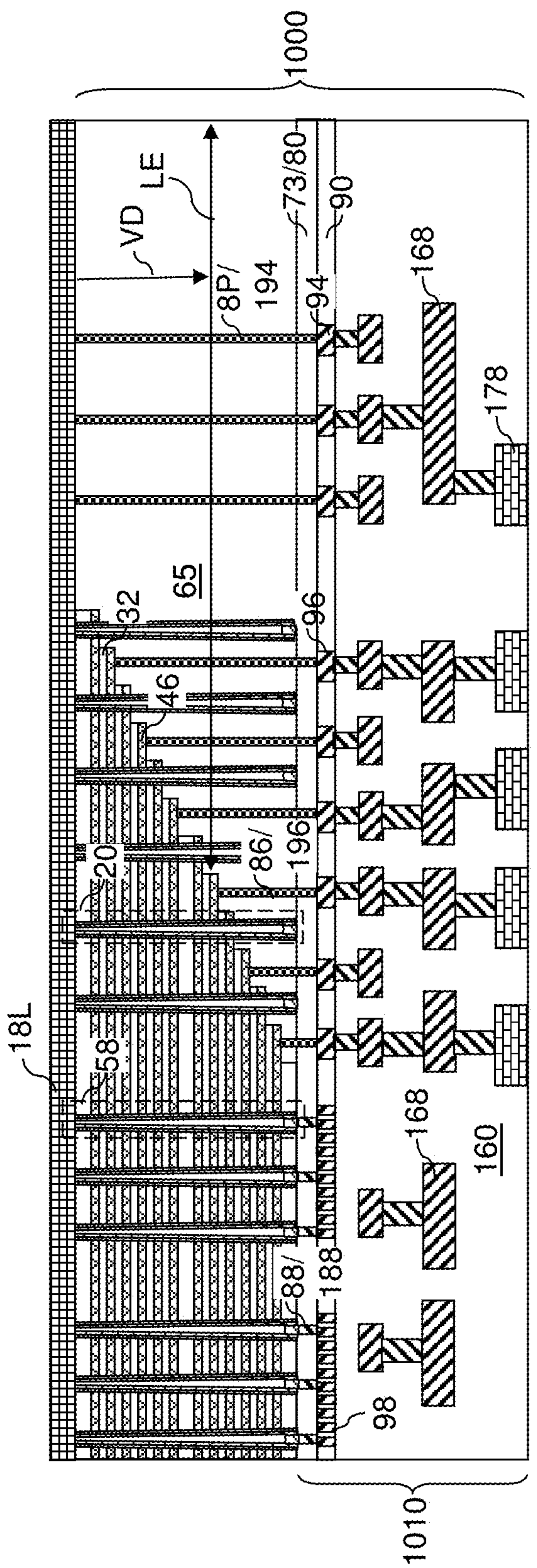
FIG. 19 is a schematic vertical cross-sectional view of the first exemplary structure after formation of the source line layer according to an embodiment of the present disclosure.

Referring to FIG. 19, an electrically conductive layer 18L, such as a metal, metal alloy or doped semiconductor material layer can be deposited directly on the physically exposed surfaces of the vertical semiconductor channels 60, the planar surface of the physically exposed one of the insulating layers 32, and on the physically exposed planar surface of the stepped dielectric material portion 65. The doped semiconductor material can include a conductive semiconductor material (i.e., a heavily doped semiconductor material) having a doping of the second conductivity type, i.e., the opposite of the first conductivity type. Thus, the doped semiconductor material can include a doped semiconductor material having a conductivity greater than $1.0\times10^5$ S/cm. The thickness of the electrically conductive layer 18L can be in a range from 100 nm to 1,000 nm, although lesser and greater thicknesses can also be used.

Figure 20:
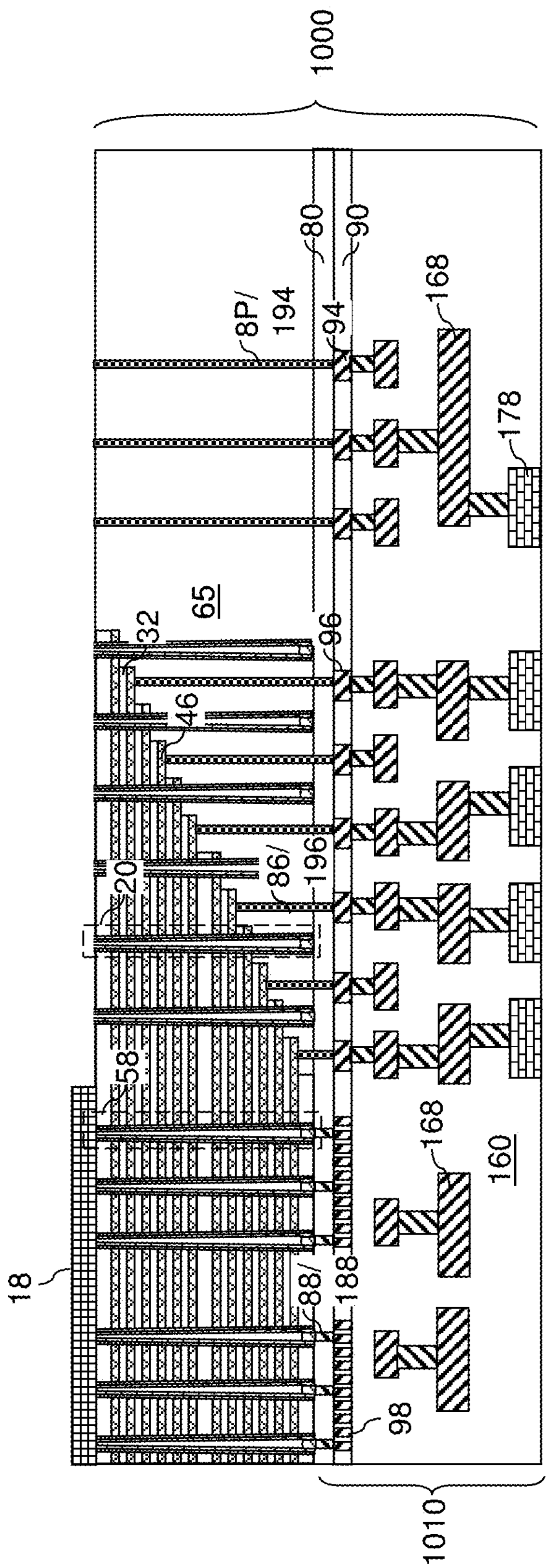
FIG. 20 is a schematic vertical cross-sectional view of the first exemplary structure after patterning the source line layer according to an embodiment of the present disclosure.

Referring to FIG. 20, the electrically conductive layer 18L can be patterned into a source line layer 18, for example, by a combination of lithographic methods and an etch process. The source line layer 18 is formed directly on the distal end of each of the vertical semiconductor channels 60 within the memory opening fill structures 58, and does not contact any of the vertical semiconductor channels 60 within the support pillar structures 20. The lateral extent of the source line layer 18 can be confined within the areas of the memory regions 100.

Figure 21:
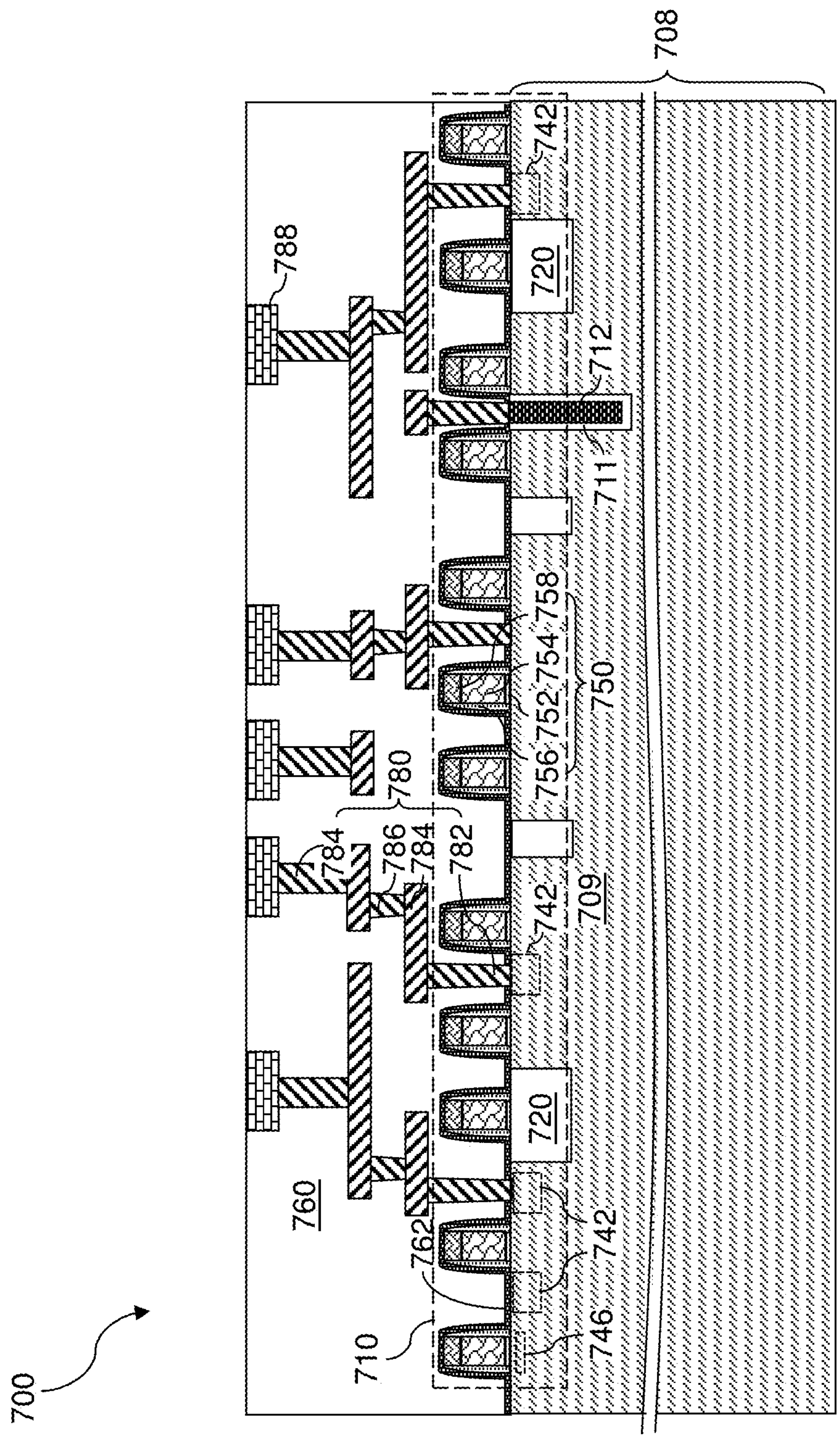
FIG. 21 is a schematic vertical cross-sectional view of a second semiconductor die according to an embodiment of the present disclosure.

Referring to FIG. 21, a second semiconductor die can be provided, which can be a logic die 700 including various semiconductor devices 710. The semiconductor devices 710 includes a peripheral circuitry for operation of the three-dimensional memory arrays in the memory die 1000. The peripheral circuitry can include a word line driver that drives the electrically conductive layers 46 within the memory die 1000, a bit line driver that drives the bit lines 98 in the memory die 1000, a word line decoder circuitry that decodes the addresses for the electrically conductive layers 46, a bit line decoder circuitry that decodes the addresses for the bit lines 98, a sense amplifier circuitry that senses the states of memory elements within the memory stack structures 55 in the memory die 1000, a power supply/distribution circuitry that provides power to the memory die 1000, a data buffer and/or latch, and/or any other semiconductor circuitry that can be used to operate the array of memory stack structures 55 in the memory die 1000. The logic die 700 can include a logic-die substrate 708, which can be a semiconductor substrate. The logic-die substrate can include a substrate layer 709. The substrate layer 709 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

Shallow trench isolation structures 720 can be formed in an upper portion of the substrate layer 709 to provide electrical isolation for semiconductor devices of the sense amplifier circuitry. The various semiconductor devices 710 can include field effect transistors, which include respective transistor active regions 742 (i.e., source regions and drain regions), a channel 746, and a gate structure 750. The field effect transistors may be arranged in a CMOS configuration. Each gate structure 750 can include, for example, a gate dielectric 752, a gate electrode 754, a dielectric gate spacer 756 and a gate cap dielectric 758. For example, the semiconductor devices 710 can include word line drivers for electrically biasing word lines of the memory die 1000 comprising the electrically conductive layers 46. Laterally-insulated through-substrate via structures (711, 712) can be formed in the upper portion of the substrate layer 709.

Dielectric material layers are formed over the semiconductor devices 710, which are herein referred to as logic-side dielectric layers 760. Optionally, a dielectric liner 762 (such as a silicon nitride liner) can be formed to apply mechanical stress to the various field effect transistors and/or to prevent diffusion of hydrogen or impurities from the logic-side dielectric layers 760 into the semiconductor devices 710. Logic-side metal interconnect structures 780 are included within the logic-side dielectric layers 760. The logic-side metal interconnect structures 780 can include various device contact via structures 782 (e.g., source and drain electrodes which contact the respective source and drain nodes of the device or gate electrode contacts), interconnect-level metal line structures 784, interconnect-level metal via structures 786, and logic-side bonding structures 788 (such as metallic pad structures) that may be configured to function as bonding pads.

Figure 22:
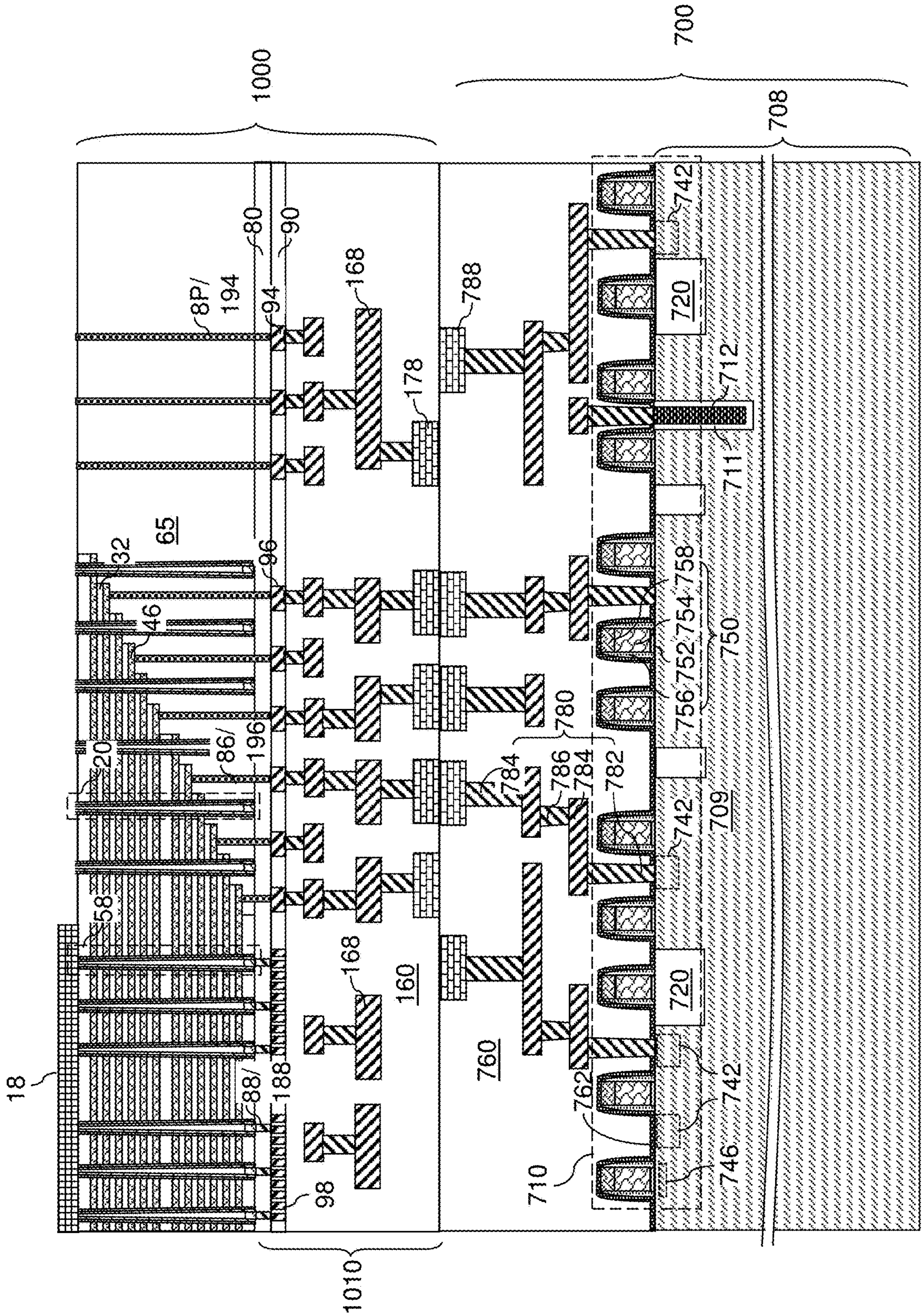
FIG. 22 is a schematic vertical cross-sectional view of a bonded assembly of the first semiconductor die and the second semiconductor die according to an embodiment of the present disclosure.

Referring to FIG. 22, the memory die 1000 and the logic die 700 are bonded to each other using metal to metal bonding or hybrid bonding. In one embodiment, the memory die 1000 and the logic die 700 can be designed such that the pattern of the logic-side bonding structures 788 of the logic die 700 is the mirror pattern of the pattern of the front-side bonding structures 178 of the memory die 1000.

Figure 23:
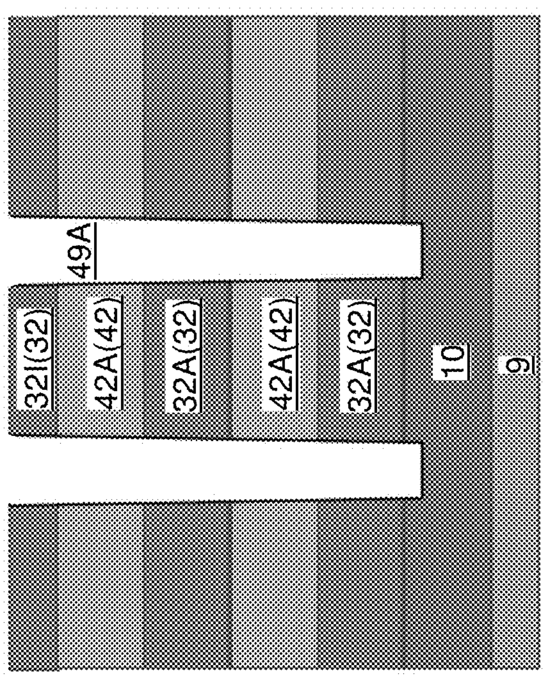
FIG. 23 is a vertical cross-sectional view of a second exemplary structure after formation of first-tier memory openings according to an embodiment of the present disclosure.

Referring to FIG. 23, a second exemplary structure according to an embodiment of the present disclosure can be derived from the first exemplary structure by employing a multi-tier structure instead of a single-tier structure. In the second exemplary structure, a first-tier alternating stack of first-tier insulating layers 32A and first-tier sacrificial material layer 42A can be formed over a semiconductor material layer 10. Each first-tier insulating layer 32A may have the same material composition as, and may have the same thickness range as, an insulating layer 32 within the first exemplary structure. Each first-tier sacrificial material layer 42A may have the same material composition as, and may have the same thickness range as, a sacrificial material layer 42 within the first exemplary structure. The first-tier insulating layers 32A are a first subset of insulating layers 32 of the second exemplary structure, and the first-tier sacrificial material layers 42A are a first subset of sacrificial material layers 42 of the second exemplary structure. First-tier memory openings 49A and first-tier support openings (not shown) can be formed through the first-tier alternating stack (32A, 42A).

Figure 24:
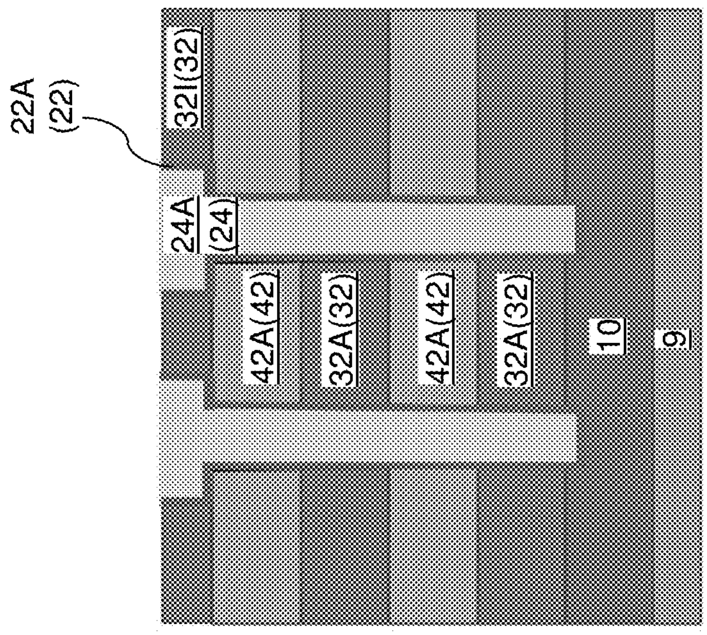
FIG. 24 is a vertical cross-sectional view of the second exemplary structure after formation of first-tier memory opening fill portions according to an embodiment of the present disclosure.

Referring to FIG. 24, a first-tier nucleation material liner 22A and a first-tier sacrificial fill material portion 24A can be formed within each of the first-tier memory openings 49A and the first-tier support openings. Each first-tier nucleation material liner 22A can include the same material as, and can have the same thickness range as, the nucleation material liners 22 employed in the first exemplary structure. Each first-tier sacrificial fill material portion 24A can include the same material as the sacrificial fill material portions 24 in the first exemplary structure. The first-tier nucleation material liners 22A are a first subset of nucleation material liners 22 employed in the second exemplary structure. The first-tier sacrificial fill material portions 24A are a first subset of sacrificial fill material portions 24 employed in the second exemplary structure.

Figure 25:
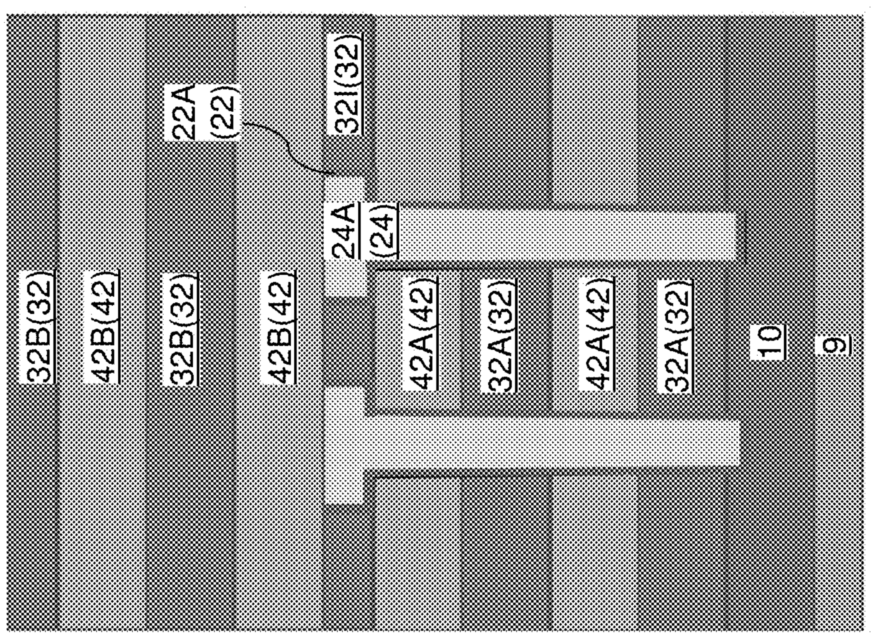
FIG. 25 is a vertical cross-sectional view of the second exemplary structure after formation of a second-tier alternating stack according to an embodiment of the present disclosure.

Referring to FIG. 25, a second-tier alternating stack of second-tier insulating layers 32B and second-tier sacrificial material layer 42B can be formed over the first-tier alternating stack (32A, 42A). Each second-tier insulating layer 32B may have the same material composition as, and may have the same thickness range as, an insulating layer 32 within the first exemplary structure. Each second-tier sacrificial material layer 42B may have the same material composition as, and may have the same thickness range as, a sacrificial material layer 42 within the first exemplary structure. The second-tier insulating layers 32B are a second subset of insulating layers 32 of the second exemplary structure, and the second-tier sacrificial material layers 42B are a second subset of sacrificial material layers 42 of the second exemplary structure.

Figure 26:
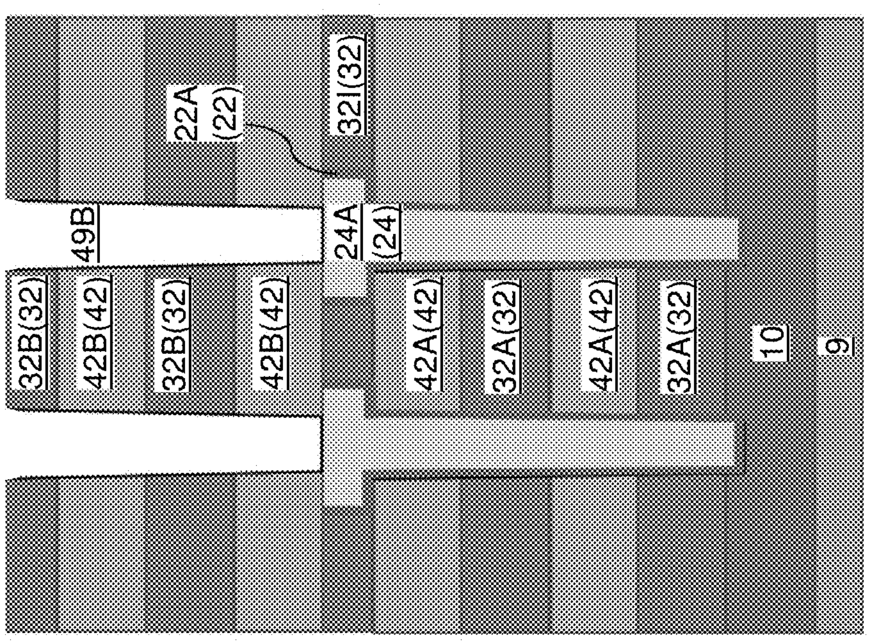
FIG. 26 is a vertical cross-sectional view of the second exemplary structure after formation of second-tier memory openings according to an embodiment of the present disclosure.

Referring to FIG. 26, second-tier memory openings 49B and second-tier support openings (not shown) can be formed through the second-tier alternating stack (32B, 42B). Each second-tier memory opening 49B can be formed over a respective one of the sacrificial fill material portions 24 in the first-tier memory openings 49A. Each second-tier support openings can be formed over a respective one of the sacrificial fill material portions 24 in the first-tier support openings.

Figure 27:
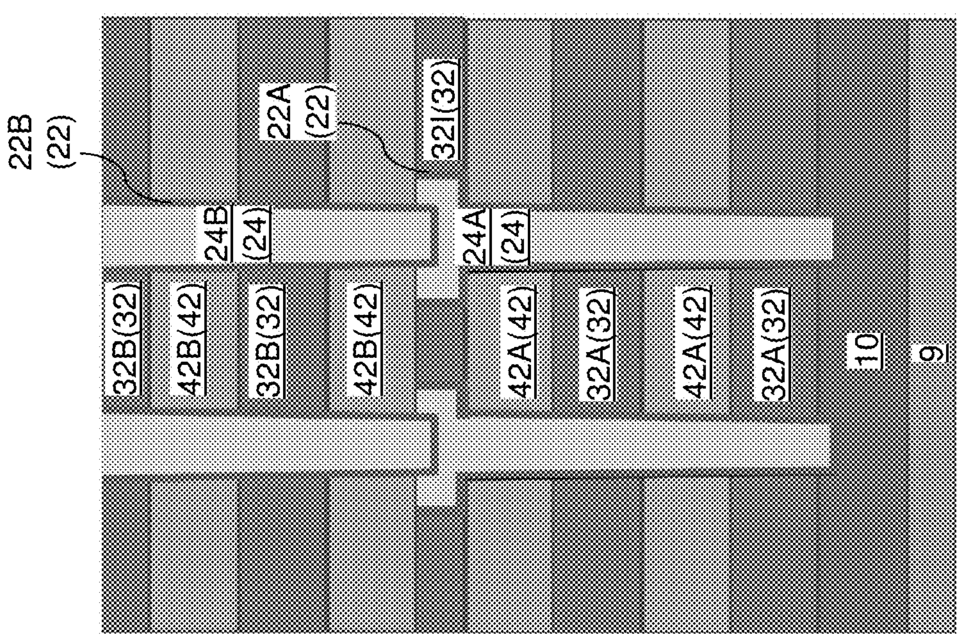
FIG. 27 is a vertical cross-sectional view of the second exemplary structure after formation of second-tier memory opening fill portions according to an embodiment of the present disclosure.

Referring to FIG. 27, a second-tier nucleation material liner 22B and a second-tier sacrificial fill material portion 24B can be formed within each of the second-tier memory openings 49B and the second-tier support openings. Each second-tier nucleation material liner 22B can include the same material as, and can have the same thickness range as, the nucleation material liners 22 employed in the first exemplary structure. Each second-tier sacrificial fill material portion 24B can include the same material as the sacrificial fill material portions 24 in the first exemplary structure. The second-tier nucleation material liners 22B are a second subset of nucleation material liners 22 employed in the second exemplary structure. The second-tier sacrificial fill material portions 24B are a second subset of sacrificial fill material portions 24 employed in the second exemplary structure.

Figure 28:
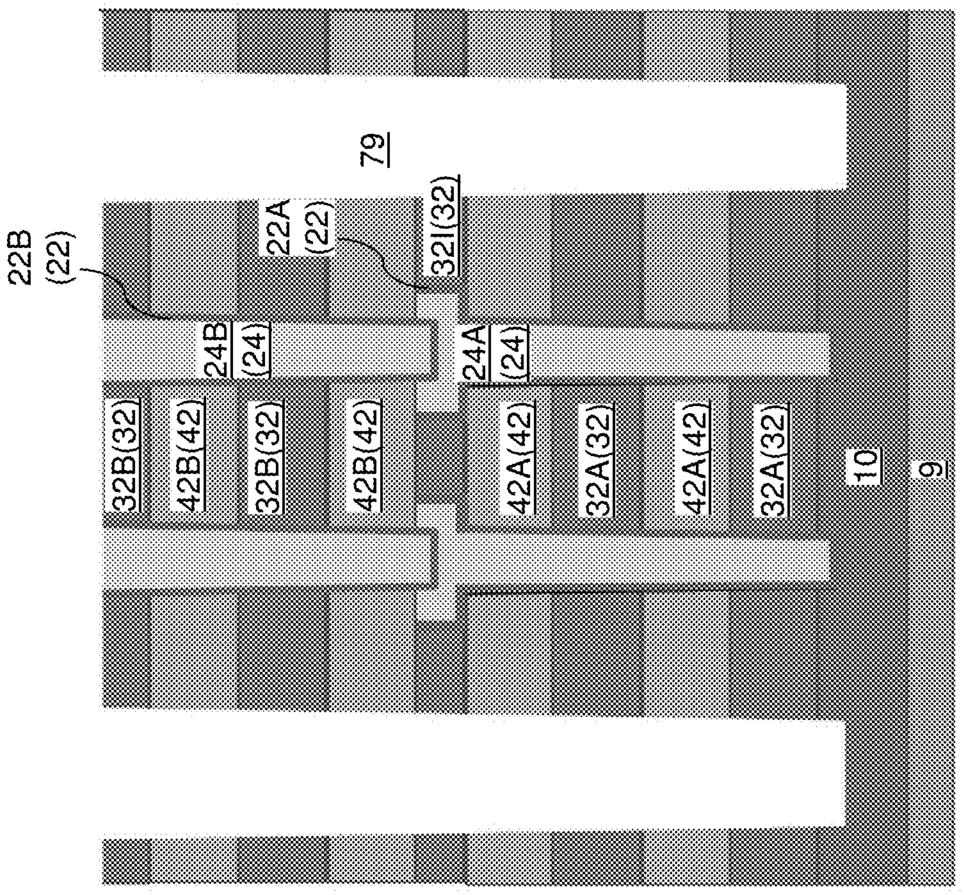
FIG. 28 is a vertical cross-sectional view of the second exemplary structure after formation of backside trenches according to an embodiment of the present disclosure.

Referring to FIG. 28, backside trenches 79 can be formed through the second-tier alternating stack (32B, 42B) and the first-tier alternating stack (32A, 42A) by performing the processing steps of FIGS. 6A and 6B.

Figure 29:
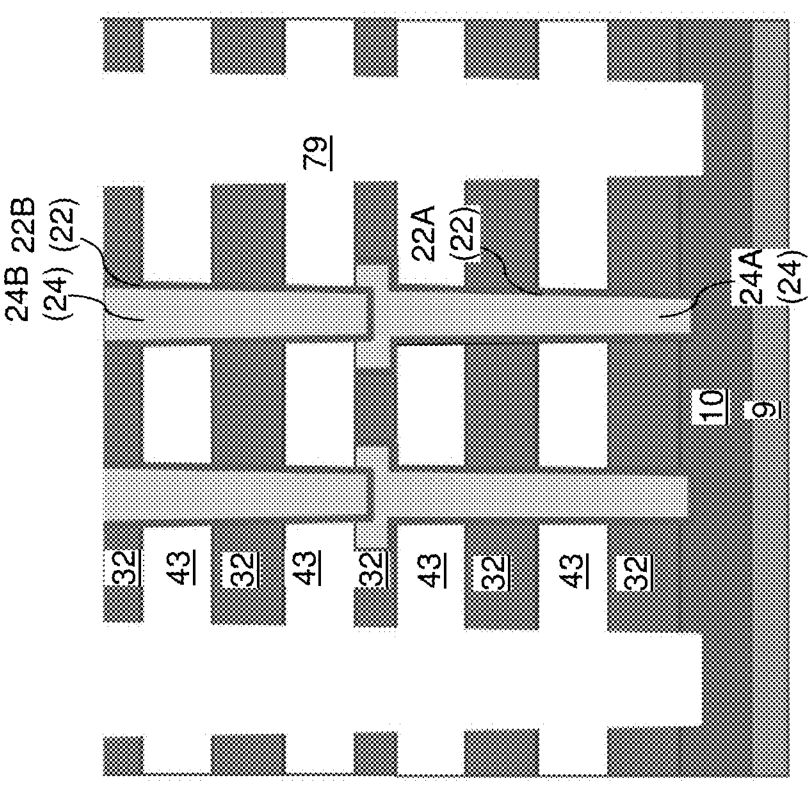
FIG. 29 is a vertical cross-sectional view of the second exemplary structure after formation of backside recesses according to an embodiment of the present disclosure.

Referring to FIG. 29, the processing steps of FIG. 7 can be performed to form backside recesses 43 by removing the first-tier sacrificial material layers 42A and the second-tier sacrificial material layers 42B selective to the insulating layers 32.

Figure 30:
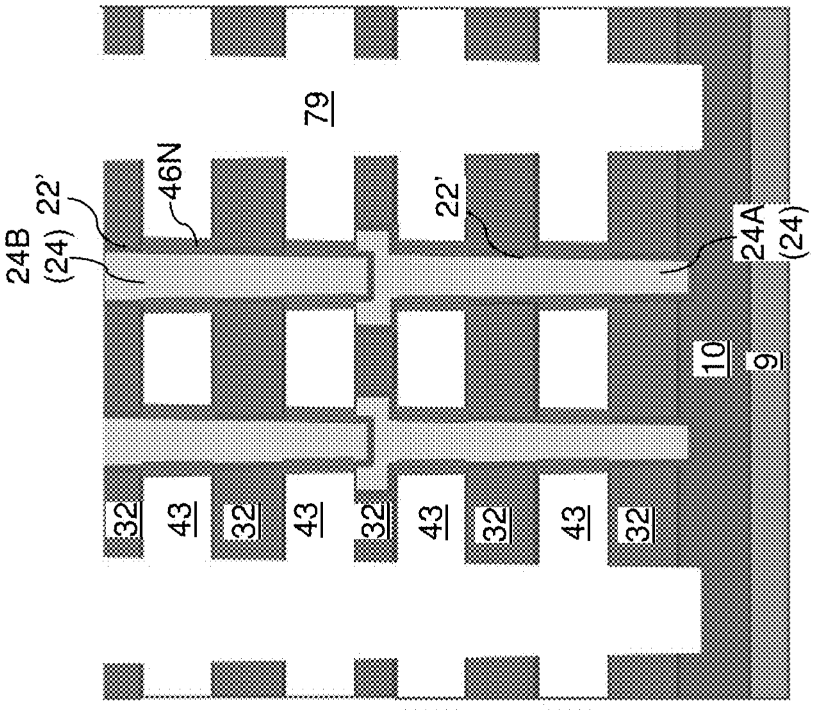
FIG. 30 is a vertical cross-sectional view of the second exemplary structure after formation of tubular metallic liners according to an embodiment of the present disclosure.

Referring to FIG. 30, the processing steps of FIG. 8 can be performed to form tubular metallic liners 46N by introducing a first metal-containing precursor gas into the backside recesses 43.

Figure 31:
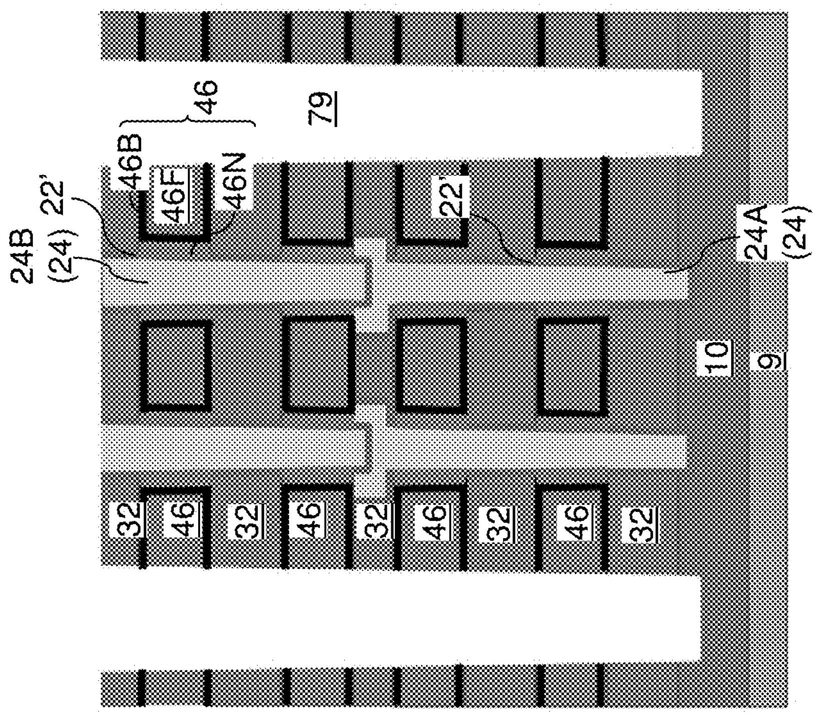
FIG. 31 is a vertical cross-sectional view of the second exemplary structure after formation of metallic fill material layers according to an embodiment of the present disclosure.

Referring to FIG. 31, the processing steps of FIG. 9 can be performed to form the electrically conductive barrier layers 46B and the metallic fill material layers 46F in the backside recesses 43.

Figure 32:
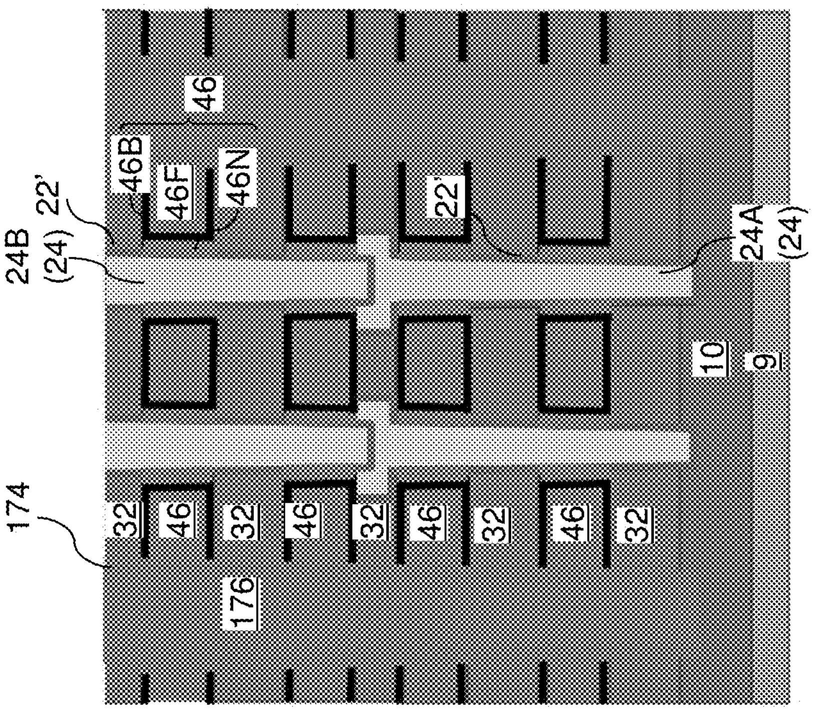
FIG. 32 is a vertical cross-sectional view of the second exemplary structure after formation of backside trench fill structures according to an embodiment of the present disclosure.

Referring to FIG. 32, an insulating spacer 174 and a backside contact via structure 176 (e.g., local interconnect) including a conductive material (such as a metal or heavily doped polysilicon) can be formed within each of the backside trenches 79. The insulating spacers 174 can be formed by conformally depositing and anisotropically etching an insulating material layer. The backside contact via structures 176 can be formed by depositing at least one conductive material in remaining volumes of the backside trenches 79.

Figure 33:
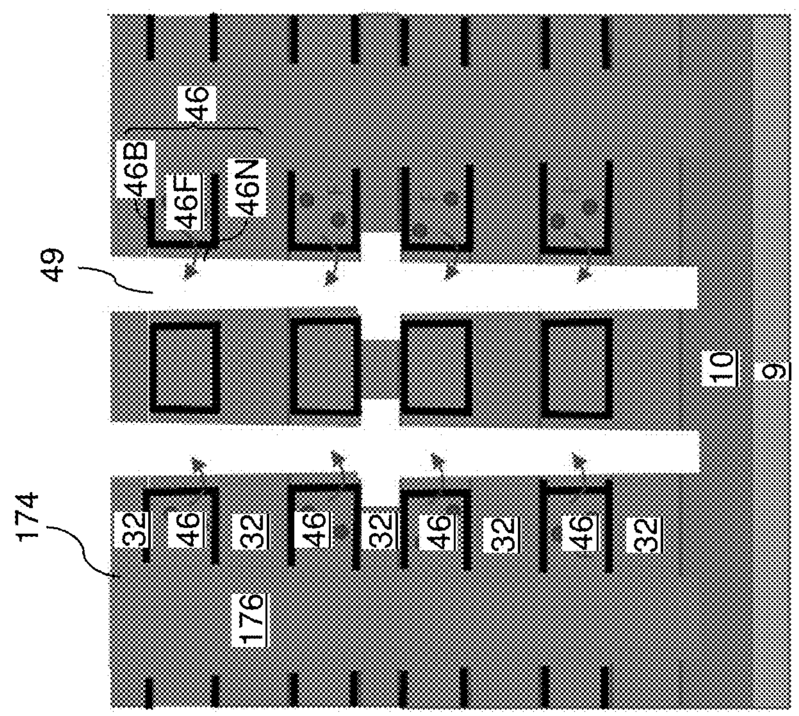
FIG. 33 is a vertical cross-sectional view of the second exemplary structure after removal of sacrificial memory opening fill structures according to an embodiment of the present disclosure.

Referring to FIG. 33, the processing steps of FIG. 11 can be performed to remove remaining portions of the sacrificial memory opening fill structures and the sacrificial support opening fill structures, each of which comprises a respective set of a second-tier sacrificial fill material portion 24B, a first-tier sacrificial fill material portion 24A, and annular portions 22' of a second-tier nucleation material liner 22B and a first-tier nucleation material liner 22A. According to an aspect of the present disclosure, a thermal anneal process described above with reference to FIG. 12 can be performed at an elevated temperature to degas volatile halogen, such as fluorine, trapped in the metallic fill material layers 46F, through the unfilled memory openings 49.

Figure 34:
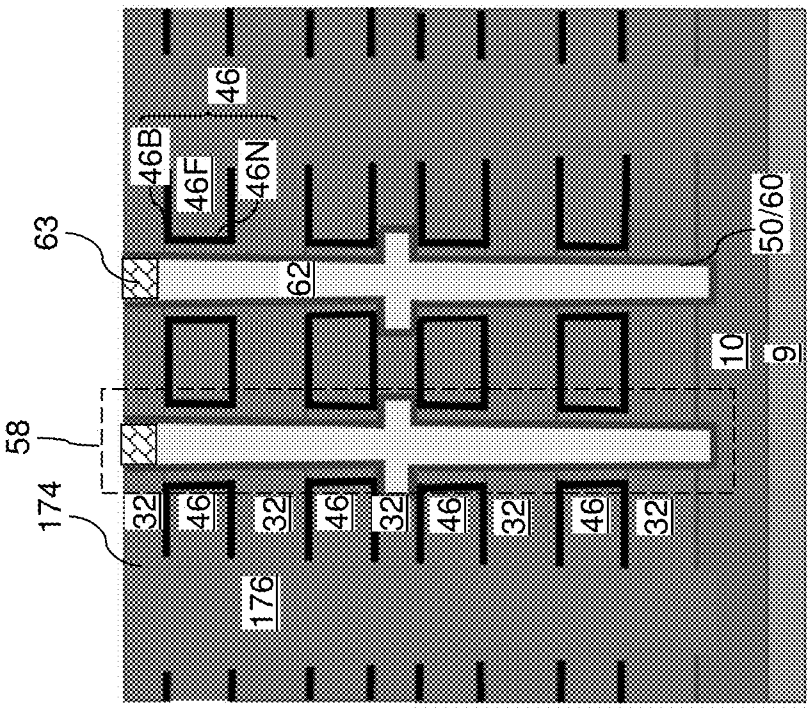
FIG. 34 is a vertical cross-sectional view of the second exemplary structure after formation of memory opening fill structures.

Referring to FIG. 34, the processing steps of FIGS. 13A and 13B can be performed to form a memory opening fill structure 58 within each memory opening and to form a support pillar structure (not shown) within each support opening.

Referring to all drawings and according to various embodiments of the present disclosure, a three-dimensional memory device includes an alternating stack of insulating layers 32 and electrically conductive layers 46, memory openings 49 extending through the alternating stack, and memory opening fill structures 58 located in the memory openings and containing a respective vertical semiconductor channel 60 and a respective memory film 50. Each of the electrically conductive layers 46 includes a tubular metallic liner 46N in contact with a respective outer sidewall segment of a respective one of the memory opening fill structures 58, an electrically conductive barrier layer 46B contacting the respective tubular metallic liner 46N and two of the insulating layers 32, and a metallic fill material layer 46F contacting the electrically conductive barrier layer 46B, and not contacting the tubular metallic liner 46N or any of the insulating layers 32.

In one embodiment, the tubular metallic liner 46N comprises tungsten doped with silicon, and the metallic fill material layer 46F comprises tungsten that contains no silicon or has a lower concentration of silicon than the tubular metallic liner. An average atomic percentage of silicon within the tubular metallic liner 46N may be in a range from 0.1% to 5.0%. In another embodiment, the tubular metallic liner 46N comprises tungsten doped with boron, and the metallic fill material layer 46F comprises tungsten that contains no boron or has a lower concentration of boron than the tubular metallic liner. An average atomic percentage of boron within the tubular metallic liner 46N may be in range from 0.1% to 5.0%.

In another embodiment, the tubular metallic liner 46N comprises a transition metal silicide, and the metallic fill material layer 46F consists essentially of a transition metal. The tubular metallic liner 46N may comprise cobalt silicide, molybdenum silicide or ruthenium silicide, and the metallic fill material layer may consist essentially of tungsten and unavoidable impurities. In one embodiment, the metallic fill material layer 46F comprises a laterally-extending seam 46S.

In one embodiment, the electrically conductive barrier layer 46B comprises titanium nitride, tungsten nitride, tungsten carbonitride or tungsten boronitride. In one embodiment, the electrically conductive barrier layer 46B has a clam shape having two horizontal portions connected to at least one vertical portion, and the metallic fill material layer 46F is surrounded on at least three sides (e.g., on top, bottom and at least one sidewall, such as on plural sidewalls) by the electrically conductive barrier layer 46B.

In one embodiment, the tubular metallic liners 46N comprise a cylindrical outer sidewall having a closed upper edge and a closed lower edge, and an inner sidewall including a straight inner sidewall segment, an upper tilted convex surface segment connecting an upper edge of the straight inner sidewall segment to the closed upper edge of the cylindrical outer sidewall, and a lower tilted convex surface segment connecting a lower edge of the straight inner sidewall segment to the closed lower edge of the cylindrical outer sidewall. The tubular metallic liner 46N may have a greater vertical extent than the metallic fill material layer 46F. In one embodiment, each of the memory films 50 comprises a respective aluminum oxide blocking dielectric layer 52 and a respective memory material layer 54. The respective aluminum oxide blocking dielectric layer 52 and the respective memory material layer 54 may have a lesser maximum lateral extent at a level of one of the electrically conductive layers 46 than at a level of an insulating layer 32 contacting a top surface of the one of the electrically conductive layers 46, and than at a level of another insulating layer 32 contacting a bottom surface of the one of the electrically conductive layers 46.

The various embodiments of the present disclosure provide electrically conductive layers 46 that have improved filling of the backside recesses 43 by forming self-aligned tubular metallic liners 46N that are nucleated employing the nucleation material liners 22 within sacrificial memory opening fill structures 26. Thus, the resistivity of the electrically conductive layers 46 can be reduced. Furthermore, by forming the memory opening fill structures 58 after performing a halogen (e.g., fluorine) outgassing anneal through the memory openings 49, the halogen outgassing damage (e.g., void formation) is reduced or eliminated in the layers of the memory film 50 (e.g., damage to the blocking dielectric layer 52 is reduced or eliminated).

Figure 35B:
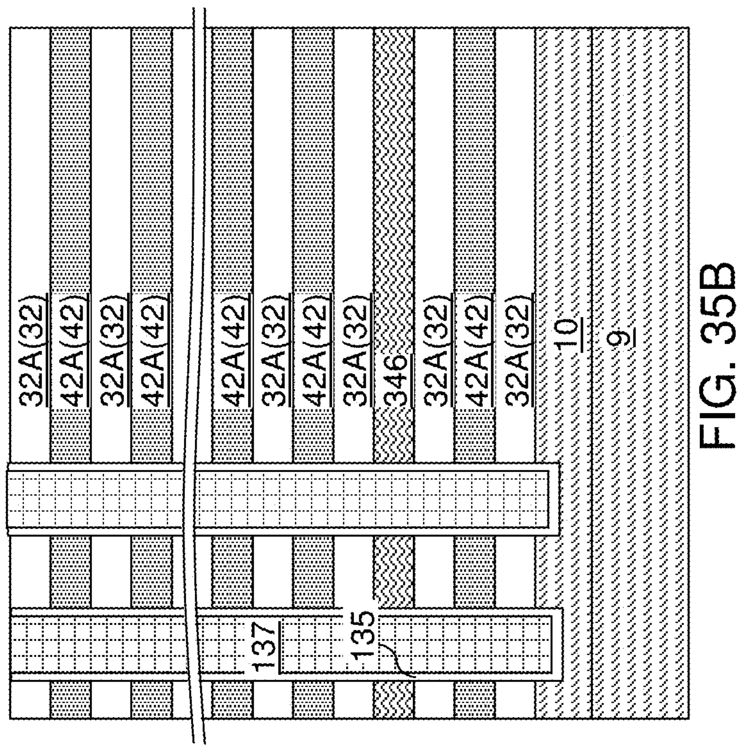
FIGS. 35A-35F are sequential vertical cross-sectional views of a third exemplary structure during formation of alternating stacks of insulating layers and sacrificial material layers, backside trenches, and backside recesses according to an embodiment of the present disclosure.
Figure 35A:
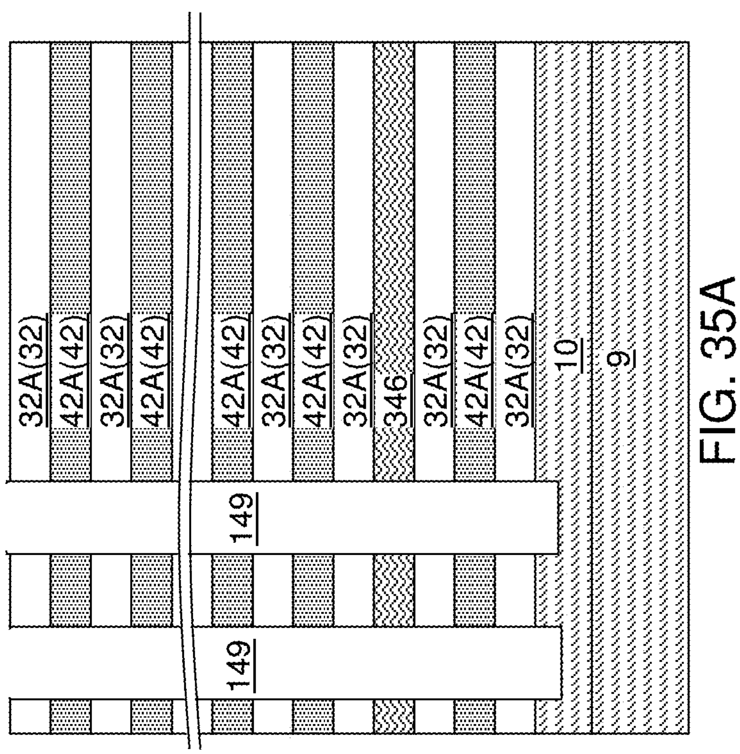

Referring to FIG. 35A, a third exemplary structure according to an embodiment of the present disclosure is illustrated. The third exemplary structure may be derived from the first exemplary structure illustrated in FIGS. 4A and 4B by employing an insulating layer 32 in lieu of an insulating cap layer 70, and by omitting formation of the drain-select-level isolation structures 72. In the third exemplary structure, the insulating layers 32 that are present at the processing steps of FIG. 35A are referred to as first-tier insulating layers 32A, and the sacrificial material layers 42 that are present at the processing steps of FIG. 35A are referred to as first-tier sacrificial material layers 42A. The alternating stack of the first-tier insulating layers 32A and the first-tier sacrificial material layers 42A is herein referred to as a first-tier alternating stack (32A, 42A). Optionally, one of the first-tier sacrificial material layers 42A that is proximal to the bottom surface of the first-tier alternating stack (32A, 32B) may be replaced with an electrically conductive semiconductor layer 346 comprising a heavily doped semiconductor material (such as heavily doped polysilicon). In this case, the electrically conductive semiconductor layer 346 may be employed as an etch stop material layer during subsequent formation of memory opening and support openings.

The memory openings formed through the first-tier alternating stack (32A, 42A) are herein referred to as first-tier memory openings 149. The support openings formed through the first-tier alternating stack (32A, 42A) are herein referred to as first-tier support openings (not illustrated). Generally, the first-tier alternating stack (32A, 42A) may be the same as the alternating stack (32, 42) of the first exemplary structure, or as the first-tier alternating stack of the second exemplary structure.

Referring to FIG. 35B, each of the first-tier memory openings 149 can be filled with a respective combination of a first-tier sacrificial liner 135 and a first-tier sacrificial memory opening fill material portion 137. Each of the first-tier support openings (not illustrated) can be filled with a respective combination of a first-tier sacrificial liner 135 and a first-tier sacrificial support opening fill material portion. The first-tier sacrificial liners 135 may comprise a undoped silicate glass (i.e., silicon oxide) or dielectric material that may be removed selective to the first-tier insulating layers 32A and the first-tier sacrificial material layers 42A, such as a doped silicate glass such as borosilicate glass or borophosphosilicate glass. The first-tier sacrificial memory opening fill material portions 137 and the first-tier sacrificial support opening fill material portions (not illustrated) may comprise a semiconductor material such as amorphous silicon, polysilicon, a silicon-germanium alloy, or a polymer material. The first-tier sacrificial liners 135, the first-tier sacrificial memory opening fill material portions 137, and the first-tier sacrificial support opening fill material portions can be formed by conformally depositing a sacrificial liner material of the first-tier sacrificial liners 135 in the first-tier memory openings 149 and the first-tier support openings, by depositing the sacrificial fill material of the first-tier sacrificial memory opening fill material portions 137 and the first-tier sacrificial support opening fill material portions in remaining volumes of the first-tier memory openings 149 and the first-tier support openings, and by removing excess portions of the sacrificial fill material and the sacrificial liner material from above the horizontal plane including the top surface of the first-tier alternating stack (32A, 42A).

Figure 35D:
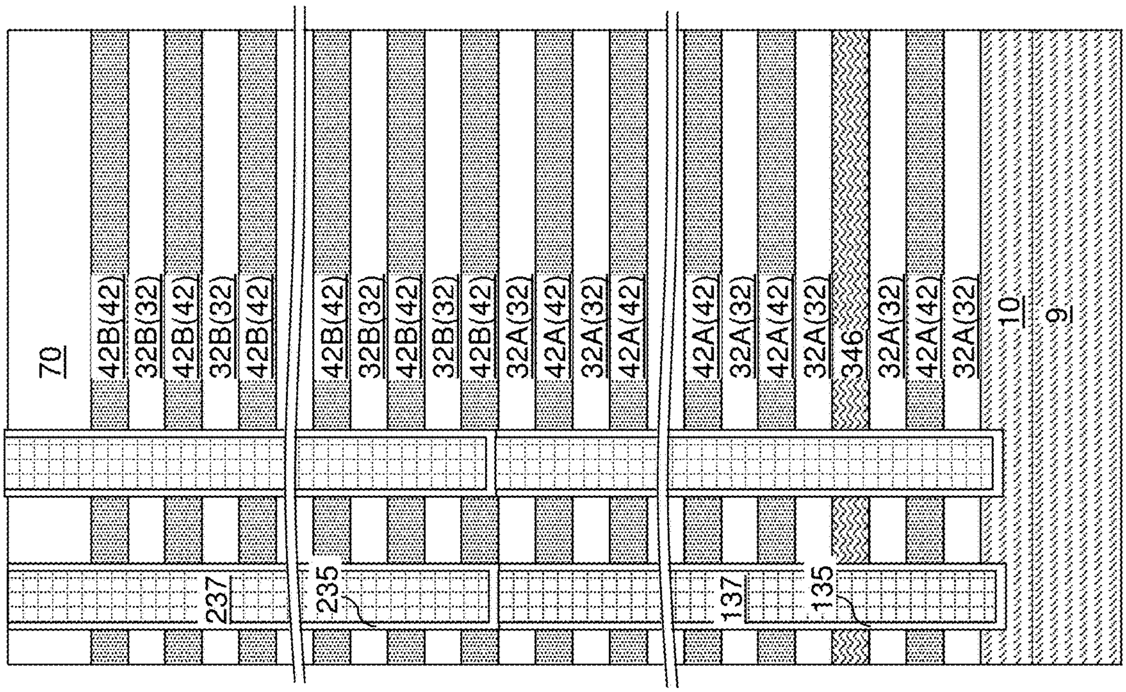
Figure 35C:
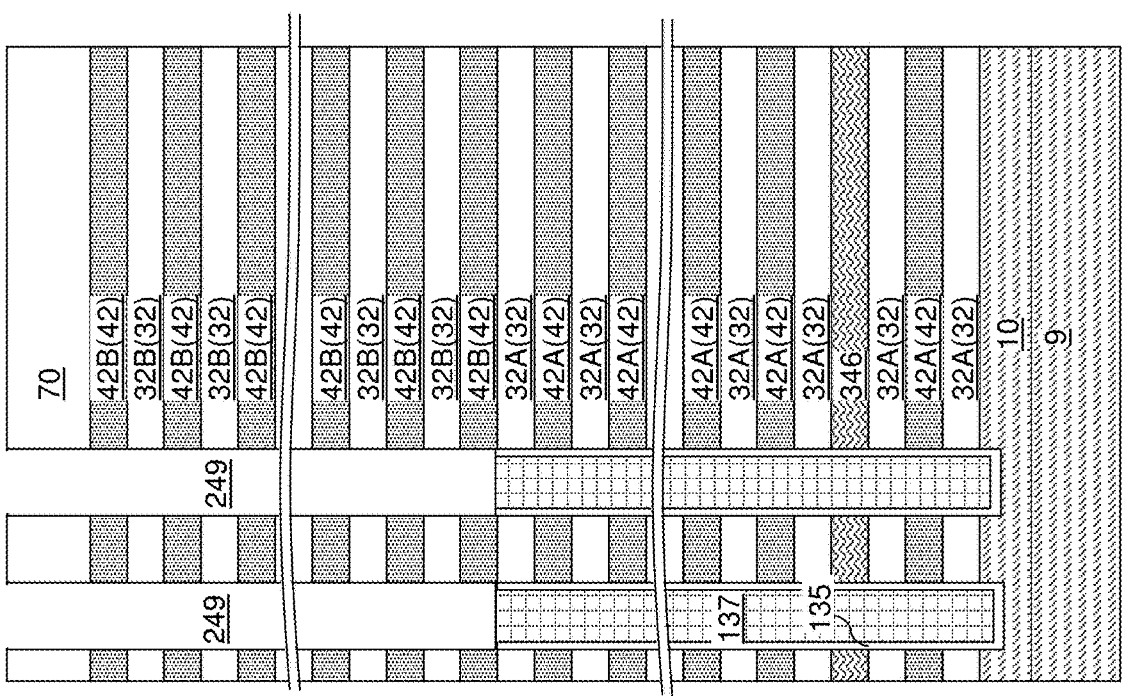

Referring to FIG. 35C, the processing steps of FIGS. 2, 3, and 4A and 4B can be performed again with any needed changes to form a second-tier alternating stack of second-tier insulating layers 32B and second-tier sacrificial material layers 42B of the third exemplary structure. Generally, the second-tier insulating layers 32B may comprise the same material as, and may have the same thickness range as, the insulating layers 32 of the first exemplary structure or the second-tier insulating layers 32B of the second exemplary structure. The memory openings formed through the second-tier alternating stack (32B, 42B) are herein referred to as second-tier memory openings 249. The support openings formed through the second-tier alternating stack (32B, 42B) are herein referred to as second-tier support openings (not illustrated). The second-tier alternating stack (32B, 42B) may be the same as the alternating stack (32, 42) of the first exemplary structure, or as the second-tier alternating stack of the second exemplary structure. Each of the second-tier memory openings 249 can be formed directly on, and can have an areal overlap in a plan view with, an underlying first-tier memory opening 149 (which is filled with a first-tier sacrificial liner 135 and a first-tier sacrificial memory opening fill material portion 137). Each of the second-tier support openings can be formed directly on, and can have an areal overlap in a plan view with, an underlying first-tier support opening (which is filled with a first-tier sacrificial liner and a first-tier sacrificial support opening fill structure).

Referring to FIG. 35D, each of the second-tier memory openings 249 can be filled with a respective combination of a second-tier sacrificial liner 235 and a second-tier sacrificial memory opening fill material portion 237. Each of the second-tier support openings (not illustrated) can be filled with a respective combination of a second-tier sacrificial liner 235 and a second-tier sacrificial support opening fill material portion. The second-tier sacrificial liners 235 may comprise the same material as the first-tier sacrificial liner 135. The second-tier sacrificial memory opening fill material portions 237 and the first-tier sacrificial support opening fill material portions (not illustrated) may comprise the same material as the first-tier sacrificial memory opening fill material portions 137. The second-tier sacrificial liners 235, the second-tier sacrificial memory opening fill material portions 237, and the first-tier sacrificial support opening fill material portions can be formed by conformally depositing a sacrificial liner material of the second-tier sacrificial liners 235 in the second-tier memory openings 249 and the second-tier support openings, by depositing the sacrificial fill material of the second-tier sacrificial memory opening fill material portions 237 and the first-tier sacrificial support opening fill material portions in remaining volumes of the second-tier memory openings 249 and the second-tier support openings, and by removing excess portions of the sacrificial fill material and the sacrificial liner material from above the horizontal plane including the top surface of the second-tier alternating stack (32B, 42B). Each contiguous combination of a second-tier sacrificial liner 235, a second-tier sacrificial memory opening fill material portion 237, a first-tier sacrificial liner 135, and a first-tier sacrificial memory opening fill material portion 137 constitutes a sacrificial memory opening fill structure (135, 137, 235, 237). Each contiguous combination of a second-tier sacrificial liner, a second-tier sacrificial support opening fill material portion, a first-tier sacrificial liner, and a first-tier sacrificial support opening fill material portion constitutes a sacrificial support opening fill structure (not illustrated).

Figure 35F:
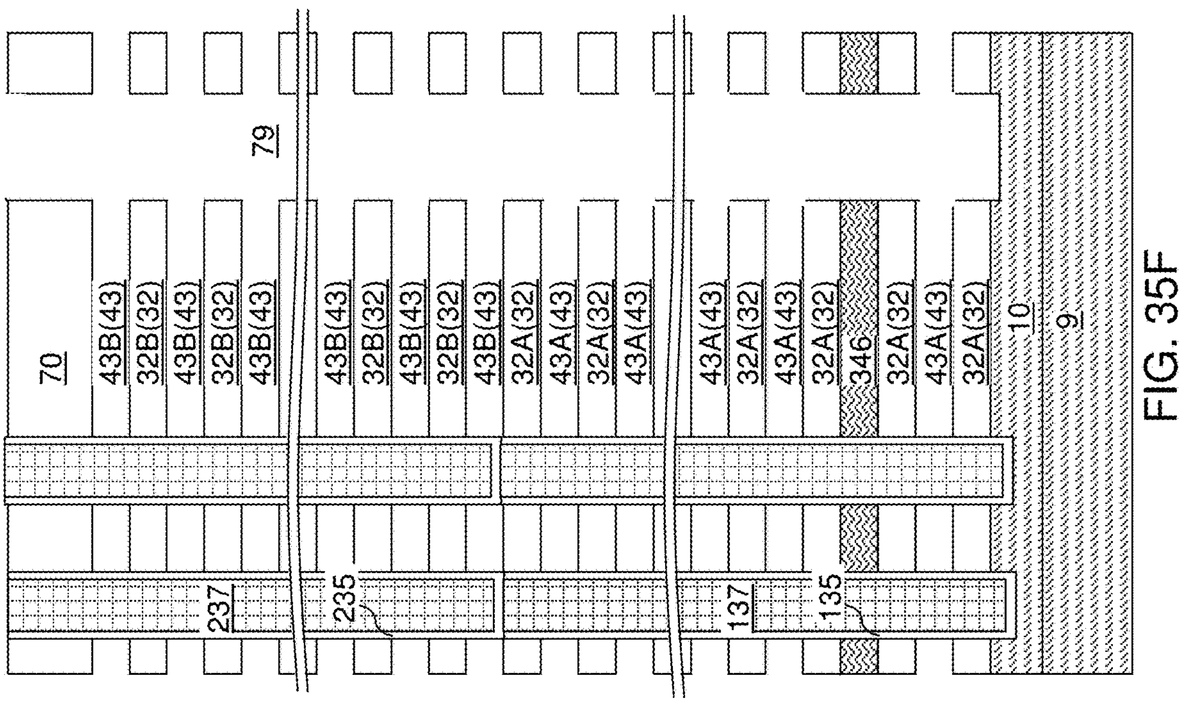
Figure 35E:
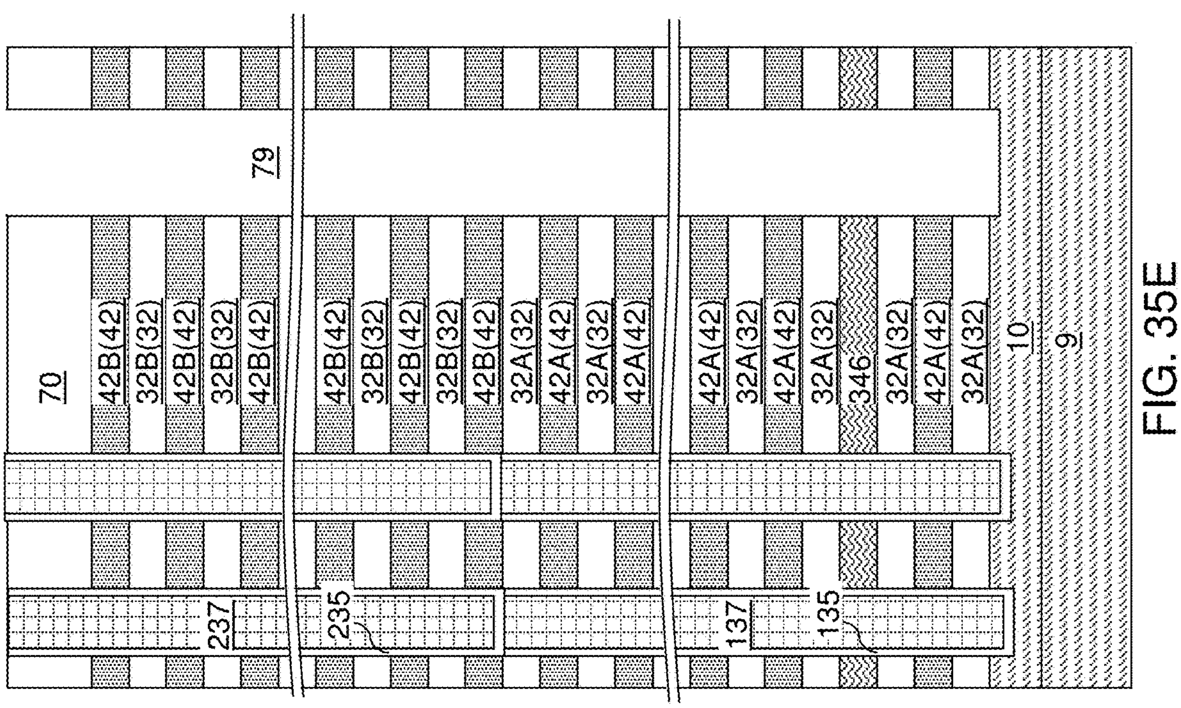

Referring to FIG. 35E, a photoresist layer (not shown) can be applied over the alternating stacks {(32A, 42A), (32B, 42B)} and can be lithographically patterned to form openings in areas between clusters of sacrificial memory opening fill structure (135, 137, 235, 237). The pattern in the photoresist layer can be transferred through the alternating stacks {(32A, 42A), (32B, 42B)} and the retro-stepped dielectric material portions (not illustrated) employing an anisotropic etch to form backside trenches 79, which vertically extend from the top surface of the insulating cap layer 70 at least to the top surface of the substrate (9, 10), and laterally extend through the memory array region and the contact region.

Referring to FIG. 35F, an etchant that selectively etches the materials of the sacrificial material layers (42A, 42B) with respect to the materials of the insulating layers (32A, 32B) can be introduced into the backside trenches 79, for example, employing an isotropic etch process. Backside recesses 43 are formed in volumes from which the sacrificial material layers 42 are removed. The removal of the materials of the sacrificial material layers (42A, 42B) can be selective to the materials of the insulating layers (32A, 32B), the materials of the retro-stepped dielectric material portions, the semiconductor material of the semiconductor material layer 10, and the materials of the sacrificial liners (135, 235). In one embodiment, the sacrificial material layers (42A, 42B) can include silicon nitride, and the materials of the insulating layers (32A, 32B) and the retro-stepped dielectric material portions (not illustrated) can be selected from silicon oxide and dielectric metal oxides. In this case, the isotropic etch process may comprise a wet etch process employing hot phosphoric acid.

The backside recesses 43 may comprise first-tier backside recesses 43A that are formed in volumes from which the first-tier sacrificial material layers 42A are removed, and second-tier backside recesses 43B that are formed in volumes from which the second-tier sacrificial material layers 42B are removed. Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which sacrificial memory opening fill structures (135, 137, 235, 237) are present are herein referred to as front-side openings or front-side cavities in contrast with the backside recesses 43. In this case, each backside recess 43 can define a space for receiving a respective word line of an array of three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 36B:
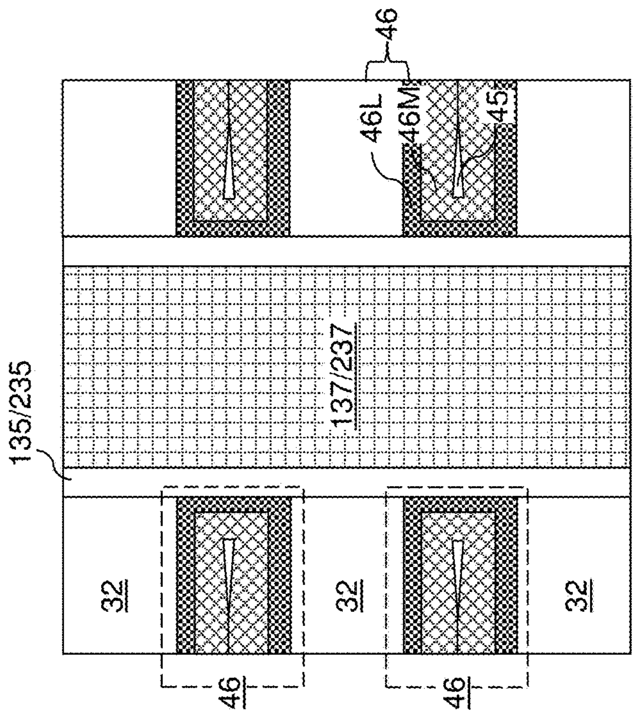
FIG. 36B is a magnified view of a region of the third exemplary structure of FIG. 36A around a memory opening.
Figure 36A:
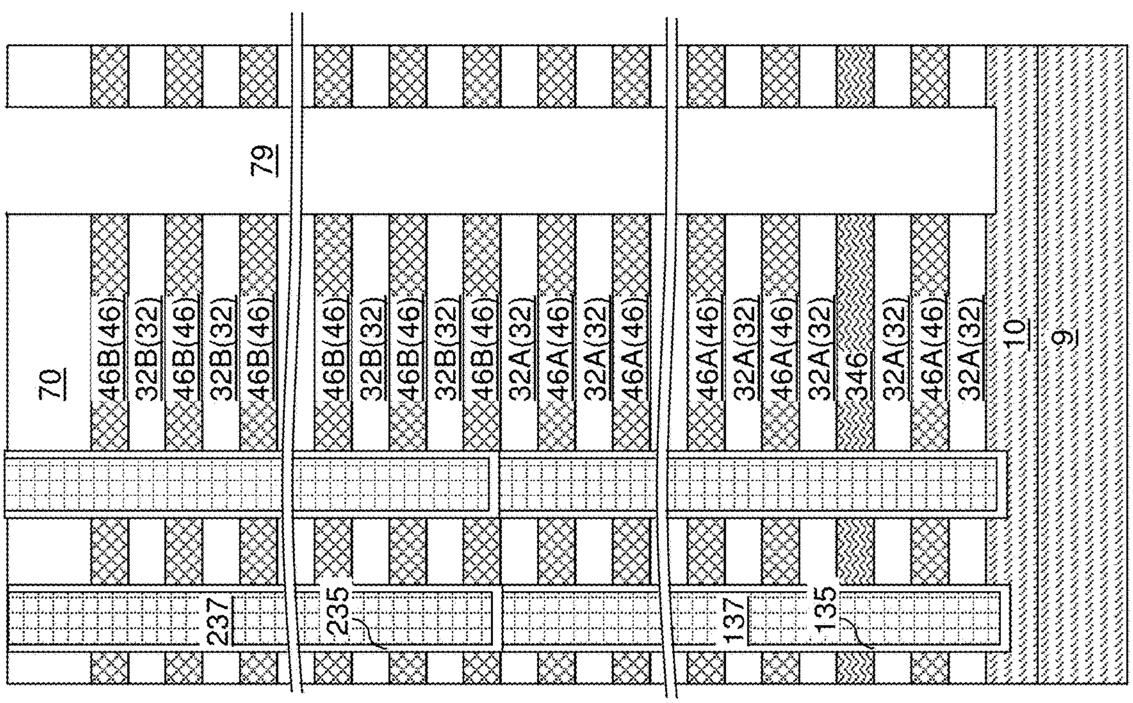
FIG. 36A is a vertical cross-sectional view of the third exemplary structure after formation of electrically conductive layers according to an embodiment of the present disclosure.

Referring to FIGS. 36A and 36B, a metallic liner material can be conformally deposited in the backside recesses 43 and on sidewalls of the backside trenches 79. The metallic liner material comprises a conductive metallic compound material such as TiN, TaN, WN, MoN, TiC, TaC, WC, or a stack thereof. The metallic liner material may be deposited by a conformal deposition process such as a chemical vapor deposition process or an atomic layer deposition process. The thickness of the metallic liner material may be in a range from 1 nm to 20 nm, such as from 2 nm to 10 nm, although lesser and greater thicknesses may also be employed.

A metallic fill material can be deposited over the deposited metallic liner material in remaining volumes of the backside recesses 43 and in peripheral regions of the backside trenches 79. The metallic fill material may include a metal such as tungsten, cobalt, ruthenium, molybdenum, or any other metal that may be deposited by thermal or plasma decomposition of a metal-containing precursor gas by a chemical vapor deposition process or an atomic layer deposition process. While the metallic fill material may be generally deposited with conformity, depletion of the metal-containing precursor gas in portions of the backside recesses 43 that are distal from the backside trenches 79 may cause reduction of the thickness of the deposited metallic fill material in proximity to the sacrificial memory opening fill structures (135, 137, 235, 237), and may cause formation of seams and/or encapsulated cavities (i.e., air gaps) 45 within the deposited metallic fill material portions. Alternatively, the seams and/or air gaps 45 may be omitted.

An anisotropic etch process can be performed to remove portions of the deposited metallic fill material and the metallic liner material from inside the backside trenches 79 and from above the insulating cap layer 70. Each contiguous set of remaining portions of the metallic fill material and the metallic liner material located within a respective one of the backside recesses 43 comprise an electrically conductive layer 46. The electrically conductive layers 46 comprise first-tier electrically conductive layers 46A formed within the first-tier backside recesses 43A and second-tier electrically conductive layers 46B formed within the second-tier backside recesses 43B. Each of the electrically conductive layers 46 may comprise a metallic fill material layer 46M comprising a portion of a metal (e.g., W, Mo, etc.), and a metallic liner 46L comprising a portion of a metallic liner material (e.g., metal nitride or carbide).

Generally, the sacrificial material layers 42 are replaced with the electrically conductive layers 46. In one embodiment, the metallic liners 46L may comprise, and/or may consist essentially of, a conductive metallic nitride material, and the metallic fill material layers 46M of the electrically conductive layers 46 may comprise, and/or may consist essentially of, a metal, such as W or Mo. In one embodiment, each of the metallic liners 46L may have a same material composition and a same thickness throughout.

Figure 37B:
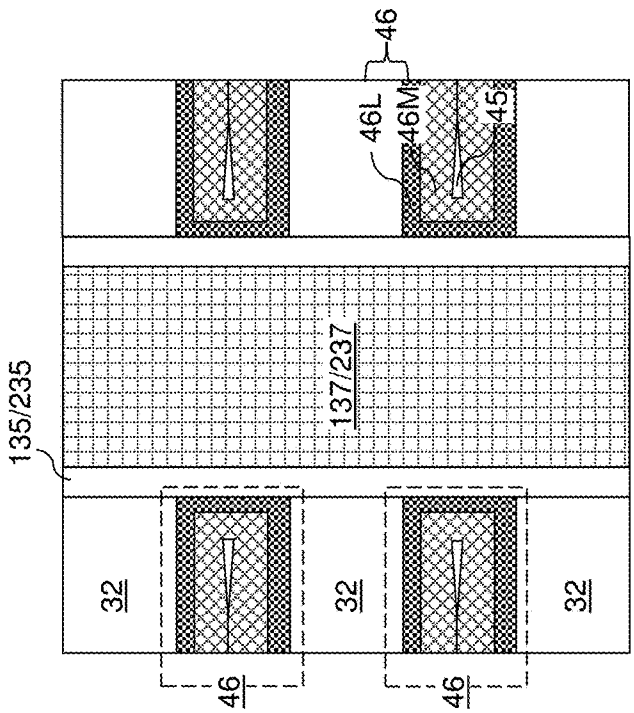
FIG. 37B is a magnified view of a region of the third exemplary structure of FIG. 37A around a memory opening.
Figure 37A:
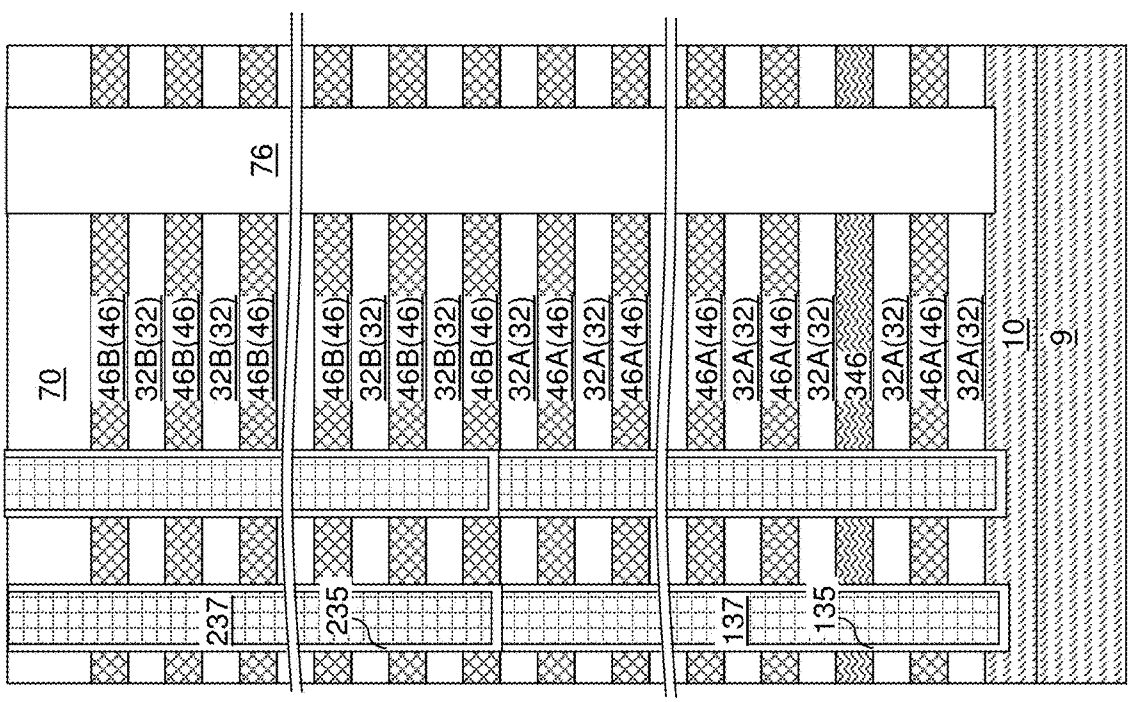
FIG. 37A is a vertical cross-sectional view of the third exemplary structure after formation of backside trench fill structures according to an embodiment of the present disclosure.

Referring to FIGS. 37A and 37B, a dielectric fill material such as silicon oxide can be deposited in the backside trenches 79 by a conformal deposition process. Excess portions of the dielectric fill material can be removed from above the top surface of the insulating cap layer 70 by a planarization process, which may employ a chemical mechanical polishing (CMP) process and/or a recess etch process. Each remaining portion of the dielectric fill material filling a respective backside trench 79 constitutes a backside trench fill structure 76.

Figure 38B:
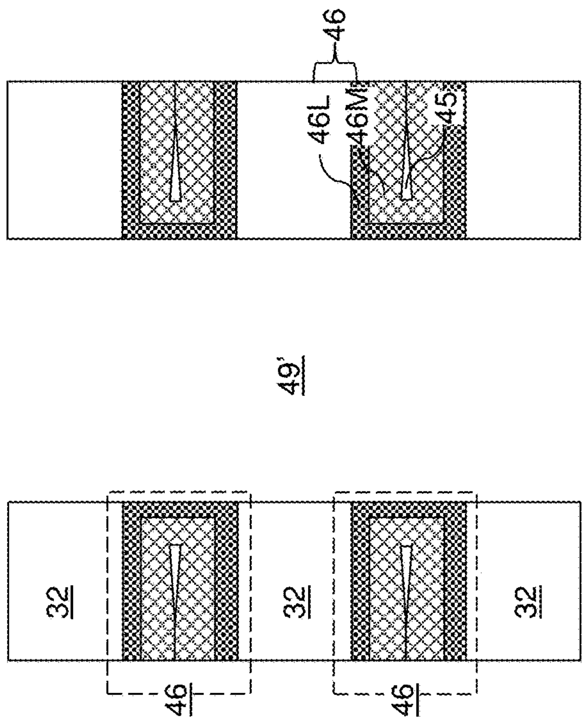
FIG. 38B is a magnified view of a region of the third exemplary structure of FIG. 38A around a memory opening.
Figure 38A:
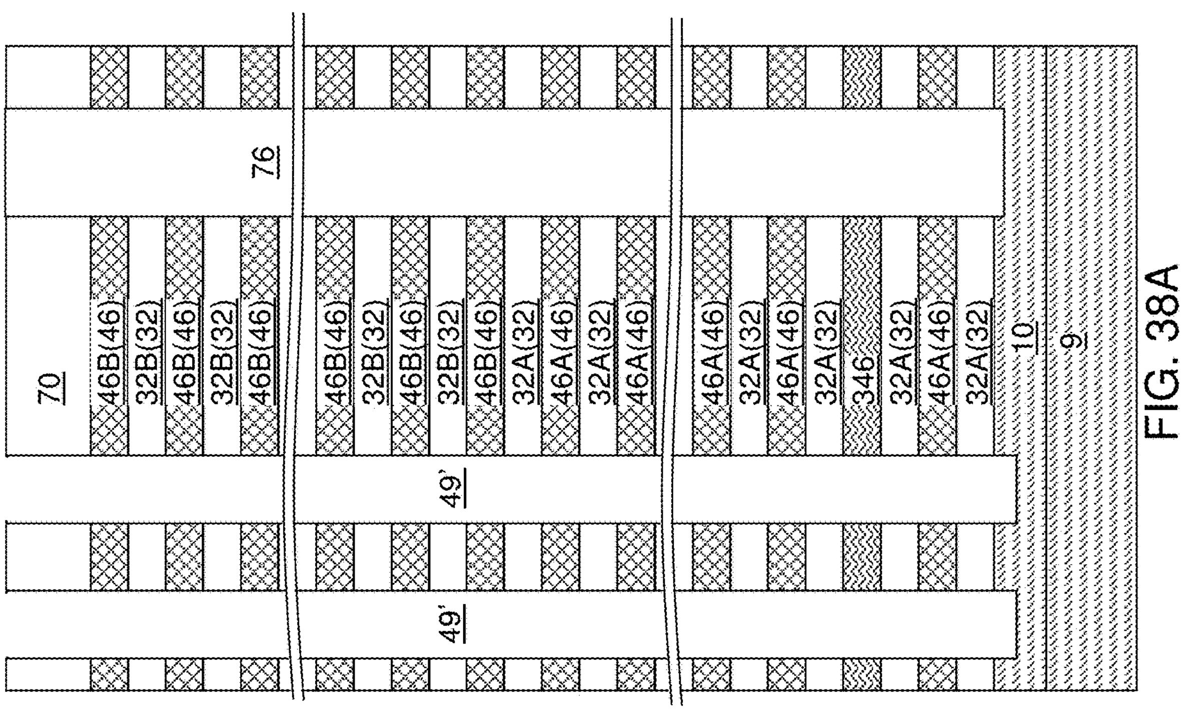
FIG. 38A is a vertical cross-sectional view of the third exemplary structure after removal of sacrificial memory opening fill structures according to an embodiment of the present disclosure.

Referring to FIGS. 38A and 38B, the sacrificial memory opening fill structure (135, 137, 235, 237) is removed selective to the electrically conductive layers 46 and the insulating layers 32. In one embodiment, a first isotropic or anisotropic etch process can be performed to etch the second-tier sacrificial memory opening fill material portions 237 selective to the second-tier sacrificial liners 235. A second isotropic etch process can be performed to etch the second-tier sacrificial liners 235 selective to the electrically conductive layers 46. Alternatively, a second anisotropic etch process can be performed to etch the horizontal portion of the second-tier sacrificial liners 235 at the bottom of openings 249 the selective to the electrically conductive layers 46. A third isotropic or anisotropic etch process can be performed to etch the first-tier sacrificial memory opening fill material portions 137 selective to the first-tier sacrificial liners 135, the electrically conductive layers 46, and the insulating layers 32. A fourth isotropic etch process can be performed to etch the first-tier sacrificial liners 135 (and any remaining vertical portions of the second-tier sacrificial liners 235) selective to the electrically conductive layers 46. A memory cavity 49' can be formed within the volume of each sacrificial memory opening fill structure (135, 137, 235, 237) (which fills a respective memory opening that includes a stack of a first-tier memory opening 149 and a second-tier memory opening 249).

Figure 39B:
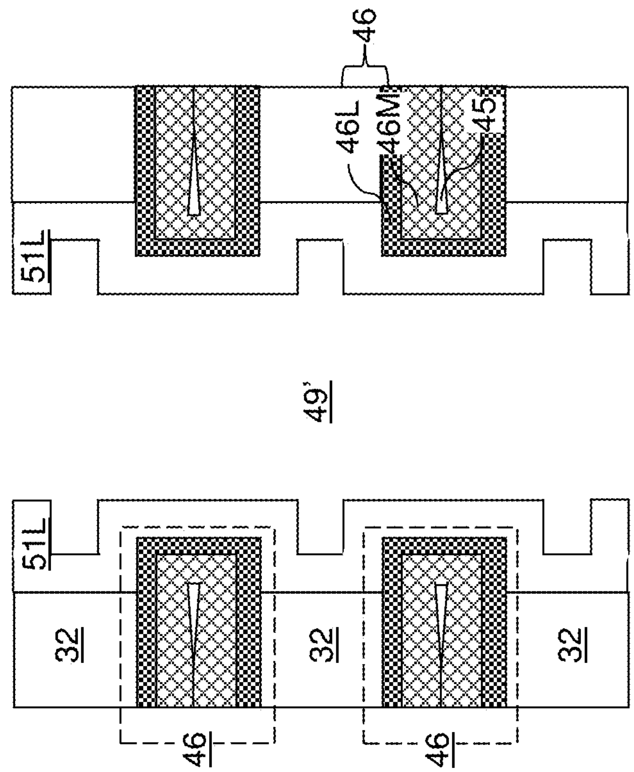
FIGS. 39A-39D are sequential vertical cross-sectional views of a region of a memory opening of the third exemplary structure during formation of a vertical stack of tubular dielectric spacers and recessing of the electrically conductive layers according to an embodiment of the present disclosure.
Figure 39A:
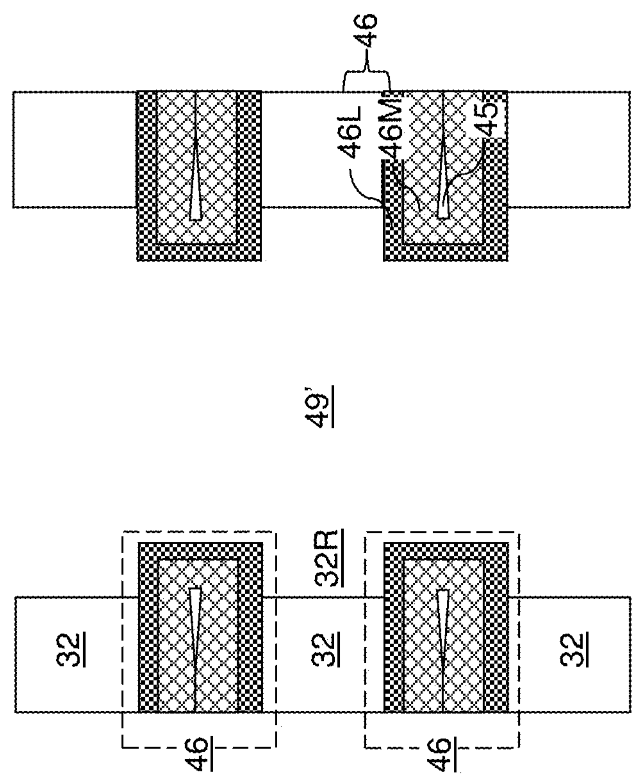

Referring to FIG. 39A and according to various aspects of the present disclosure, the insulating layers 32 and the insulating cap layer 70 can be laterally recessed to form lateral recesses 32R around the memory cavity 49'. In one aspect, the above described second etch process and/or the fourth etch process may comprise isotropic etch processes which etch the second and first tier sacrificial liners (235, 135) non-selectively to the insulating layers 32 (e.g., in case the liners and the insulating layers comprise the same or similar material, such as silicon oxide). In this aspect, the insulating layers 32 and the insulating cap layer 70 are laterally recessed during the second and/or fourth etch processes. In an alternative aspect, the second etch process and/or the fourth etch process may etch the second and first tier sacrificial liners (235, 135) selectively to the insulating layers 32 (e.g., in case the liners and the insulating layers comprise different materials). In this aspect, the insulating layers 32 and the insulating cap layer 70 can be laterally recessed by performing a fifth selective isotropic etch process. The selective isotropic etch process etches the materials of the insulating layers 32 and the insulating cap layer 70 selective to the material of the metallic liners 46L around each memory cavity 49'. For example, if the insulating layers 32 and the insulating cap layer 70 comprise silicon oxide, the selective isotropic etch process may comprise a wet etch process employing dilute hydrofluoric acid. The recess distance of the insulating layers 32 and the insulating cap layer 70 from the memory cavity 49' may be in a range from 5 nm to 100 nm, such as from 10 nm to 50 nm, although lesser and greater recess distances may also be employed.

Referring to FIG. 39B, a dielectric material layer 51L can be conformally deposited on the physically exposed surfaces around each memory cavity 49' (including in the lateral recesses 32R) by a conformal deposition process. The dielectric material layer 51L comprises, and/or consists essentially of, a dielectric material such as silicon oxide, silicon nitride, or a dielectric metal oxide such as aluminum oxide, hafnium oxide, titanium oxide, etc. The dielectric material layer 51L can be deposited by a conformal deposition process such as a chemical vapor deposition process or an atomic layer deposition process. The thickness of the dielectric material layer 51L may be in a range from 1 nm to 60 nm, such as from 3 nm to 30 nm, although lesser and greater thicknesses may also be employed. The dielectric material layer 51L may partially or completely fill the lateral recesses 32R.

Figure 39D:
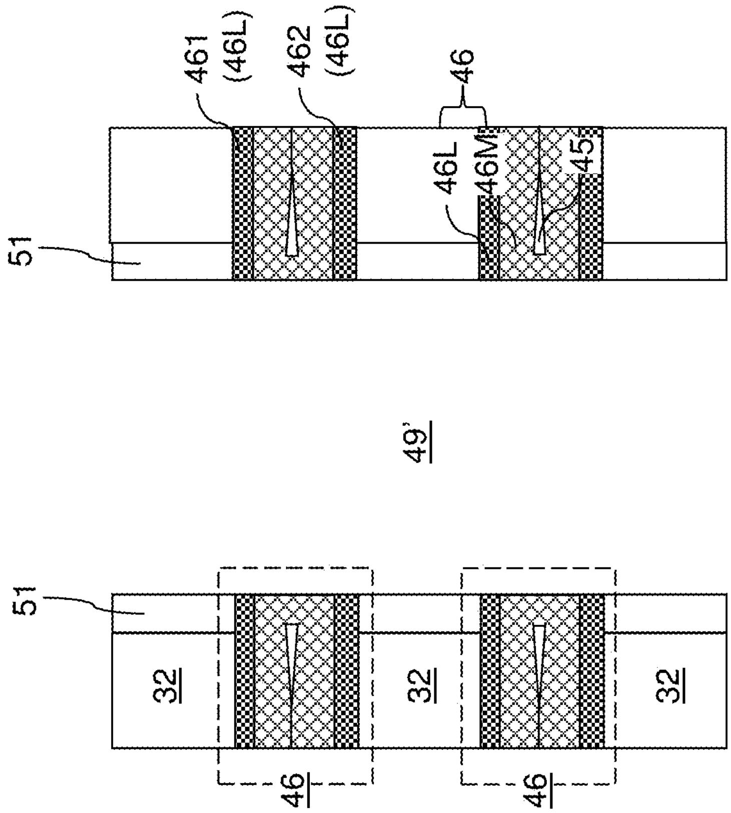
Figure 39C:
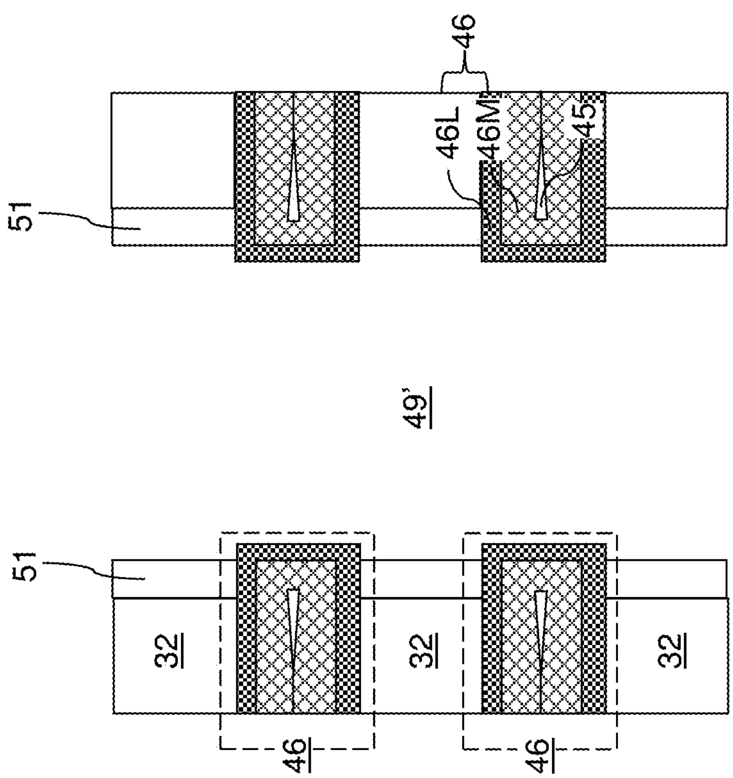

Referring to FIG. 39C, an anisotropic etch process can be performed to remove portions of the dielectric material layer 51L that protrude inward at levels of the electrically conductive layers 46. The anisotropic etch process does not remove portions of the dielectric material layer 51L that are located in the lateral recesses 32R, but removes portions of the dielectric material layer 51L that are located on inner sidewalls of the electrically conductive layers 46 and portions of the dielectric material layer 51L that are laterally offset from the insulating layers 32 by a lateral distance that is greater than the width of the lateral recesses 32R. The anisotropic etch process may, or may not, be selective to the material of the metallic liners 46L. In case the anisotropic etch process is selective to the material of the metallic liners 46L, the electrically conductive layers 46 may comprise laterally protruding portions that protrude into a respective memory cavity 49'. In case the anisotropic etch process is not selective to the material of the metallic liners 46L, portions of the metallic liners 46L that are not covered by the remaining portions of the dielectric material layer 51L may be removed and sidewalls of the metallic fill material layers 46M may be physically exposed to the memory cavities 49'.

Each set of remaining vertically-extending portion of the dielectric material layer 51L around a respective memory cavity 49' constitutes a vertical stack of tubular dielectric spacers 51. Thus, a vertical stack of tubular dielectric spacers 51 can be formed on recessed sidewalls of the insulating layers 32 around each memory cavity 49. Each tubular dielectric spacer 51 of the vertical stacks of tubular dielectric spacers 51 is in contact with a horizontal annular surface segment of a respective electrically conductive layer 46. Each tubular dielectric spacer 51 may completely or partially fill the respective lateral recess 32R. Thus, the width (e.g., diameter) of the memory cavity 49' may be controlled by controlling the thickness of the tubular dielectric spacers 51. Therefore, the width of the memory cavity 49' is adjustable.

Referring to FIG. 39D, in case the anisotropic etch process that patterns the dielectric material layer 51L into vertical stacks of tubular dielectric spacers 51 is selective to the material of the metallic liners 46L, and the tubular dielectric spacers 51 partially fill the lateral recesses 32R, then an additional anisotropic etch process may be performed. The additional anisotropic etch process removes portions of the electrically conductive layers 46 that are not covered by the combination of the tubular dielectric spacers 51, the insulating cap layer 70, and the insulating layers 32.

Portions of the electrically conductive layers 46 that protrude inward from sidewalls of the tubular dielectric spacers 51 into a respective memory cavity 49' are removed by the additional anisotropic etch process. Sidewalls of the remaining portions of the electrically conductive layers 46 can be vertically coincident with (i.e., located within a same vertical plane as) the inner sidewalls of the tubular dielectric spacers 51.

In case the anisotropic etch process at the processing steps of FIG. 39C is not selective to the material of the metallic liners 46L and/or the material of the metallic fill material layers 46M, portions of the electrically conductive layers 46 that are not covered by the tubular dielectric spacers 51 may be removed during the anisotropic etch process at the processing steps of FIG. 39C. In this case, sidewalls of the remaining portions of the electrically conductive layers 46 can be vertically coincident with (i.e., located within a same vertical plane as) the inner sidewalls of the tubular dielectric spacers 51 after the anisotropic etch process at the processing steps of FIG. 39C, and the processing steps of FIG. 39D may be omitted.

According to an embodiment of the present disclosure, portions of the electrically conductive layers 46 that are not covered by the vertical stack of tubular dielectric spacers 51 can be anisotropically etched by performing an anisotropic etch process after, or during, formation of the vertical stack of tubular dielectric spacers 51 around each memory cavity 49'. In one embodiment, each of the electrically conductive layers 46 may comprise a metallic fill material layer 46M embedded within a metallic liner 46L prior to the anisotropic etch process.

In one embodiment, an anisotropic etch process can be performed to remove vertically-extending portions of the metallic liners 46L. In one embodiment, each of the metallic liners 46L may be divided into a respective upper metallic liner 461 and a lower metallic liner 462 by the anisotropic etch process. Sidewalls of the metallic fill material layers 46M can be exposed in the memory cavities 49' upon anisotropically etching the portions of the electrically conductive layers 46 that are not covered by the vertical stack of tubular dielectric spacers 51 within each memory opening 49. In one embodiment, each tubular dielectric spacer 51 among the vertical stacks of tubular dielectric spacers 51 can be in contact with a horizontal annular surface segment of a respective metallic liner 46L that is selected from the lower metallic liners 462 and the upper metallic liners 461.

In one embodiment, one, a plurality, and/or each, of the electrically conductive layers 46 comprises a seam and/or encapsulated cavity (i.e., air gap) 45 prior to the anisotropic etch process. In one embodiment, the seam or air gap 45 may be laterally spaced from the memory cavity 49' by a portion of the metallic fill material layer 46M of a respective one of the electrically conductive layers 46 after the anisotropic etch process. In one embodiment, the lower metallic liners and the upper metallic liners of the electrically conductive layers have a same material composition and a same thickness.

Generally, a subset of the electrically conductive layers 46 comprises a metallic fill material layer 46M, an upper metallic liner 461 located entirely above the horizontal plane including the top surface of the metallic fill material layer 46M, and a lower metallic liner 462 located entirely above the horizontal plane including the bottom surface of the metallic fill material layer 46M. In one embodiment, each electrically conductive layer 46 within a subset of the electrically conducive layers 46 comprises a metallic fill material layer 46M comprising a metal and having inner sidewalls that are physically exposed to a respective memory cavity 49', a lower metallic liner 462 contacting a bottom surface of the metallic fill material layer 46M, and an upper metallic liner 461 contacting a top surface of the metallic fill material layer 46M.

In one embodiment, within each electrically conductive layer 46, the lower metallic liner 462 comprises a first portion of a metallic liner material that is located entirely below a bottom surface of the metallic fill material layer 46M, and the upper metallic liner 461 comprises a second portion of the metallic liner material that is located entirely above a top surface of the metallic fill material layer 46M. In one embodiment, in each electrically conductive layer 46, the metallic fill material layer 46M contacts the metallic liner material only at a top surface of the metallic fill material layer 46M and only at a bottom surface of the metallic fill material layer 46M. In one embodiment, in each electrically conductive layer 46, sidewalls of the metallic fill material layer 46M do not contact any surface of the metallic liner material. In one embodiment, in each electrically conductive layer 46, each top periphery of the metallic fill material layer 46M coincides with a bottom periphery of the upper metallic liner 461 and each bottom periphery of the metallic fill material layer 46M coincides with a top periphery of the lower metallic liner 462.

Figure 40B:
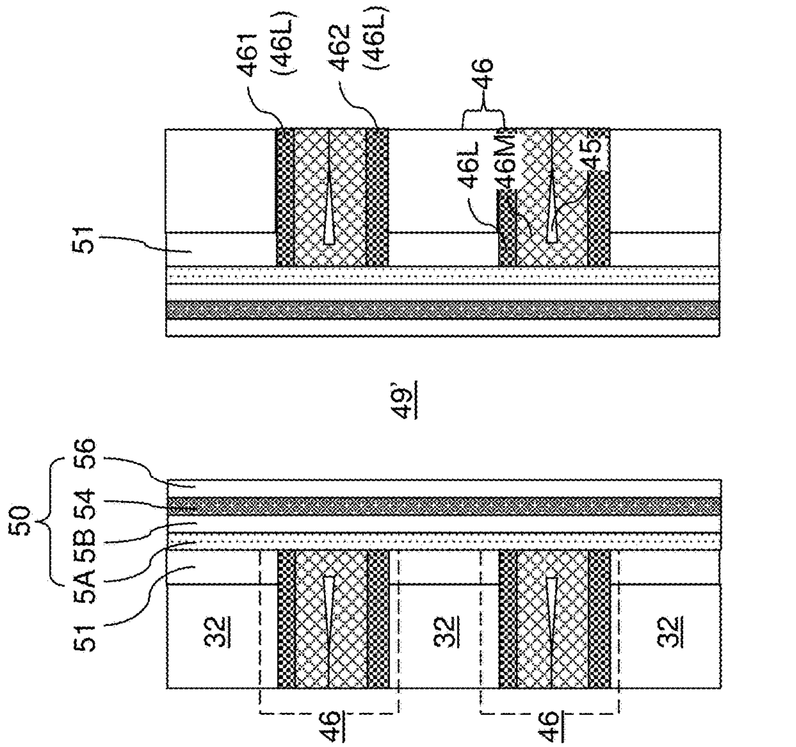
FIG. 40B is a magnified view of a region of the third exemplary structure of FIG. 40A around a memory opening.
Figure 40A:
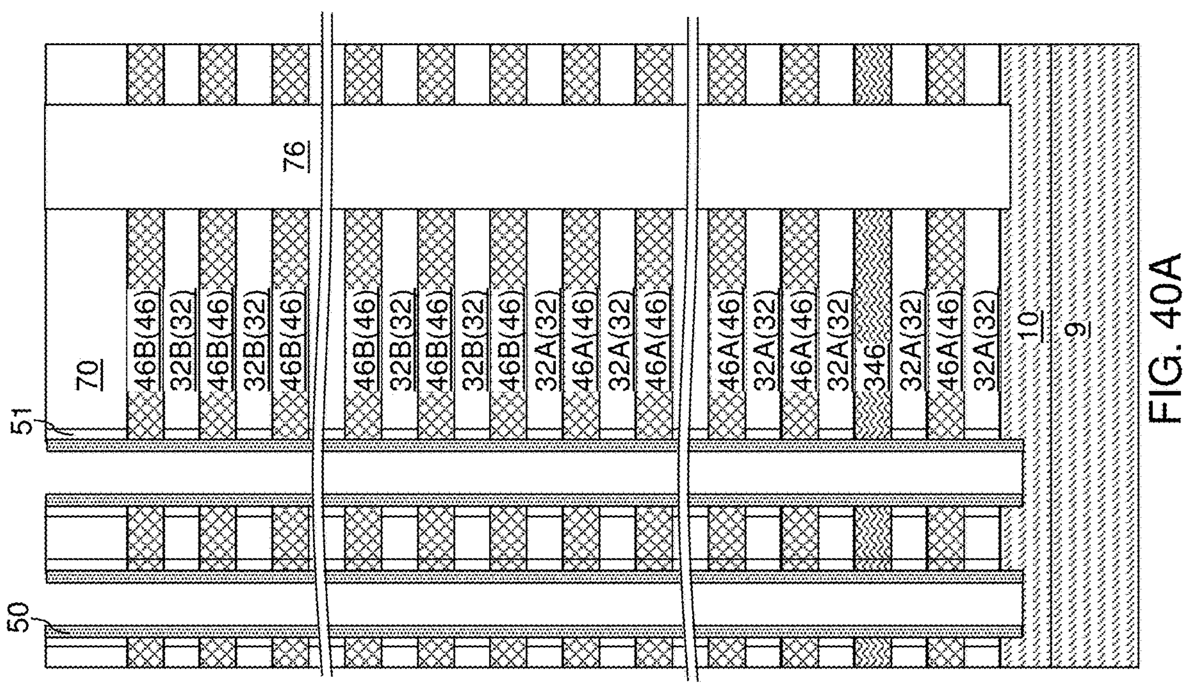
FIG. 40A is a vertical cross-sectional view of the third exemplary structure after formation of memory films according to an embodiment of the present disclosure.

Referring to FIGS. 40A and 40B, a memory film 50 can be formed on physically exposed sidewall surfaces of each memory cavity 49' by sequentially depositing various material layers and by anisotropically etching horizontally-extending portions of the various material layers. In one embodiment, each memory film 50 may comprise, from outside to inside, an optional dielectric metal oxide blocking dielectric layer 5A, an optional silicon oxide blocking dielectric layer 5B, a memory material layer 54, and an optional tunneling dielectric layer 56.

The optional dielectric metal oxide blocking dielectric layer 5A, if present, comprises a dielectric metal oxide material such as aluminum oxide, titanium oxide, tantalum oxide, or another dielectric metal oxide material. The optional dielectric metal oxide blocking dielectric layer 5A may have a thickness in a range from 1 nm to 10 nm, although lesser and greater thicknesses may also be employed.

The optional silicon oxide blocking dielectric layer 5B, if present, comprises silicon oxide. The optional silicon oxide blocking dielectric layer 5B may have a thickness in a range from 1 nm to 10 nm, although lesser and greater thicknesses may also be employed.

The memory material layer 54 may comprise any memory material that may be employed for the memory material layers 54 of the first exemplary structure, and may have the same thickness range as the memory material layers 54 of the first exemplary structure.

The optional tunneling dielectric layer 56 may comprise any dielectric material that may be employed for the tunneling dielectric layer 56 of the first exemplary structure, and may have the same thickness range as the tunneling dielectric layer 56 of the first exemplary structure.

Each memory film 50 may comprise an outer sidewall having first surface portions that contact the electrically conductive layers 46 and second surface portions that contact the insulating layers 32. The first portions and the second portions of the outer sidewall of each memory film 50 may be vertically coincident among one another, i.e., may be located within a same cylindrical vertical plane. In one embodiment, in each electrically conductive layer 46 within the subset of the electrically conductive layers 46, an entirety of each first surface portion may extend straight along a vertical direction. In one embodiment, each memory film 50 may be contacted by, and is laterally surrounded by, a respective vertical stack of tubular dielectric spacers 51 contacting a respective sidewall of the insulating layers 32.

Figure 41B:
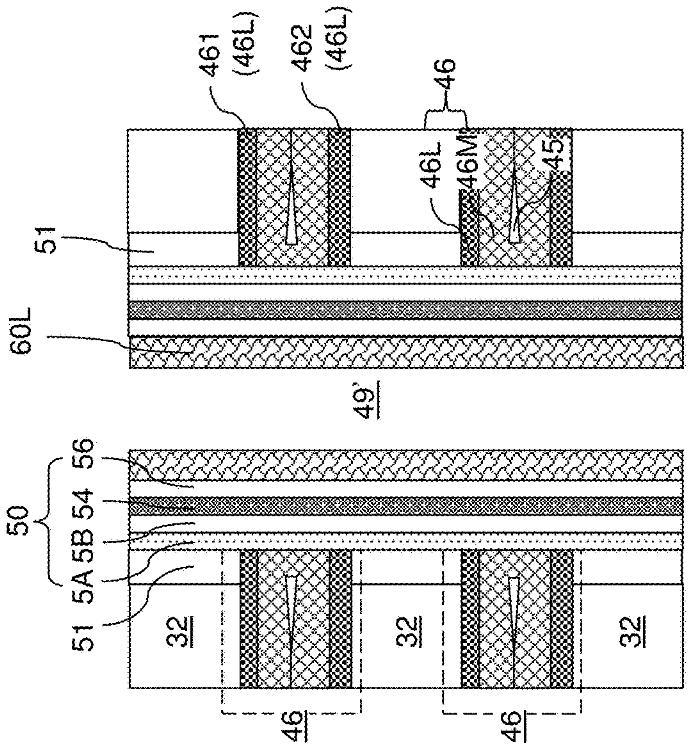
FIG. 41B is a magnified view of a region of the third exemplary structure of FIG. 41A around a memory opening.
Figure 41A:
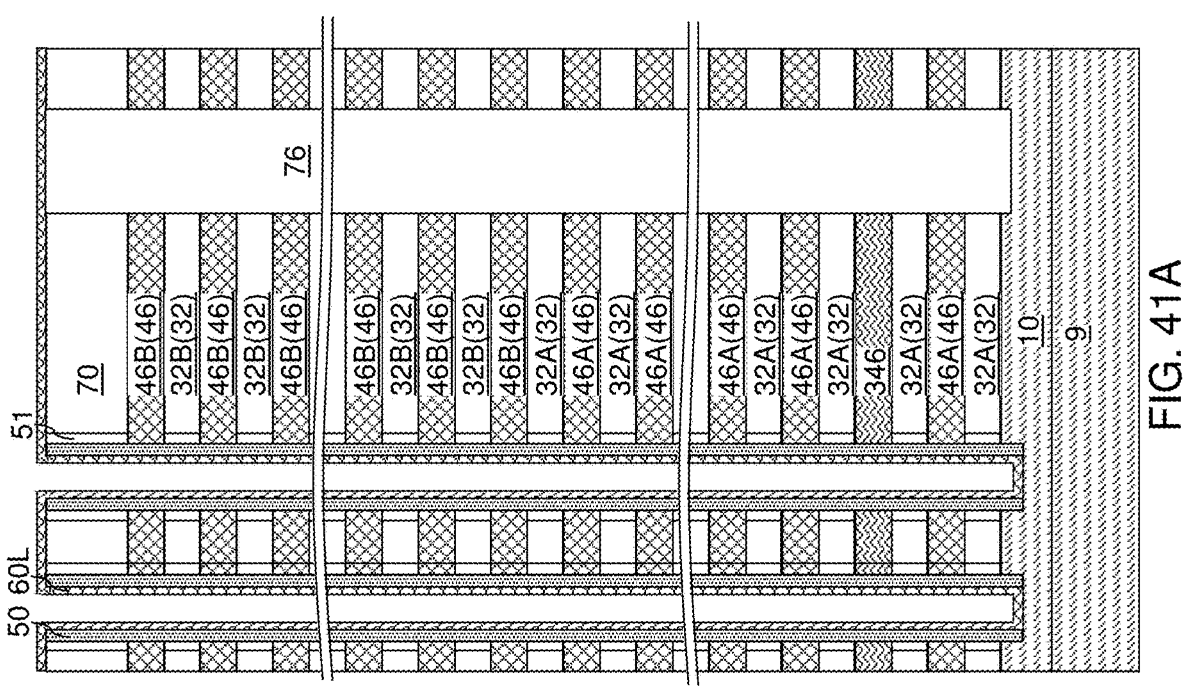
FIG. 41A is a vertical cross-sectional view of the third exemplary structure after formation of a semiconductor channel layer according to an embodiment of the present disclosure.

Referring to FIGS. 41A and 41B, a semiconductor channel layer 60L can be deposited on inner sidewalls of the memory films 50 and on physically exposed surfaces of the semiconductor material layer 10. The semiconductor channel layer 60L includes a semiconductor material, such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can be formed by a conformal deposition method such as low pressure chemical vapor deposition (LPCVD) and have a thickness in a range from 2 nm to 30 nm, although lesser and greater thicknesses can also be employed. In one embodiment, the semiconductor channel layer 60L may have a doping of a first conductivity type, which is the same as the conductivity type of the semiconductor material layer 10.

Figure 42B:
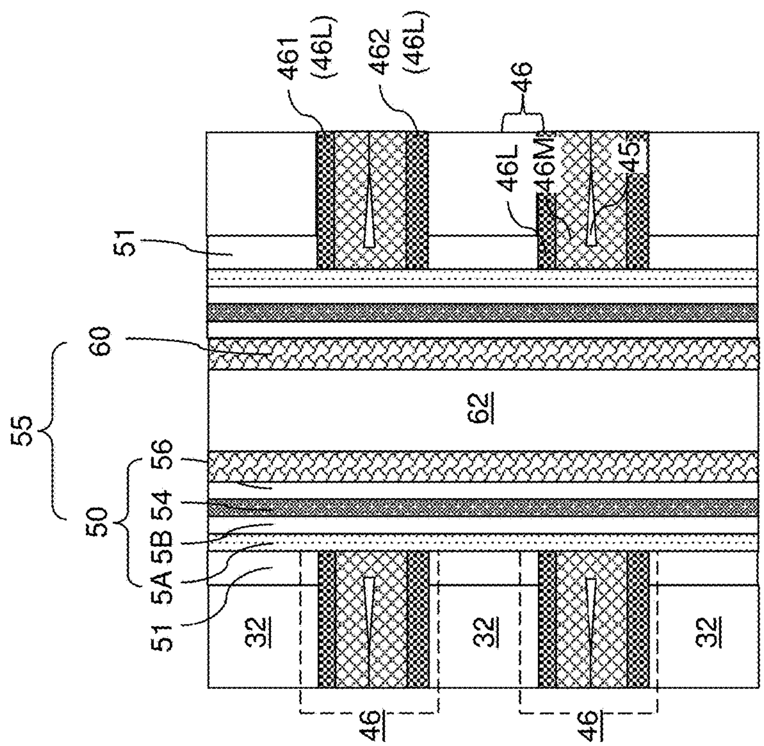
FIG. 42B is a magnified view of a region of the third exemplary structure of FIG. 42A around a memory opening.
Figure 42A:
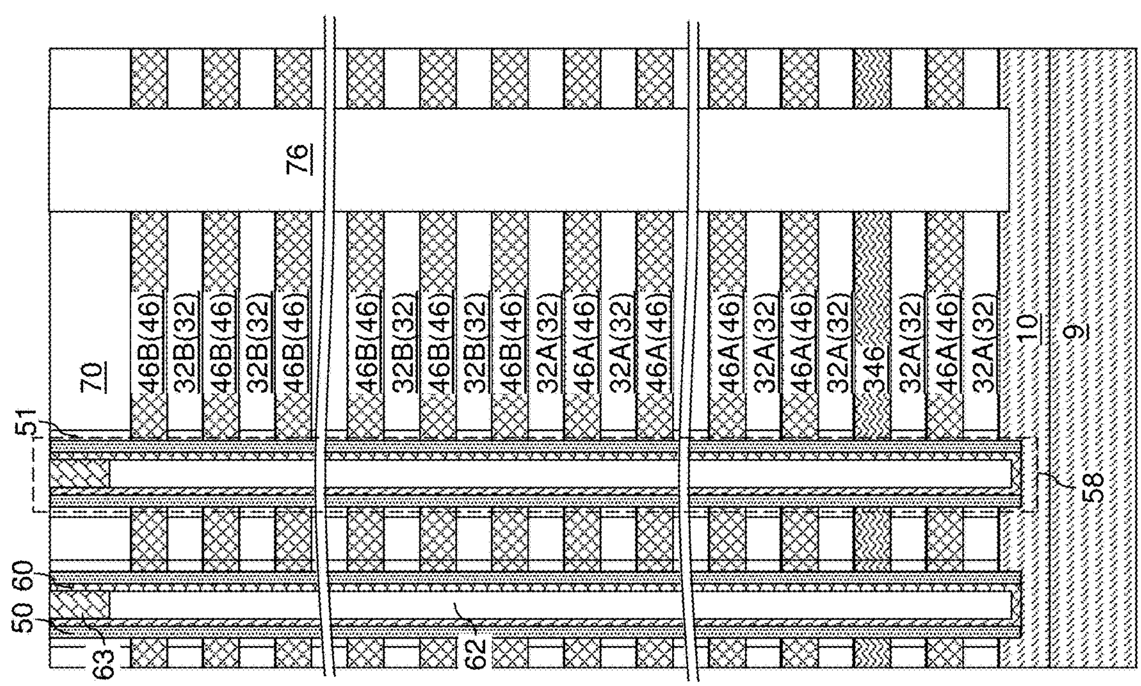
FIG. 42A is a vertical cross-sectional view of the third exemplary structure after formation of memory opening fill structures according to an embodiment of the present disclosure.

Referring to FIGS. 42A and 42B, in case the memory cavities 49' are not completely filled by the semiconductor channel layer 60L, a dielectric fill material such as a doped silicate glass or organosilicate glass can be deposited in remaining volumes of the memory cavities 49'. The dielectric fill material can be deposited by a conformal deposition method such as low pressure chemical vapor deposition (LPCVD), or by a self-planarizing deposition process such as spin coating. The dielectric fill material can be subsequently vertically recessed to form a dielectric core 62 within each memory opening. The top surface of each dielectric core 62 can be formed at, or about, the horizontal plane including the bottom surface of the insulating cap layer 70.

A drain region 63 comprising a semiconductor material a doping of a second conductivity type can be formed above each dielectric core 62. The second conductivity type is the opposite of the first conductivity type. For example, if the first conductivity type is p-type, the second conductivity type is n-type, and vice versa. In this case, a semiconductor material having a doping of the second conductivity type can be deposited in the recesses overlying the dielectric cores 62. The doped semiconductor material can be, for example, doped polysilicon. Portions of the deposited semiconductor material having a doping of the second conductivity type and portions of the semiconductor channel layer 60L that overlie the horizontal plane including the top surface of the insulating cap layer 70 can be removed by a planarization process such as a chemical mechanical polishing process and/or a recess etch process. Each remaining portion of the semiconductor channel layer 60L constitutes a vertical semiconductor channel 60. Each remaining portion of the deposited semiconductor material having a doping of the second conductivity type constitutes a drain region 63. The dopant concentration in the drain regions 63 can be in a range from $5.0\times10^{18}/cm^3$ to $2.0\times10^{21}/cm^3$, although lesser and greater dopant concentrations can also be employed.

Each combination of a memory film 50 and a vertical semiconductor channel 60 constitutes a memory stack structure 55. A contiguous combination of a memory film 50, a vertical semiconductor channel 60, a dielectric core 62, and a drain region 63 in a memory opening 49 constitutes a memory opening fill structure 58. A contiguous combination of a memory film 50, a vertical semiconductor channel 60, a dielectric core 62, and a drain region 63 in a support opening (not illustrated) constitutes a support pillar structure (not illustrated). In one embodiment, each memory film 50 can store electrical charges with a macroscopic retention time. As used herein, a macroscopic retention time refers to a retention time suitable for operation of a memory device as a permanent memory device such as a retention time in excess of 24 hours. Generally, a memory opening fill structure 58 can be formed in a remaining volume of the memory cavity after formation of the vertical stacks of tubular dielectric spacers 51 and anisotropically etching the electrically conductive layers 46.

Figure 43B:
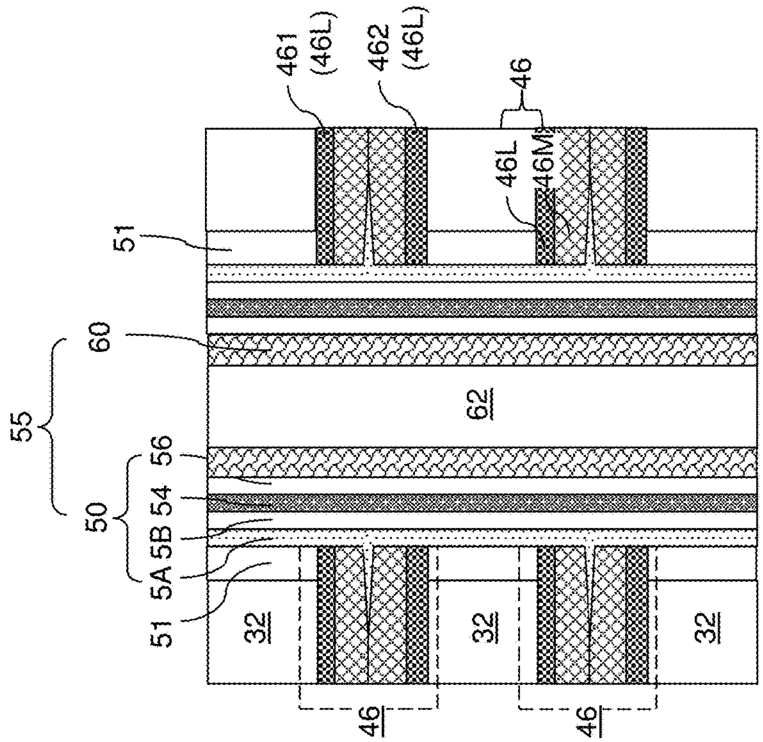
FIG. 43B is a magnified view of a region of the third exemplary structure of FIG. 43A around a memory opening.
Figure 43A:
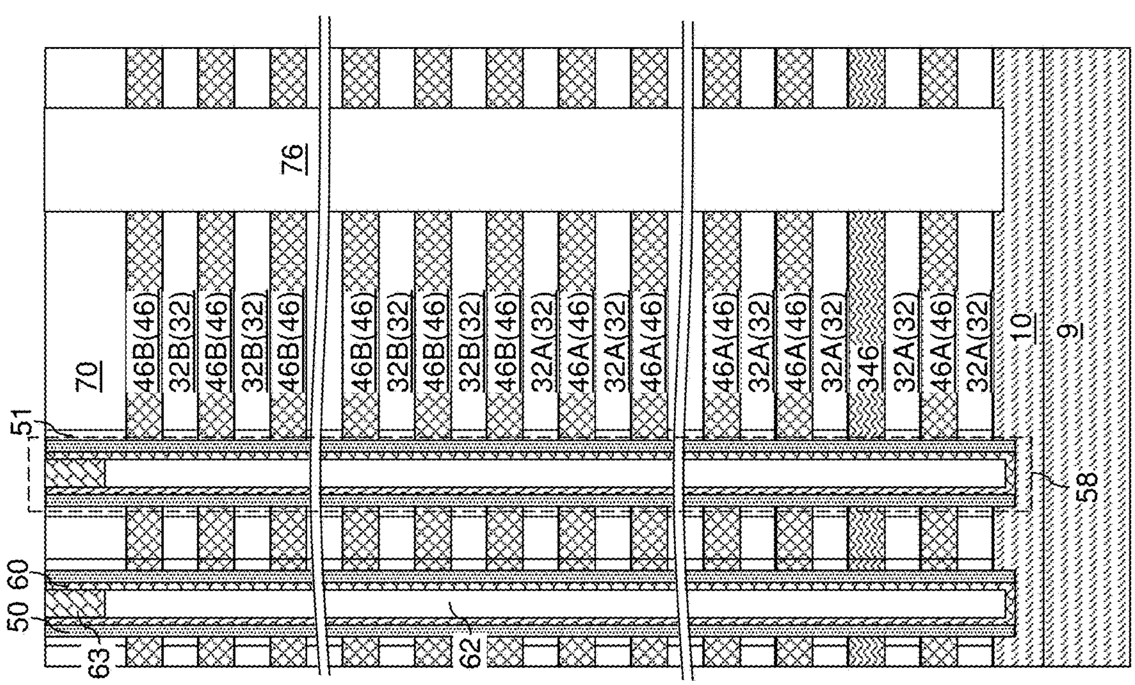
FIG. 43A is a vertical cross-sectional view of an alternative configuration of the third exemplary structure after formation of memory opening fill structures according to an embodiment of the present disclosure.

Referring to FIGS. 43A and 43B, an alternative configuration of the third exemplary structure can be derived from the third exemplary structure of FIG. 39A by increasing a lateral recess distance of the electrically conductive layers 46 such that seams and/or air gaps 45 within the electrically conductive layers 46 have a portion that protrude inward through a cylindrical vertical plane including inner sidewalls of the vertical stacks of the tubular dielectric spacers 51. In this case, the anisotropic etch process that etches portions of the electrically conductive layers 46 that are not masked by the vertical stacks of the tubular dielectric spacers 51 removes portions of the metallic liners 46L and the metallic fill material layers 46M such that the seams and/or air gaps 45 are connected to a respective memory cavity 49'.

Each metallic fill material layer 46M comprises an upper portion and a lower portion that are adjoined to each other at a seam. The upper portion of each metallic fill material layer 46M comprises a physically exposed vertical inner sidewall and a physically exposed tapered bottom surface. The lower portion of each metallic fill material layer 46M comprises a physically exposed vertical inner sidewall and a physically exposed tapered top surface. A gap having a variable height is present between the physically exposed tapered bottom surface of the upper portion of each metallic fill material layer 46M and the physically exposed tapered top surface of the lower portion of each metallic fill material layer 46M. Upon formation of the memory films 50, a portion of a memory film 50 can fill each gap between an upper portion and a lower portion of each electrically conductive layer 46. In one embodiment, a laterally-protruding tapered portion of a dielectric metal oxide blocking dielectric layer 5A may fill a gap between a tapered bottom surface of an upper portion of a metallic fill material layer 46M and a tapered top surface of a lower portion of the metallic fill material layer 46M.

Upon performing the processing steps of FIGS. 40A and 40B, 41A and 41B, and 42A and 42B, the alternative configuration of the third exemplary structure illustrated in FIGS. 43A and 43B can be formed.

In one embodiment, one, a plurality, and/or each, of the electrically conductive layers 46 comprises a seam and/or gap 45 prior to the anisotropic etch process that etches unmasked portions of the electrically conductive layers 46. The seam and/or gap 45 may be connected to the memory cavity 49' after the anisotropic etch process. The memory film 50 may be formed on a seam within the metallic fill material layer 46 of a respective one of the electrically conductive layers 46.

In one embodiment, each electrically conductive layer 46 within a subset of the electrically conducive layers 46 comprises a metallic fill material layer 46M contacting a respective first surface portion of a memory film 50. At least for a first electrically conductive layers 46 among the subset of the electrically conductive layers 46, the first surface portion comprises an upper straight sidewall segment that extends vertically, a lower straight sidewall segment that extends vertically, and a connection surface segment that protrudes outward from a vertical plane including the upper straight sidewall segment and the lower straight sidewall segment. The vertical plane may comprise interfaces between a vertical stack of tubular dielectric spacers 51 and a memory film 50.

In one embodiment, at least for the first electrically conductive layer 46, the connection surface portion has a variable vertical height that decreases with a lateral distance from the vertical plane, and adjoins a seam embedded within the metallic fill material layer 46M. The variable vertical height is a vertical distance between the tapered bottom surface of the upper portion of the metallic fill material layer 46M and the tapered top surface of the lower portion of the metallic fill material layer 46M. In one embodiment, at least for the first electrically conductive layer 46 within the subset of the electrically conductive layers 46, the connection surface portion of the memory film 50 comprises an upper tapered surface contacting a tapered bottom surface of an upper portion of the metallic fill material layer 46M, and a lower tapered surface contacting a tapered upper surface of a lower portion of the metallic fill material layer 46M. In one embodiment, the upper portion and the lower portion of the metallic fill material layer 46M contact each other at the seam.

Referring collectively to FIGS. 35A-43B and related drawings and according to various embodiments of the present disclosure, a three-dimensional memory device is provided, which comprises: an alternating stack of insulating layers 32 and electrically conductive layers 46; a memory opening extending through the alternating stack (32, 46); and a memory opening fill structure 58 located in the memory opening and comprising a vertical semiconductor channel 60 and a memory film 50. Each electrically conductive layer 46 within a subset of the electrically conducive layers 46 comprises: a metallic fill material layer 46M comprising a metal and contacting a first surface portion of the memory film 50; a lower metallic liner 462 contacting a bottom surface of the metallic fill material layer 46M; and an upper metallic liner 461 contacting a top surface of the metallic fill material layer 46M.

In some embodiments, in each electrically conductive layer 46 within the subset of the electrically conductive layers 46, an entirety of the first surface portion extends straight along a vertical direction, as illustrated in FIGS. 42A and 42B.

In some embodiments, the first surface portion of the memory film 50 comprises an upper straight sidewall segment that extends vertically, a lower straight sidewall segment that extends vertically, and a connection surface segment that protrudes outward from a vertical plane including the upper straight sidewall segment and the lower straight sidewall segment, as illustrated in FIG. 43B.

In some embodiments, the vertical stack of tubular dielectric spacers 51 contacts a respective sidewall of the insulating layers 32 and contacts and surrounds the memory film 50. In some embodiments, at least one of each tubular dielectric spacers 51 is in contact with a horizontal annular surface segment of a respective lower metallic liner 462 and the upper metallic liner 461.

In one embodiment, the lower metallic liners 462 and the upper metallic liners 461 of the electrically conductive layers 46 have a same material composition and a same thickness. In one embodiment, the lower metallic liners 462 and the upper metallic liners 461 of the electrically conductive layers 46 comprises a conductive metallic nitride material; and the metallic fill material layers 46M of the electrically conductive layers 46 consist essentially of a metal.

Figure 44B:
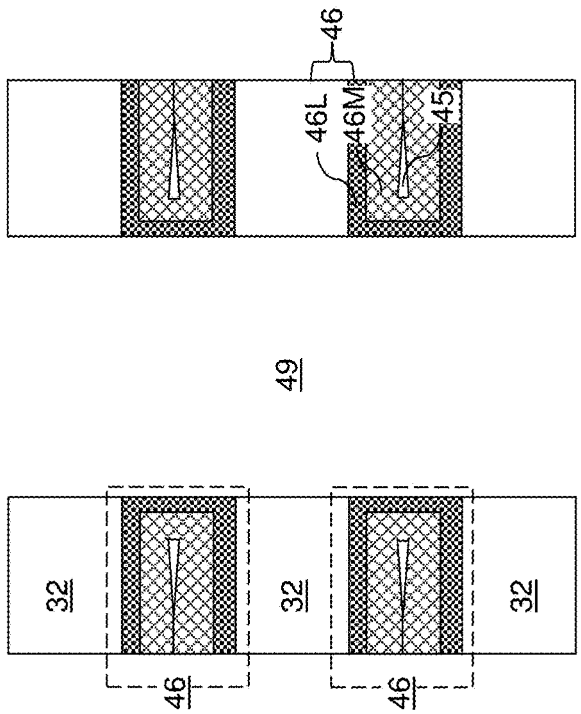
FIG. 44B is a magnified view of a region of the fourth exemplary structure of FIG. 44A around a memory opening.
Figure 44A:
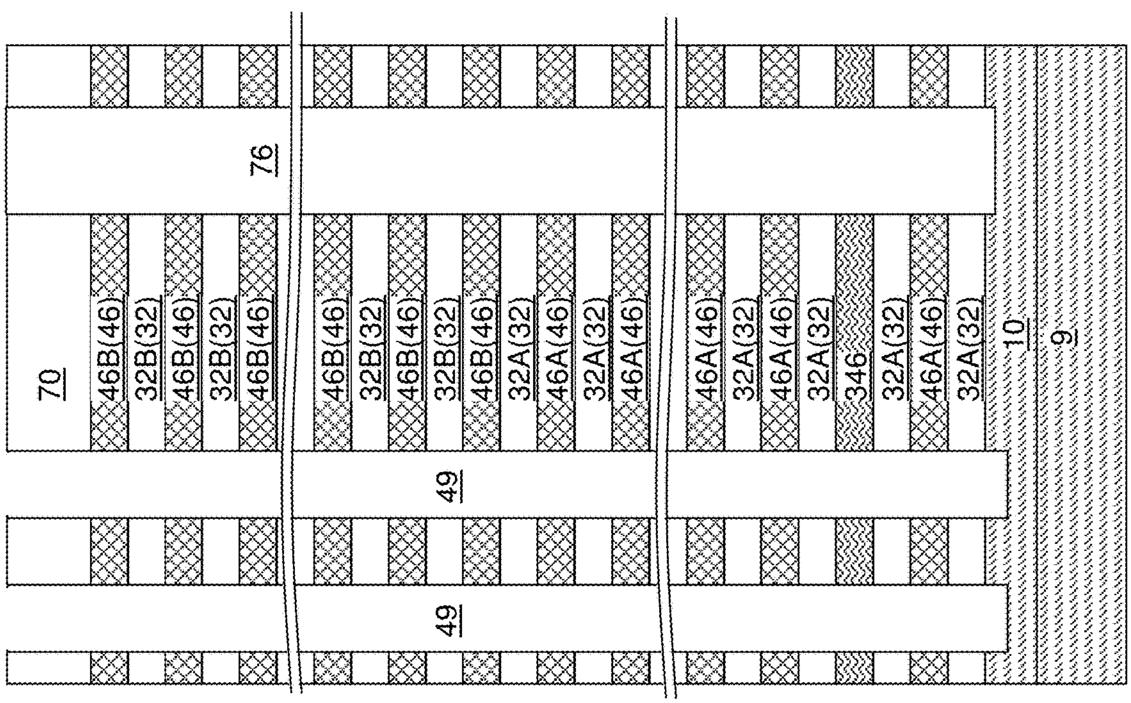
FIG. 44A is a vertical cross-sectional view of a fourth exemplary structure after removal of sacrificial memory opening fill structures according to an embodiment of the present disclosure.

Referring to FIGS. 44A and 44B, a fourth exemplary structure according to an embodiment of the present disclosure is illustrated, which may be the same as the third exemplary structure illustrated in FIGS. 38A and 38B. In one embodiment, each of the electrically conductive layers 46 comprises a metallic liner 46L. Each metallic liner 46L may comprise an upper horizontally-extending portion, a lower horizontally-extending portion, and a vertically-extending portion connecting the upper horizontally-extending portion and the lower horizontally-extending portion.

Figure 45B:
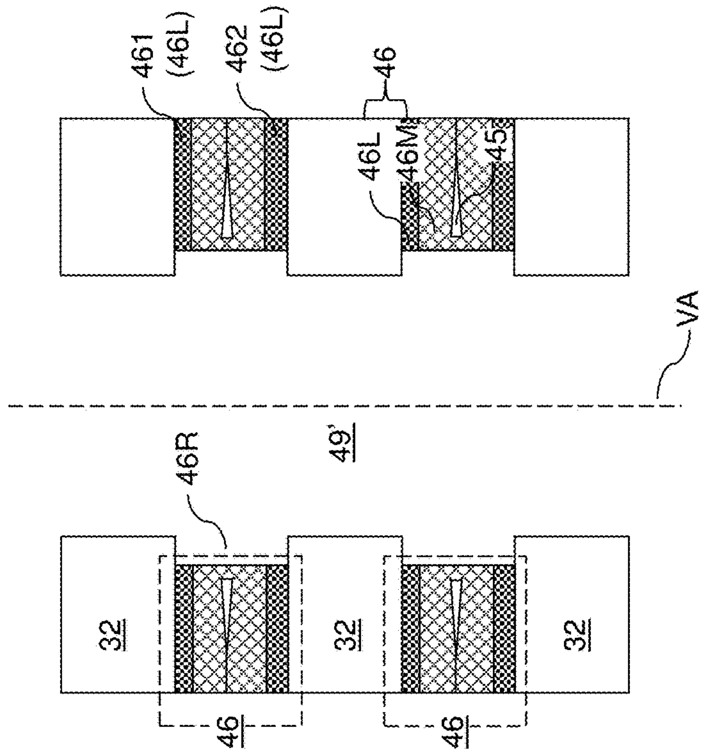
FIG. 45B is a magnified view of a region of the fourth exemplary structure of FIG. 44A around a memory opening.
Figure 45A:
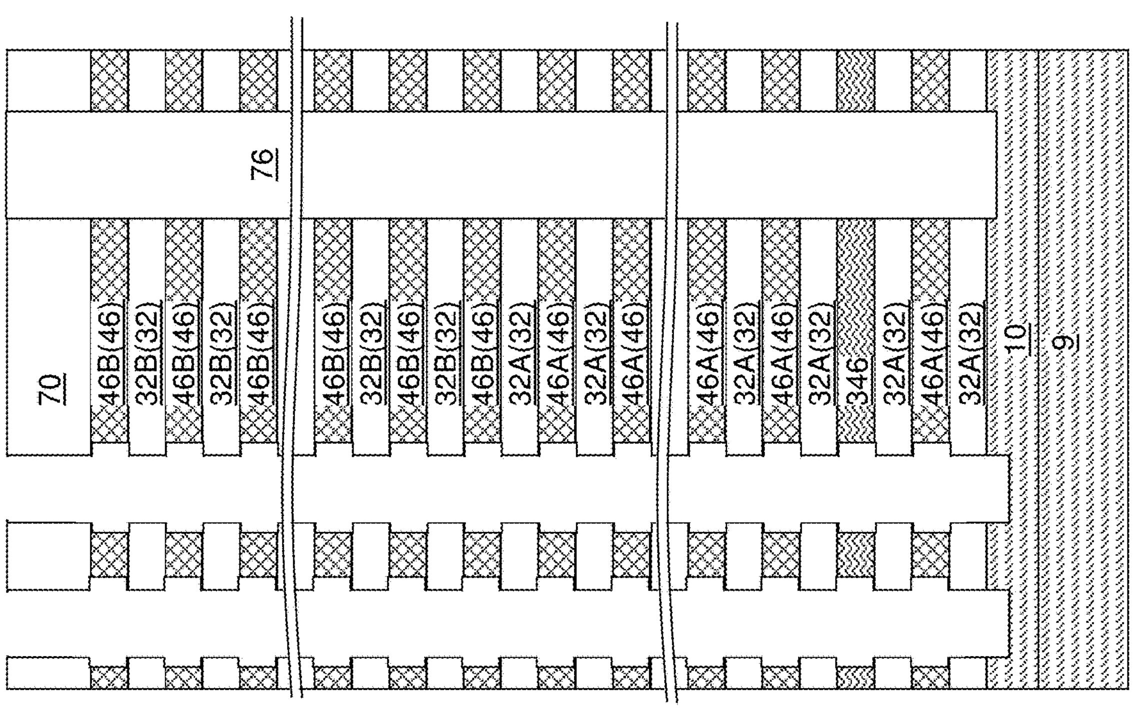
FIG. 45A is a vertical cross-sectional view of a fourth exemplary structure after laterally recessing electrically conductive layers according to an embodiment of the present disclosure.

Referring to FIGS. 45A and 45B, a selective isotropic etch process can be performed to laterally recess electrically conductive layers 46 selective to the insulating layer 32 around each memory cavity 49'. In one embodiment, the selective isotropic etch process may comprise a wet etch process or a chemical dry etch process that isotropically etches materials of the metallic liners 46L and the metallic fill material layers 46M selective to the material of the insulating layers 32. Lateral recesses 46R are formed at the levels of the electrically conductive layers 46 surrounding the memory opening 46.

In one embodiment, the lateral recess 46 width (in the horizontal direction) can be greater than the thickness of each metallic liner 46L. The vertically-extending portion of each metallic liner 46L can be etched by the selective isotropic etch process. In this case, each metallic liner 46L can be divided into a respective upper metallic liner 461 and a respective lower metallic liner 462. The upper metallic liner 461 comprises an upper horizontally-extending portion of a metallic liner 46L as provided at the processing steps of FIGS. 44A and 44B, and the lower metallic liner 462 comprises a lower horizontally-extending portion of the metallic liner 46L as provided at the processing steps of FIGS. 44A and 44B. A sidewall of each metallic fill material layer 46M can be physically exposed after the selective isotropic etch process.

In one embodiment, each electrically conductive layer 46 within a subset of the electrically conducive layers 46 comprises a metallic fill material layer 46M comprising a metal, a lower metallic liner 462 comprising a first portion of a metallic liner material and contacting a bottom surface of the metallic fill material layer 46M, and an upper metallic liner 461 comprising a second portion of the metallic liner material and contacting a top surface of the metallic fill material layer 46M. In one embodiment, the metallic fill material layer 46M, the lower metallic liner 462, and the upper metallic liner 461 are equidistant from a vertical axis VA passing through a geometrical center of the memory cavity 49', which coincides with the geometrical center of the memory opening. As used herein, a geometrical center of an element refers to the center of gravity of a hypothetical object occupying the same volume as the element and having a uniform density throughout. In one embodiment, the metallic fill material layer 46M, the lower metallic liner 462, and the upper metallic liner 461 can be more distal (by the width of the lateral recess 46R) from the vertical axis VA than the insulating layers 32 are from the vertical axis VA. In other words, the metallic fill material layer 46M, the lower metallic line 462, and the upper metallic liner 461 are more distal than the insulating layers 32 from a vertical axis VA passing through a geometrical center of the memory opening fill structure 58.

In one embodiment, in each electrically conductive layer 46, the lower metallic liner 461 comprises a first portion of a metallic liner material that is located entirely below a bottom surface of the metallic fill material layer 46M, and the upper metallic liner 461 comprises a second portion of the metallic liner material that is located entirely above a top surface of the metallic fill material layer 46M. In one embodiment, in each electrically conductive layer 46, each top periphery of the metallic fill material layer 46M coincides with a bottom periphery of the upper metallic liner 461 and each bottom periphery of the metallic fill material layer 46M coincides with a top periphery of the lower metallic liner 462.

In one embodiment, the lower metallic liners 462 and the upper metallic liners 461 of the electrically conductive layers 46 have a same material composition and a same thickness. In one embodiment, the lower metallic liners 462 and the upper metallic liners 461 of the electrically conductive layers 46 comprises a conductive metallic nitride material, and the metallic fill material layers 46M of the electrically conductive layers 46 consist essentially of a metal.

Figure 46B:
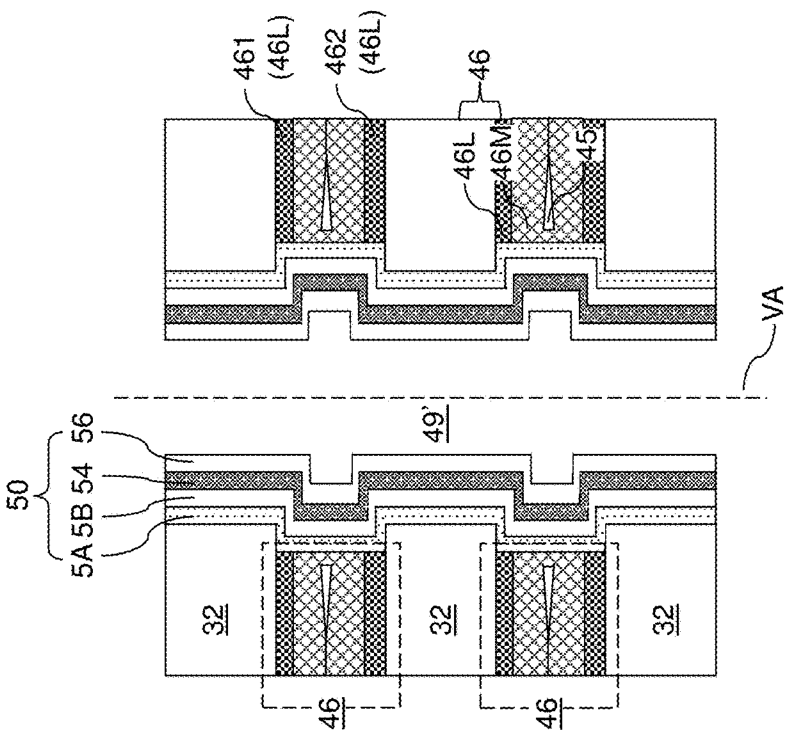
FIG. 46B is a magnified view of a region of the fourth exemplary structure of FIG. 46A around a memory opening.
Figure 46A:
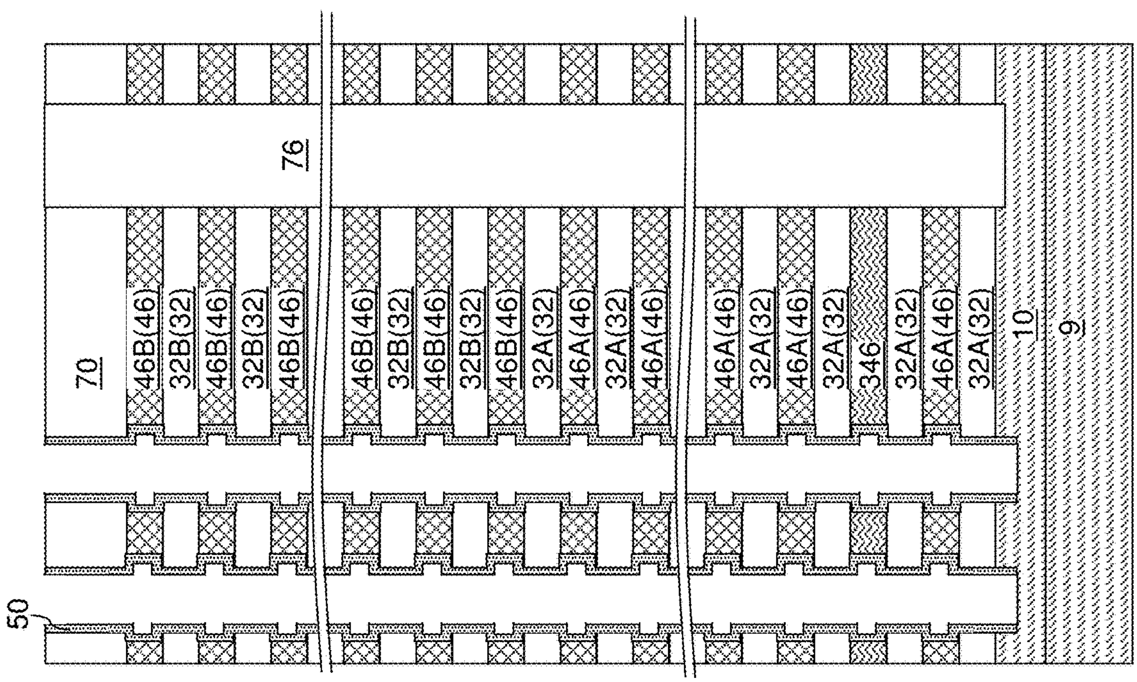
FIG. 46A is a vertical cross-sectional view of a fourth exemplary structure after formation of memory films according to an embodiment of the present disclosure.

Referring to FIGS. 46A and 46B, the processing steps of FIGS. 41A and 41B can be performed to form a memory film 50 within each memory cavity 49'. In one embodiment, each memory film 50 may comprise, from outside to inside, an optional dielectric metal oxide blocking dielectric layer 5A, an optional silicon oxide blocking dielectric layer 5B, a memory material layer 54, and an optional tunneling dielectric layer 56.

Each memory film 50 may comprise an outer sidewall having a laterally undulating vertical cross-sectional profile. The outer sidewall of each memory film 50 may comprise first vertical portions extending into the lateral recesses 46R and contacting cylindrical sidewalls of the electrically conductive layers 46, second vertical portions contacting cylindrical sidewalls of the insulating layers 32, and horizontal annular surface segments contacting a horizontal annular surface of a respective insulating layer 32. The first portions and the second portions of the outer sidewall of each memory film 50 are laterally offset by the width of the lateral recesses 46R. Specifically, the first portions of the outer sidewall of each memory film 50 are more distal from the vertical axis VA passing through the geometrical center of the memory opening that includes the memory film 50 than the second portions of the outer sidewall of each memory film 50 are from the vertical axis VA.

In one embodiment, in each electrically conductive layer 46, the metallic fill material layer 46M contacts a first surface portion of the memory film 50. In one embodiment, an entirety of the first surface portion of the memory film 50 extends straight along a vertical direction. In one embodiment, each of the insulating layers 32 comprises a horizontal surface that contacts a respective annular horizontal surface segment of the memory film 50.

Figure 47B:
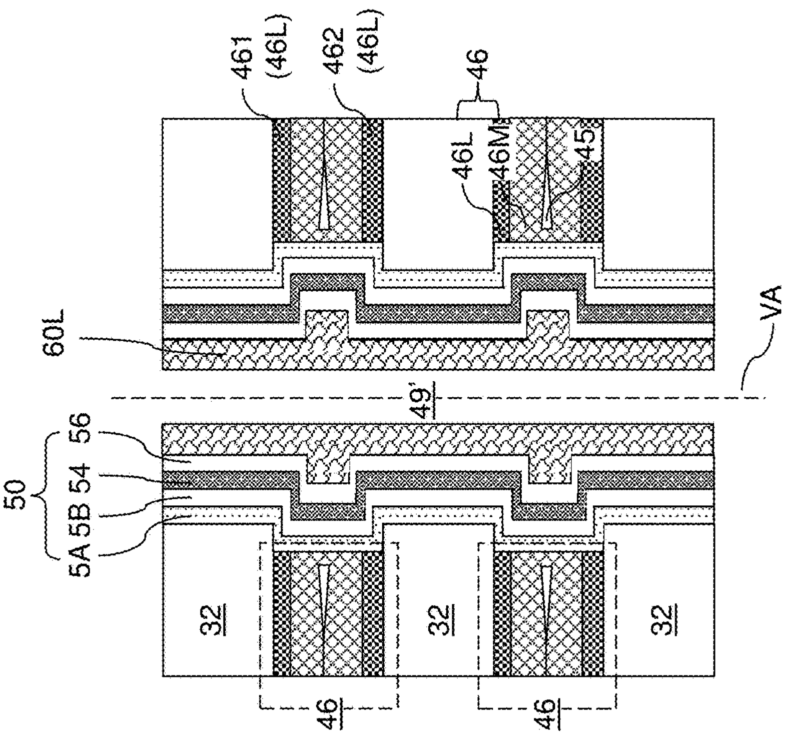
FIG. 47B is a magnified view of a region of the fourth exemplary structure of FIG. 47A around a memory opening.
Figure 47A:
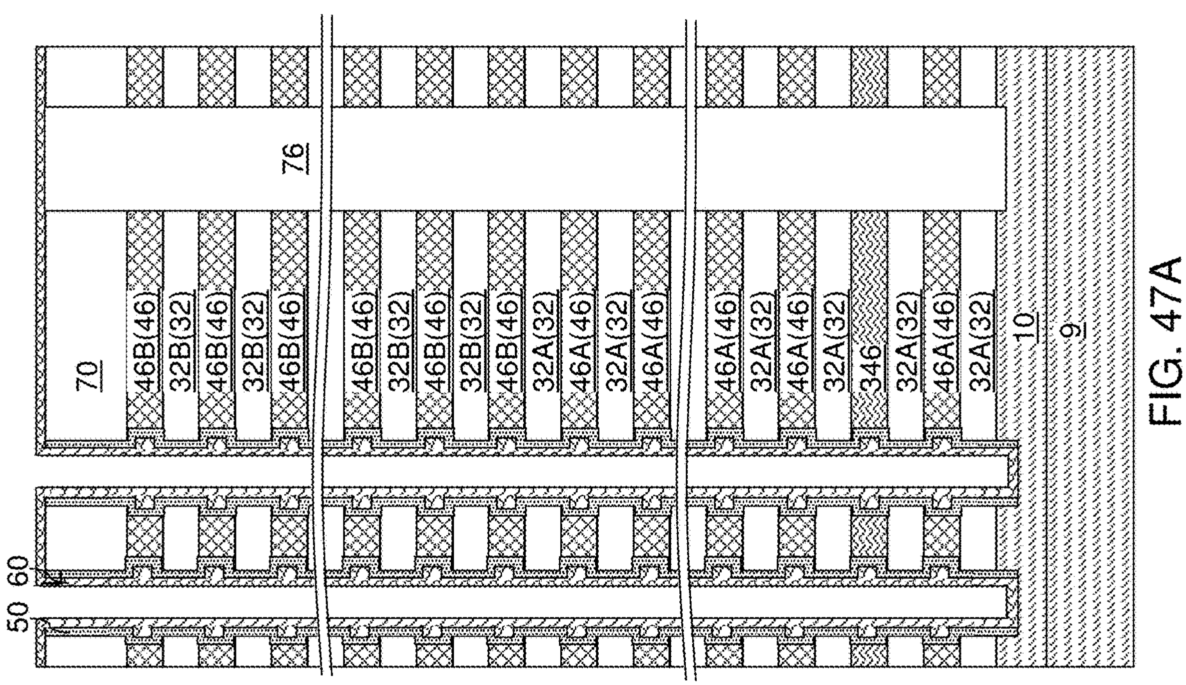
FIG. 47A is a vertical cross-sectional view of the fourth exemplary structure after formation of a semiconductor channel layer according to an embodiment of the present disclosure.

Referring to FIGS. 47A and 47B, the processing steps of FIGS. 42A and 42B can be performed to form a semiconductor channel layer 60L.

Figure 48B:
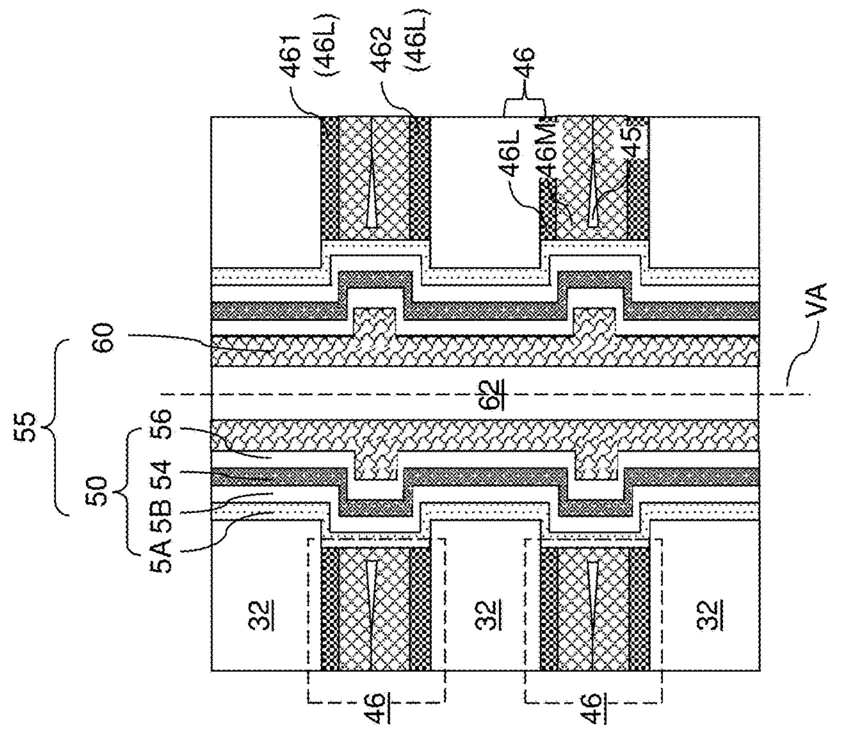
FIG. 48B is a magnified view of a region of the fourth exemplary structure of FIG. 48A around a memory opening.
Figure 48A:
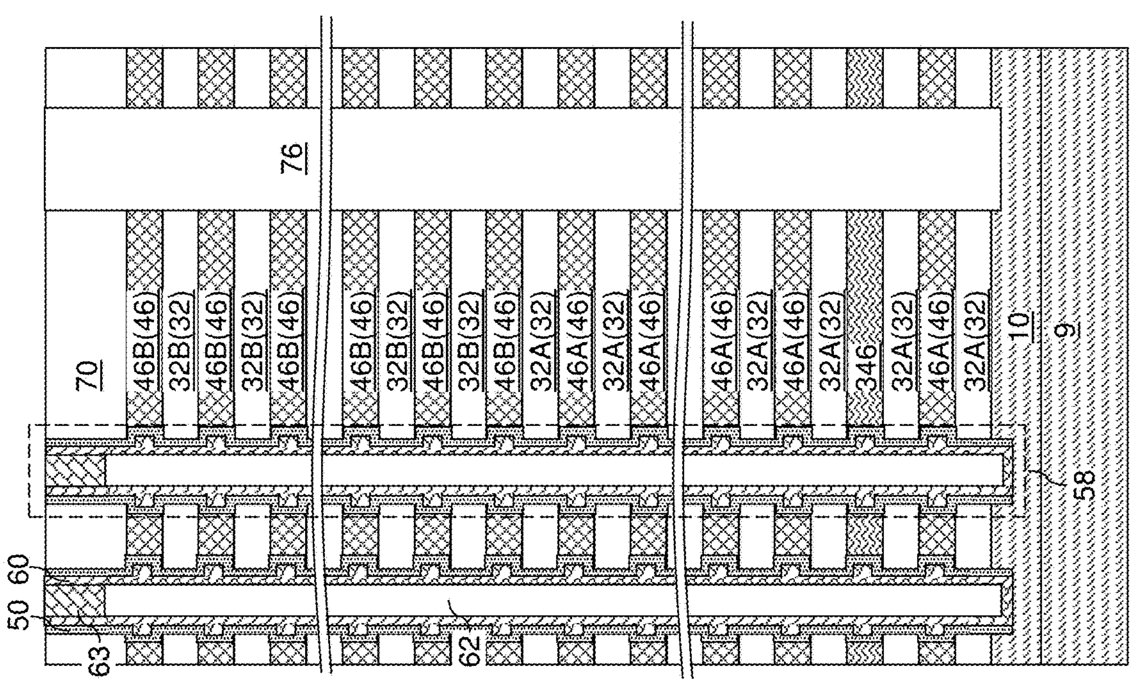
FIG. 48A is a vertical cross-sectional view of the fourth exemplary structure after formation of memory opening fill structures according to an embodiment of the present disclosure.

Referring to FIGS. 48A and 48B, the processing steps of FIGS. 43A and 43B can be performed to form dielectric cores 62, vertical semiconductor channels 60, and drain regions 63. Generally, a memory opening fill structure 58 can be formed in each memory cavity 49'. Each memory opening fill structure 58 comprises a memory film 50 and a vertical semiconductor channel 60. In one embodiment, the memory film 50 lateral protrudes outward farther from a vertical axis VA passing through a geometrical center of the memory opening fill structure 58 at interfaces with remaining portions of the electrically conductive layers 46 than at interfaces with the insulating layers 32.

Figure 49B:
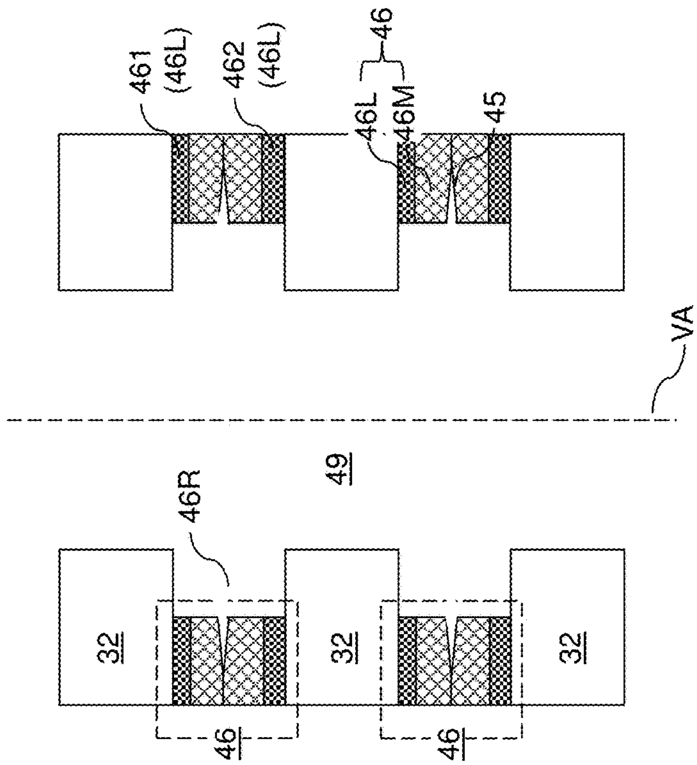
FIG. 49B is a magnified view of a region of the fifth exemplary structure of FIG. 49A around a memory opening.
Figure 49A:
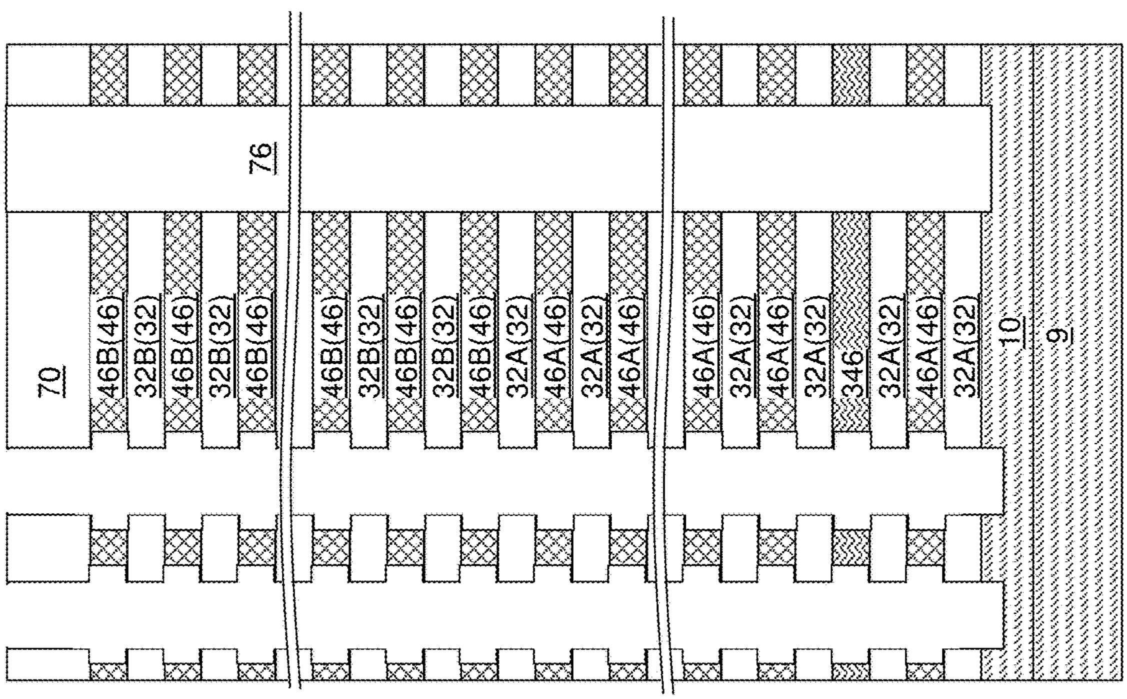
FIG. 49A is a vertical cross-sectional view of a fifth exemplary structure after laterally recessing electrically conductive layers according to an embodiment of the present disclosure.

Referring to FIGS. 49A and 49B, a fifth exemplary structure according to an embodiment of the present disclosure can be derived from the fourth exemplary structure illustrated in FIGS. 45A and 45B by increasing the lateral recess distance of the selective isotropic etch process to form wider lateral recesses 46R. Specifically, the duration of the selective isotropic etch process can be extended and/or the etch chemistry of the selective isotropic etch process can be modified so that portions of the metallic fill material layers 46M are etched and the seams and/or air gaps 45 within the metallic fill material layers 46M are adjoined to the volume of the memory cavity 49' within each memory opening.

Each metallic fill material layer 46M comprises an upper portion and a lower portion that are adjoined to each other at the seam 45. The upper portion of each metallic fill material layer 46M comprises a physically exposed vertical inner sidewall and a physically exposed tapered bottom surface. The lower portion of each metallic fill material layer 46M comprises a physically exposed vertical inner sidewall and a physically exposed tapered top surface. A gap having a variable height is present between the physically exposed tapered bottom surface of the upper portion of each metallic fill material layer 46M and the physically exposed tapered top surface of the lower portion of each metallic fill material layer 46M. An edge of each seam 45 between an upper portion of a lower portion of each metallic fill material layer 46M can be physically exposed to a respective memory cavity 49'.

Figure 50B:
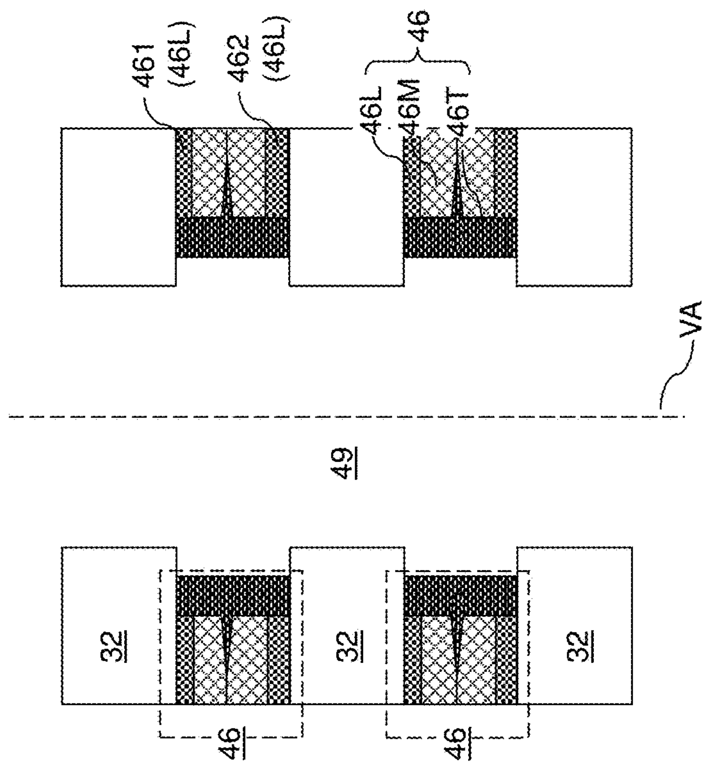
FIG. 50B is a magnified view of a region of the fifth exemplary structure of FIG. 50A around a memory opening.
Figure 50A:
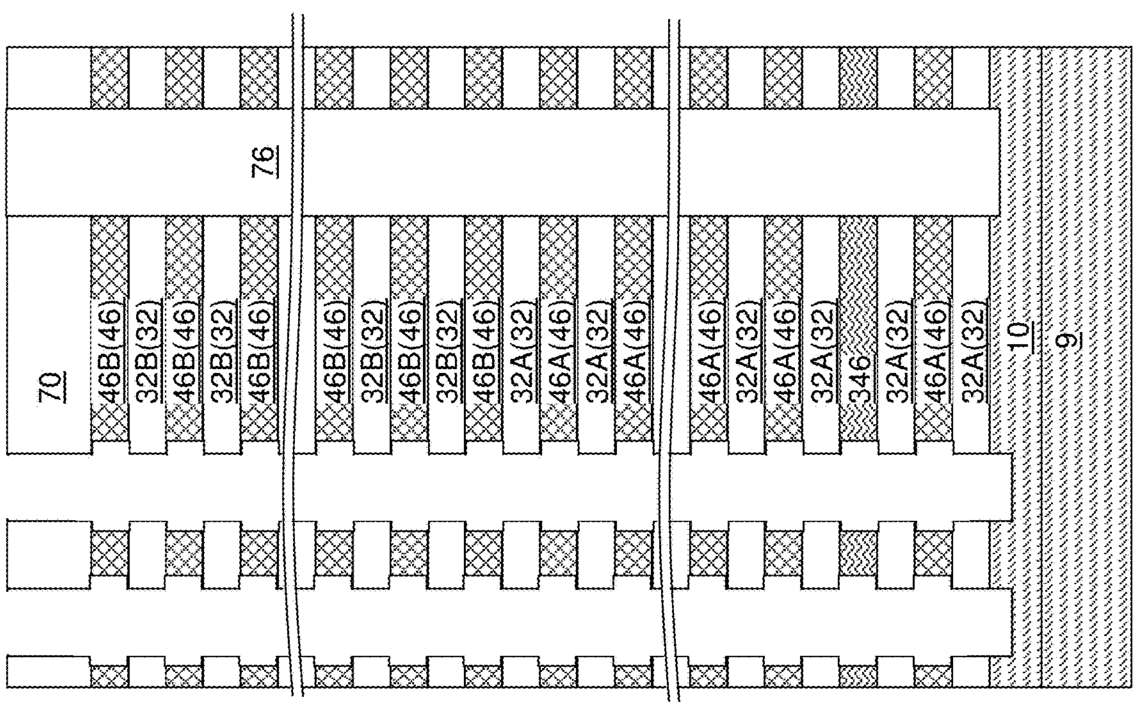
FIG. 50A is a vertical cross-sectional view of the fifth exemplary structure after formation of first tubular metal structures according to an embodiment of the present disclosure.

Referring to FIGS. 50A and 50B, a first selective metal deposition process can be performed to grow a first metal from physically exposed sidewalls of the electrically conductive layers 46 while suppressing growth of the first metal from surfaces of the insulating layers 32, The first selective metal deposition process may comprise any selective metal deposition process that can selectively grow a metal from electrically conductive surfaces while suppressing growth of the metal from dielectric surfaces. The first metal may comprise, and/or may consist essentially of, tungsten, molybdenum, cobalt, ruthenium, or any other metal that may be deposited by a selective metal deposition process while suppressing deposition of the metal from the dielectric surfaces of the insulating layers 32. The first metal may be the same as, or may be different from, the metal of the metallic fill material layers 46M. First tubular metal structures 46T comprising the first metal are formed on the sidewalls of the electrically conductive layers 46, and are incorporated into the electrically conductive layers 46. The first tubular metal structures 46T may grow from the sidewalls of the metallic liners 46L and the metallic fill material layers 46M.

Each first tubular metal structure 46T can have a tubular configuration, i.e., can have a cylindrical opening therethrough. Specifically, each first tubular metal structure 46T can have a vertical or substantially vertical cylindrical inner sidewall, an annular top surface, an annular bottom surface, and a contoured outer sidewall. A laterally-protruding tapered portion of a first tubular metal structure 46T can fill a gap between an upper portion and a lower portion of a respective electrically conductive layer 46. In one embodiment, a laterally-protruding tapered portion of a first tubular metal structure 46T may protrude into the seam and/or air gap 45 and thus fill a gap between a tapered bottom surface of an upper portion of a metallic fill material layer 46M and a tapered top surface of a lower portion of the metallic fill material layer 46M.

In one embodiment, each electrically conductive layer 46 comprises a metallic fill material layer 46M comprising a metal, a lower metallic liner 462 comprising a first portion of a metallic liner material and contacting a bottom surface of the metallic fill material layer 46M, and an upper metallic liner 461 comprising a second portion of the metallic liner material and contacting a top surface of the metallic fill material layer 46M. In one embodiment, each electrically conductive layer 46 further comprises a first tubular metal structure 46T in contact with a cylindrical sidewall of the upper metallic liner 461, in contact with a cylindrical sidewall of the lower metallic liner 462, and in contact with the metallic fill material layer 46M. The thickness of each first tubular metal structure 46T, as measured between an interface with a vertical surface of a metallic fill material layer 46M and an inner sidewall of the first tubular metal structure 46T, may be in a range from 1 nm to 30 nm, such as from 2 nm to 15 nm, although lesser and greater thicknesses may also be employed.

In one embodiment, an interface between the first tubular metal structure 46T and the metallic fill material layer 46M comprises a first cylindrical interface segment having a top periphery that coincides with a bottom periphery of the upper metallic liner 461, a second cylindrical interface segment having a bottom periphery that coincides with a top periphery of the lower metallic liner 462, an upper tapered interface segment adjoined to a bottom end of the first cylindrical interface segment and coinciding with a tapered bottom surface of an upper portion of the metallic fill material layer 46M overlying the seam 45, and a lower tapered interface segment adjoined to a top end of the second cylindrical interface segment and adjoined to the upper tapered interface segment and coinciding with a tapered top surface of a lower portion of the metallic fill material layer 46M underlying the seam 45. In one embodiment, in each electrically conductive layer 46, the metallic fill material layer 46M comprises the seam 45 therein, and the upper tapered interface segment and the lower tapered interface segment are adjoined to an edge of the seam 45. Furthermore, the tapered segments of the first tubular metal structure 46T at least partially fill in the seam or air gap 45, which improves the conductivity of the electrically conductive layers 46 (e.g., word lines).

Figure 51B:
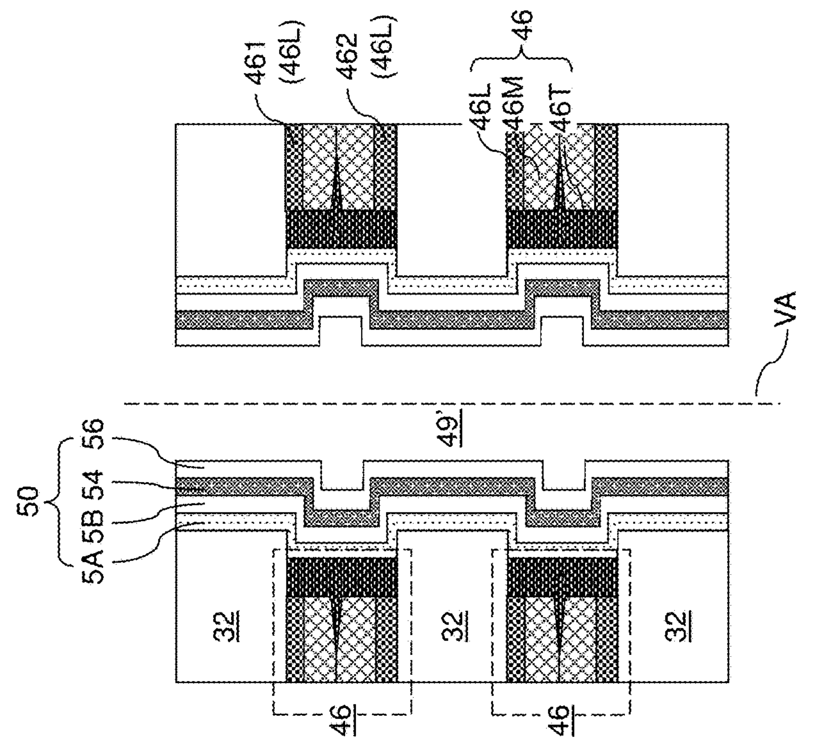
FIGS. 51B and 51C are magnified views of alternative configurations of a region of the fifth exemplary structure of FIG. 51A around a memory opening.
Figure 51A:
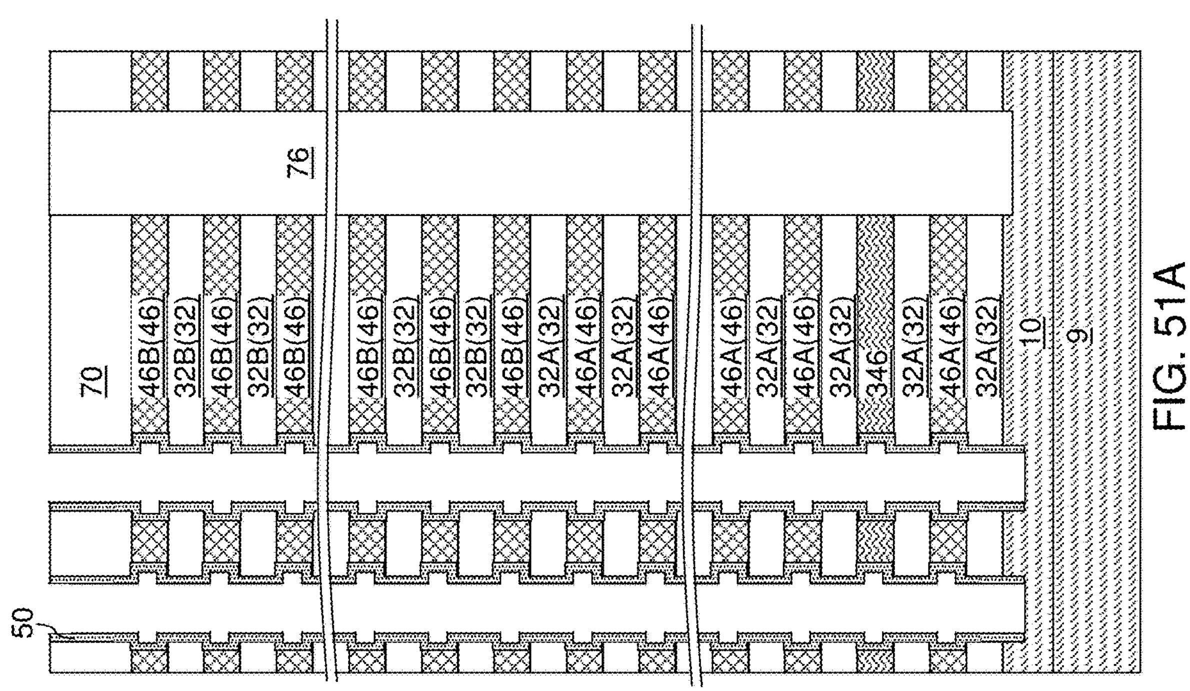
FIG. 51A is a vertical cross-sectional view of the fifth exemplary structure after formation of memory films according to an embodiment of the present disclosure.

Referring to FIGS. 51A and 51B, the processing steps of FIGS. 41A and 41B can be performed to form a memory film 50 within each memory cavity 49'. In one embodiment, each memory film 50 may comprise, from outside to inside, an optional dielectric metal oxide blocking dielectric layer 5A, an optional silicon oxide blocking dielectric layer 5B, a memory material layer 54, and an optional tunneling dielectric layer 56.

Figure 51C:
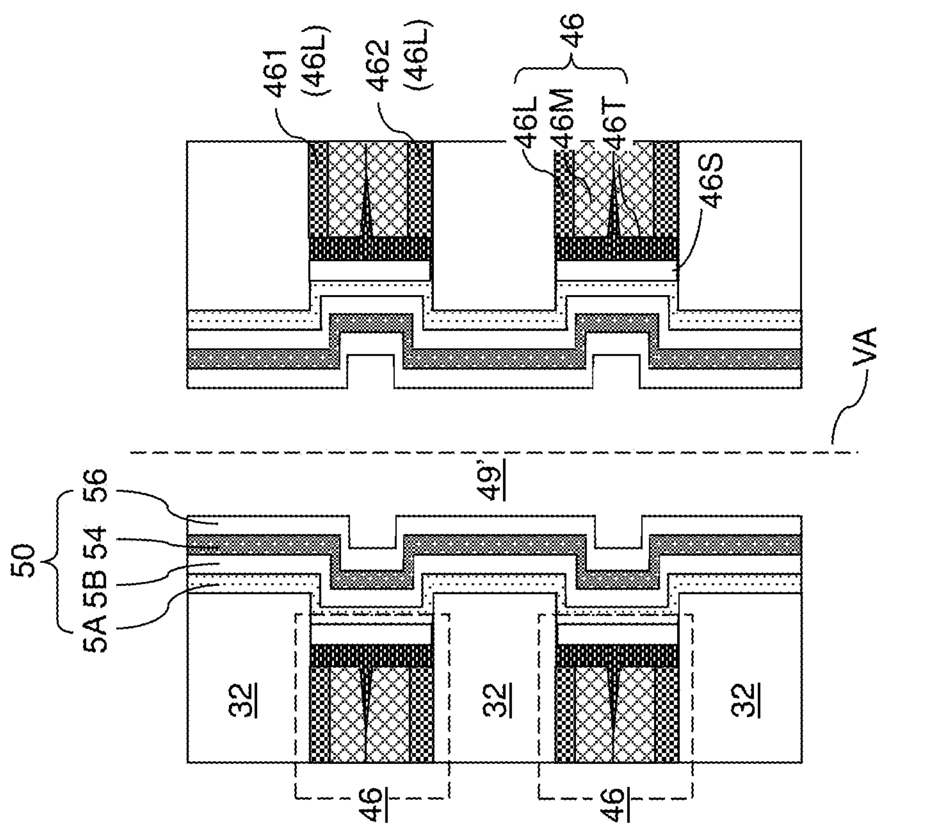

If the metal of the first tubular metal structure 46T comprises an oxidizable metal, such as ruthenium, then the surface portion of the first tubular metal structure 46T contacting the dielectric metal oxide blocking dielectric layer 5A may be oxidized during the deposition of the dielectric metal oxide blocking dielectric layer 5A. For example, a tubular metal oxide structure 46S may be formed at the interface between the first tubular metal structure 46T and the dielectric metal oxide blocking dielectric layer 5A, as shown in FIG. 51C. For example, the tubular metal oxide structure 46S may comprise an electrically conductive metal oxide material, such as ruthenium oxide, which does not significantly reduce word line conductivity. Thus, the first tubular metal structure 46T prevents oxidation of the metallic liners 46L and their conversion to an insulating material (e.g., conversion of conductive TiN liners to insulating titanium oxide or oxynitride liners). This avoids an undesired reduction in word line conductivity.

Each memory film 50 may comprise an outer sidewall having a laterally undulating vertical cross-sectional profile. The outer sidewall of each memory film 50 may comprise first portions contacting the first tubular metal structures 46T, second portions contacting cylindrical sidewalls of the insulating layers 32, and horizontal annular surface segments contacting a horizontal annular surface of a respective insulating layer 32. The first portions and the second portions of the outer sidewall of each memory film 50 are laterally offset. Specifically, the first portions of the outer sidewall of each memory film 50 are more distal from the vertical axis VA passing through the geometrical center of the memory opening that includes the memory film 50 than the second portions of the outer sidewall of each memory film 50 are from the vertical axis VA. In one embodiment, in each electrically conductive layer 46.

In one embodiment, in each electrically conductive layer 46, the first tubular metal structure 46T contacts a first surface portion of the memory film 50. In one embodiment, an entirety of the first surface portion extends straight along a vertical direction. In one embodiment, each of the insulating layers 32 comprises a horizontal surface that contacts a respective annular horizontal surface segment of the memory film 50. In one embodiment, the memory film 50 comprises a dielectric metal oxide blocking dielectric layer 5A. Direct contact between the seam 45 and the dielectric metal oxide blocking dielectric layer 5A can be avoided by the presence of the first tubular metal structures 46T and/or the tubular metal oxide structures 46S. The memory film 50 can be formed on inner sidewalls of the first tubular metal structures 46T or the tubular metal oxide structures 46S the around each memory cavity 49'. In one embodiment, each first tubular metal structure 46T or the tubular metal oxide structure 46S can be in direct contact with a first surface portion of the memory film 50.

Figure 52B:
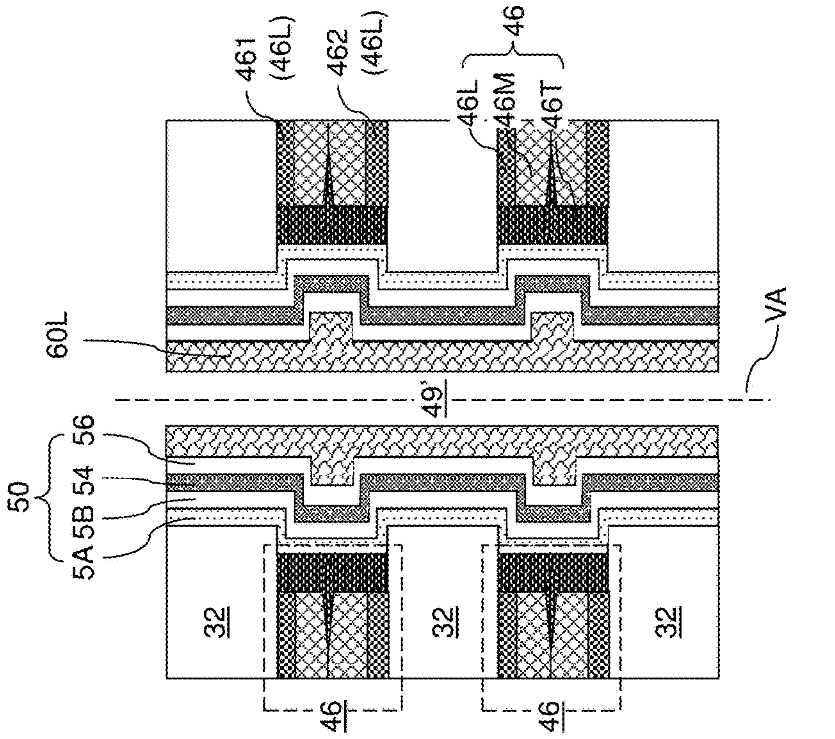
FIG. 52B is a magnified view of a region of the fifth exemplary structure of FIG. 52A around a memory opening.
Figure 52A:
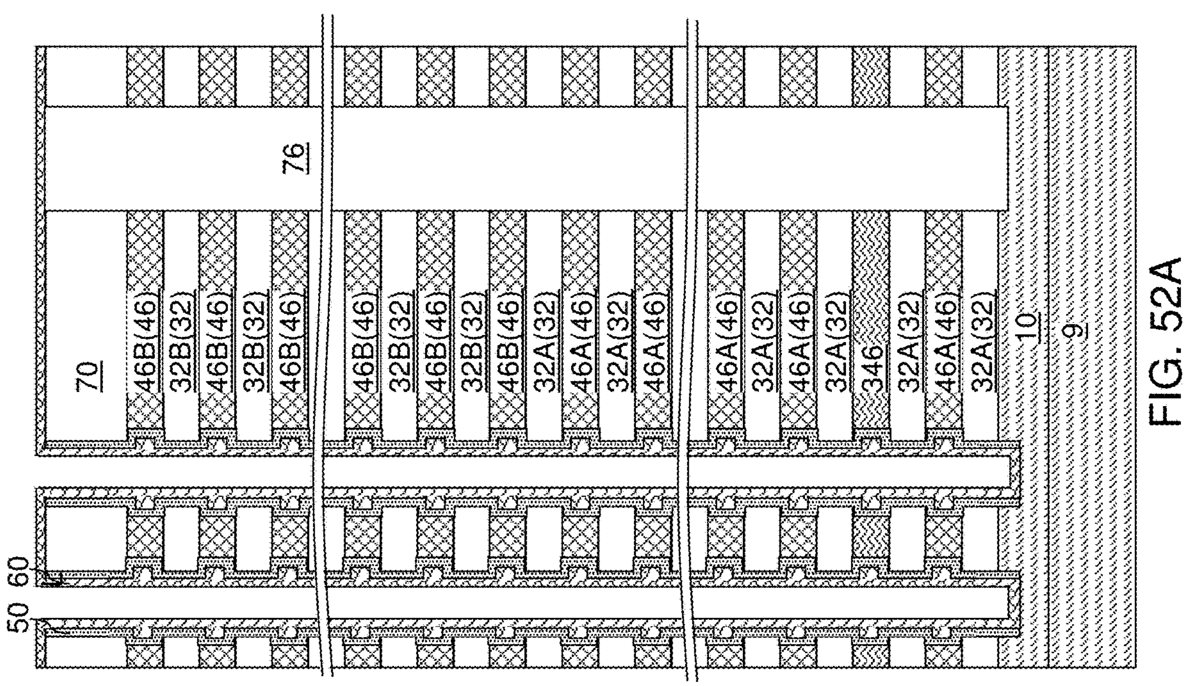
FIG. 52A is a vertical cross-sectional view of the fifth exemplary structure after formation of a semiconductor channel layer according to an embodiment of the present disclosure.

Referring to FIGS. 52A and 52B, the processing steps of FIGS. 42A and 42B can be performed to form a semiconductor channel layer 60L.

Figure 53B:
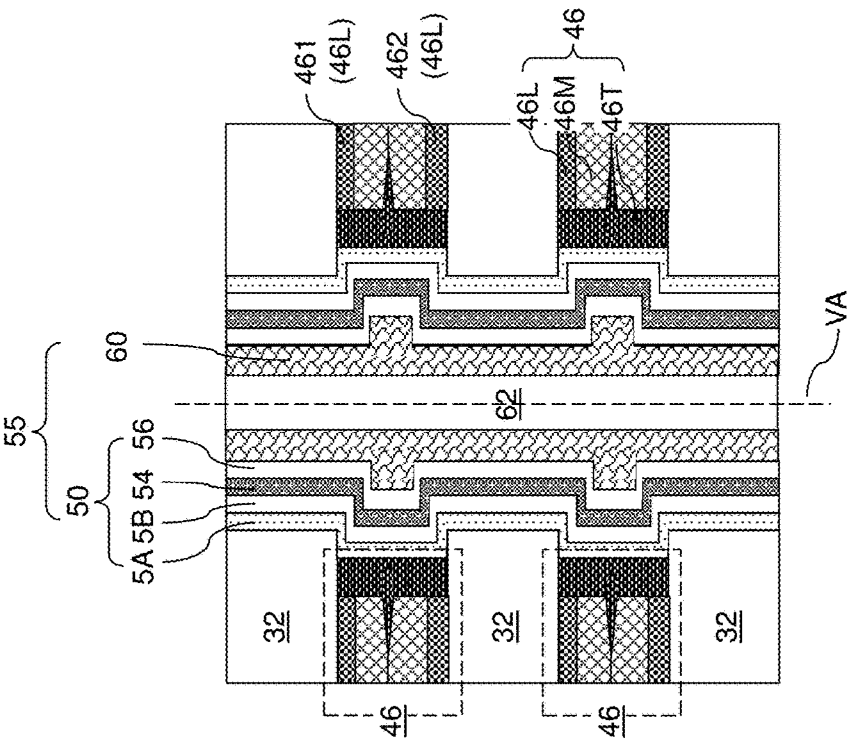
FIG. 53B is a magnified view of a region of the fifth exemplary structure of FIG. 53A around a memory opening.
Figure 53A:
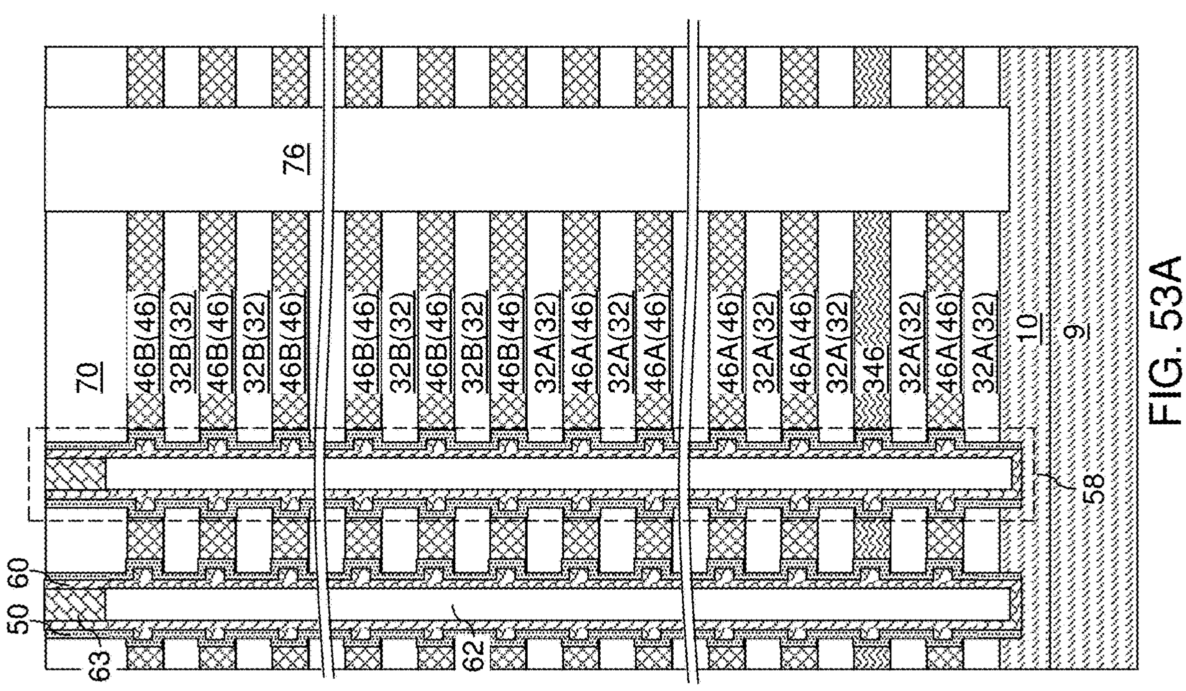
FIG. 53A is a vertical cross-sectional view of the fifth exemplary structure after formation of memory opening fill structures according to an embodiment of the present disclosure.

Referring to FIGS. 53A and 53B, the processing steps of FIGS. 43A and 43B can be performed to form dielectric cores 62, vertical semiconductor channels 60, and drain regions 63. Generally, a memory opening fill structure 58 can be formed in each memory cavity 49'. Each memory opening fill structure 58 comprises a memory film 50 and a vertical semiconductor channel 60. In one embodiment, the memory film 50 lateral protrudes outward farther from a vertical axis VA passing through a geometrical center of the memory opening fill structure 58 at interfaces with remaining portions of the electrically conductive layers 46 than at interfaces with the insulating layers 32.

Figure 54B:
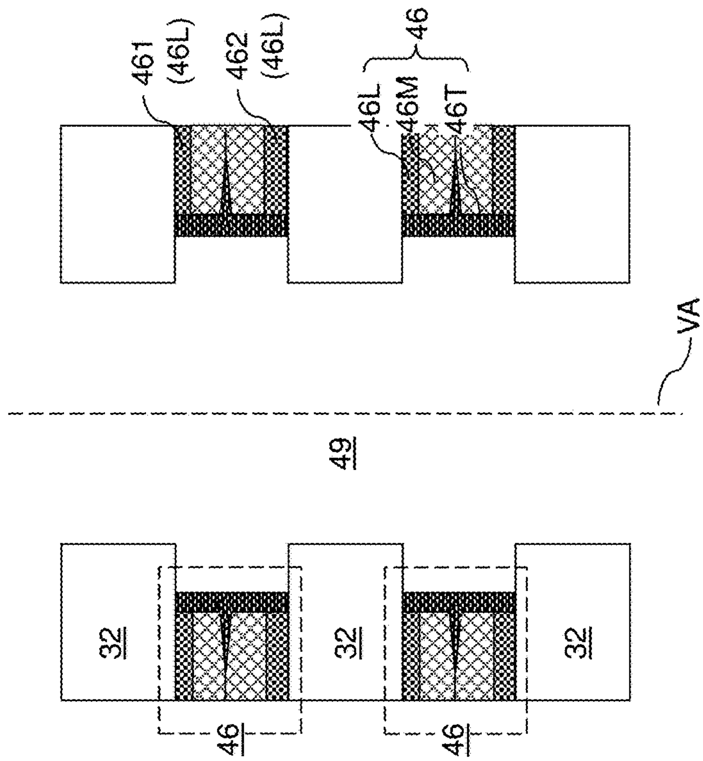
FIG. 54B is a magnified view of a region of the alternative configuration of the fifth exemplary structure of FIG. 54A around a memory opening.
Figure 54A:
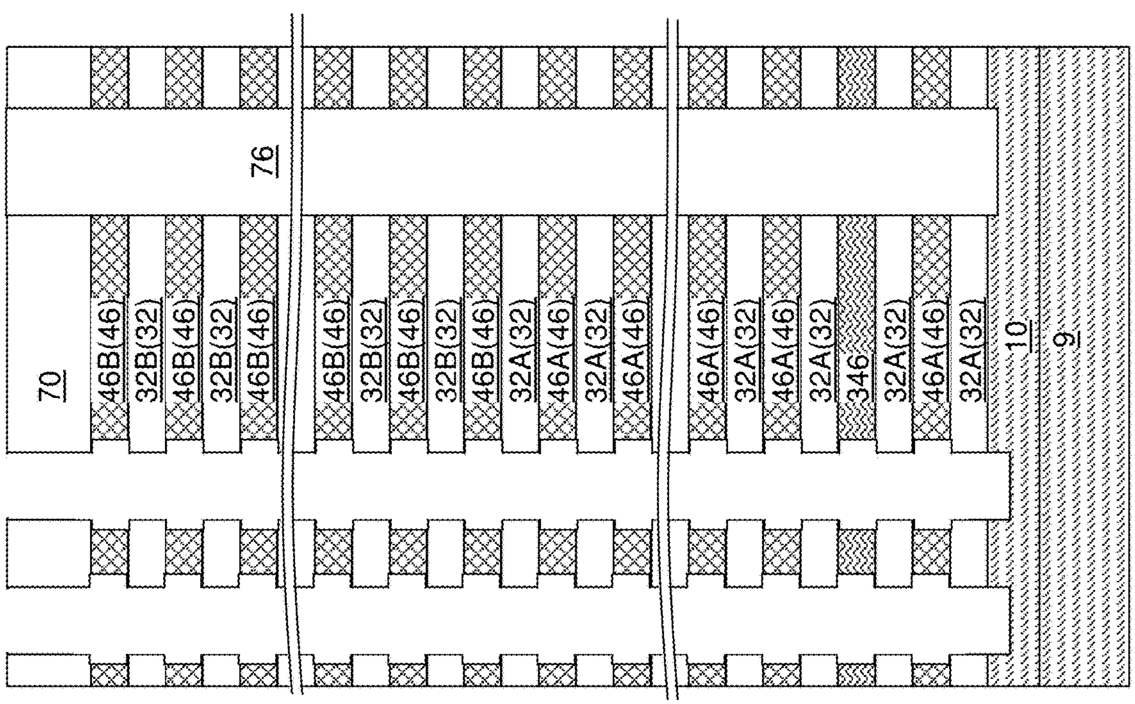
FIG. 54A is a vertical cross-sectional view of an alternative configuration of the fifth exemplary structure after formation of first tubular metal structures according to an embodiment of the present disclosure.

Referring to FIGS. 54A and 54B, an alternative configuration of the fifth exemplary structure according to an embodiment of the present disclosure is illustrated, which may be the same as the fifth exemplary structure illustrated in FIGS. 50A and 50B.

Figure 55B:
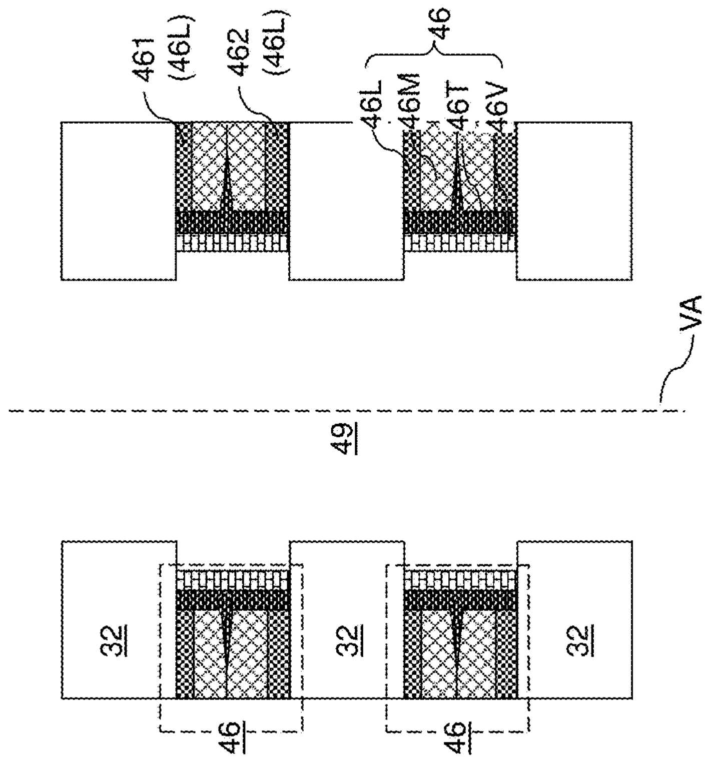
FIG. 55B is a magnified view of a region of the alternative configuration of the fifth exemplary structure of FIG. 55A around a memory opening.
Figure 55A:
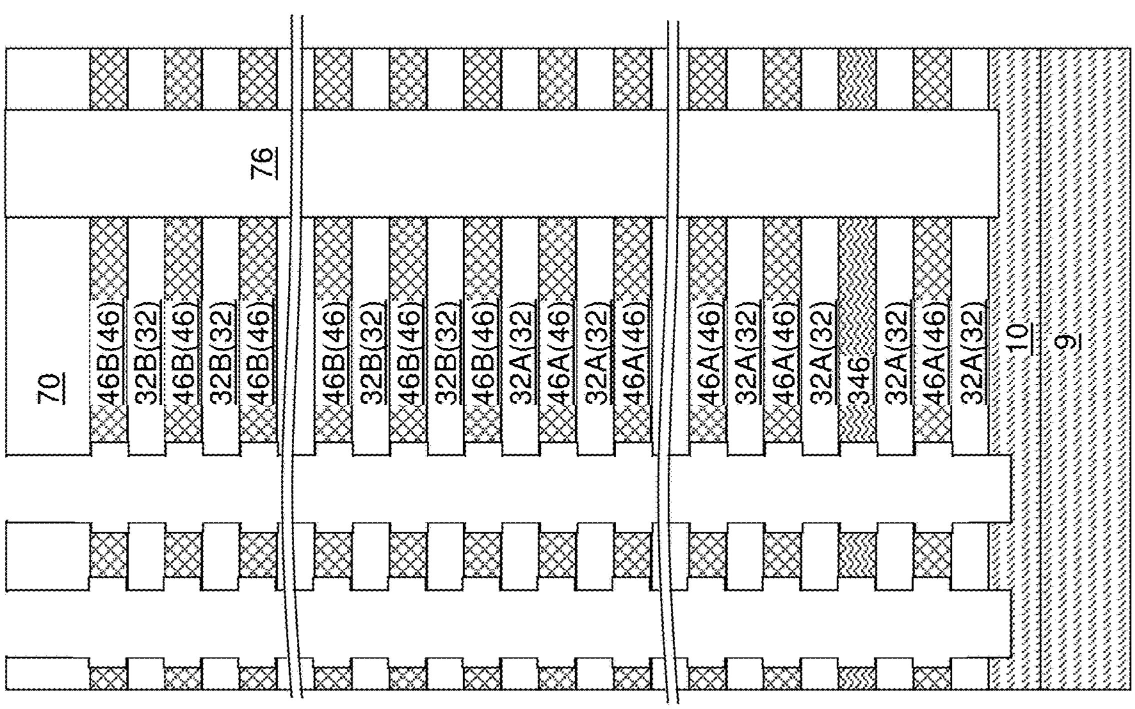
FIG. 55A is a vertical cross-sectional view of the alternative configuration of the fifth exemplary structure after formation of second tubular metal structures according to an embodiment of the present disclosure.

Referring to FIGS. 55A and 55B, a first selective metal deposition process can be performed to grow a first metal from inner sidewalls of the first tubular metal structures 46T while suppressing growth of the second metal from surfaces of the insulating layers 32. The first selective metal deposition process may comprise any selective metal deposition process that can selectively grow a metal from electrically conductive surfaces while suppressing growth of the metal from dielectric surfaces. The first metal may comprise, and/or may consist essentially of, tungsten, molybdenum, cobalt, ruthenium, or any other metal that may be deposited by a selective metal deposition process while suppressing deposition of the metal from the dielectric surfaces of the insulating layers 32. The first metal may be the same as, or may be different from, the metal of the metallic fill material layers 46M.

Second tubular metal structures 46V comprising the second metal are then selectively grown on the sidewalls of the first tubular metal structures 46T, and are incorporated into the electrically conductive layers 46. The second tubular metal structures 46V selectively grow from the inner sidewalls of the first tubular metal structures 46T. The second metal may comprise, and/or may consist essentially of, tungsten, molybdenum, cobalt, ruthenium, or any other metal that may be deposited by a selective metal deposition process while suppressing deposition of the metal from the dielectric surfaces of the insulating layers 32. In one embodiment, the first metal comprises tungsten and the second metal comprises ruthenium.

Each second tubular metal structure 46V can have a tubular configuration, i.e., can have a cylindrical opening therethrough. Specifically, each second tubular metal structure 46V can have a vertical or substantially vertical cylindrical outer sidewall, an annular top surface, an annular bottom surface, and a vertical or substantially vertical cylindrical inner sidewall. The annular top surface of each second tubular metal structure 46V contacts an annular horizontal surface of an overlying insulating layer 32, and the annular bottom surface of each second tubular metal structure 46V contacts an annular horizontal surface of an underlying insulating layer 32.

In one embodiment, each electrically conductive layer 46 comprises a metallic fill material layer 46M comprising a metal, a lower metallic liner 462 comprising a second portion of a metallic liner material and contacting a bottom surface of the metallic fill material layer 46M, and an upper metallic liner 461 comprising a second portion of the metallic liner material and contacting a top surface of the metallic fill material layer 46M. In one embodiment, each electrically conductive layer 46 further comprises a first tubular metal structure 46T in contact with a cylindrical sidewall of the upper metallic liner 461, in contact with a cylindrical sidewall of the lower metallic liner 462, and in contact with the metallic fill material layer 46M. In one embodiment, each electrically conductive layer 46 further comprises a second tubular metal structure 46V in contact with an inner sidewall of the first tubular metal structure 46T. The metal of structure 46V is different from the metal of structure 46T. The thickness of each second tubular metal structure 46V, as measured between an outer sidewall and an inner sidewall, may be in a range from 1 nm to 30 nm, such as from 2 nm to 15 nm, although lesser and greater thicknesses may also be employed.

Figure 56B:
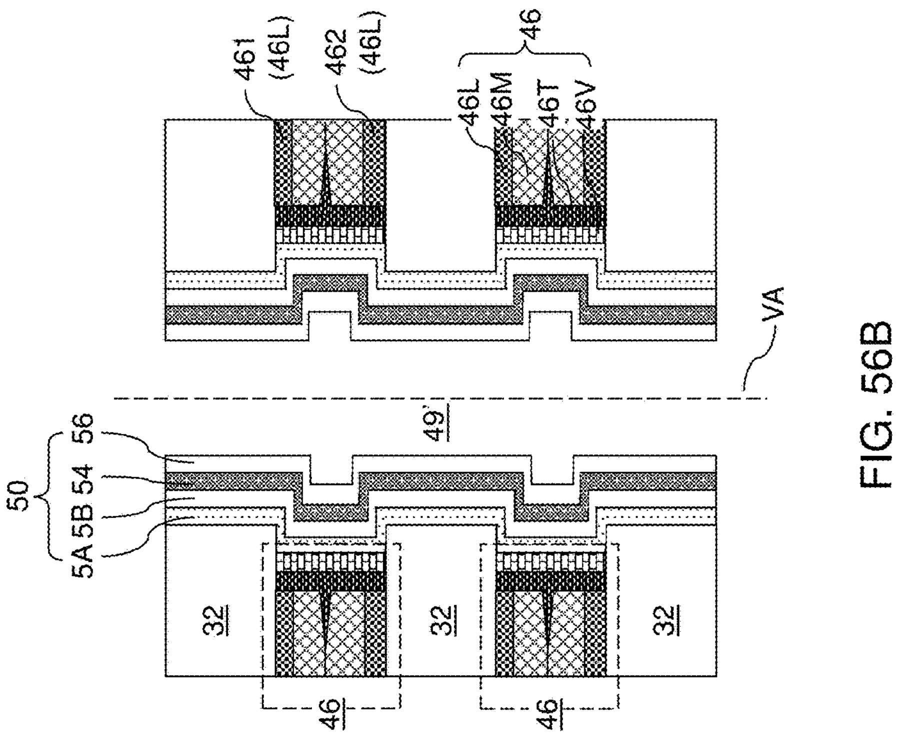
FIGS. 56B and 56C are magnified views of a region of the alternative electrically conductive layers of the alternative configuration of the fifth exemplary structure of FIG. 56A around a memory opening.
Figure 56A:
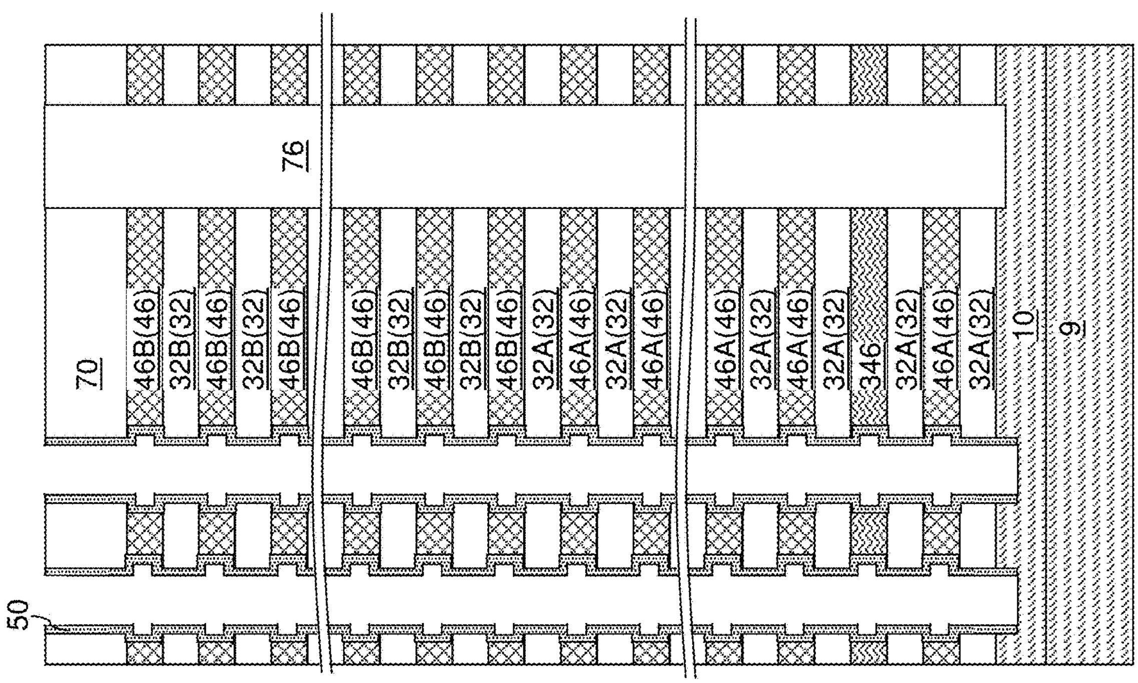
FIG. 56A is a vertical cross-sectional view of the alternative configuration of the fifth exemplary structure after formation of memory films according to an embodiment of the present disclosure.

Referring to FIGS. 56A and 56B, the processing steps of FIGS. 41A and 41B can be performed to form a memory film 50 within each memory cavity 49'. In one embodiment, each memory film 50 may comprise, from outside to inside, an optional dielectric metal oxide blocking dielectric layer 5A, an optional silicon oxide blocking dielectric layer 5B, a memory material layer 54, and an optional tunneling dielectric layer 56.

Figure 56C:
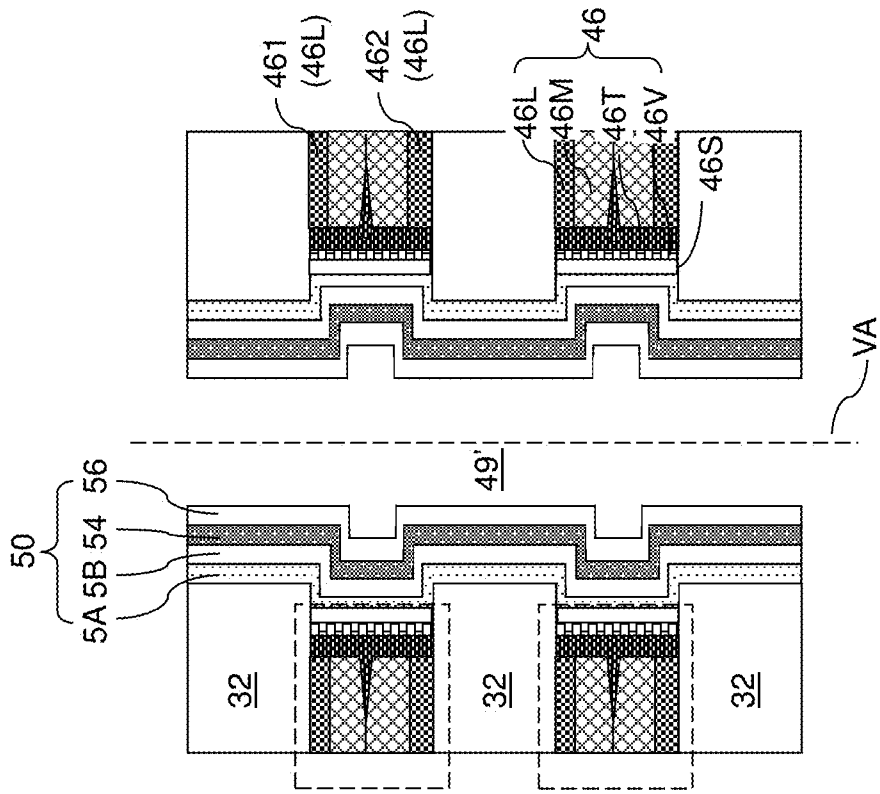

If the metal of the second tubular metal structure 46V comprises an oxidizable metal, such as ruthenium, then the surface portion of the second tubular metal structure 46V contacting the dielectric metal oxide blocking dielectric layer 5A may be oxidized during the deposition of the dielectric metal oxide blocking dielectric layer 5A. For example, a tubular metal oxide structure 46S may be formed at the interface between the second tubular metal structure 46V and the dielectric metal oxide blocking dielectric layer 5A, as shown in FIG. 56C. For example, the tubular metal oxide structure 46S may comprise an electrically conductive metal oxide material, such as ruthenium oxide.

Each memory film 50 may comprise an outer sidewall having a laterally undulating vertical cross-sectional profile. The outer sidewall of each memory film 50 may comprise first portions contacting the second tubular metal structures 46V or the tubular metal oxide structures 46S, second portions contacting cylindrical sidewalls of the insulating layers 32, and horizontal annular surface segments contacting a horizontal annular surface of a respective insulating layer 32. The first portions and the second portions of the outer sidewall of each memory film 50 are laterally offset. Specifically, the first portions of the outer sidewall of each memory film 50 are more distal from the vertical axis VA passing through the geometrical center of the memory opening that includes the memory film 50 than the second portions of the outer sidewall of each memory film 50 are from the vertical axis VA.

In one embodiment, in each electrically conductive layer 46, the second tubular metal structure 46V or the tubular metal oxide structure 46S contacts a first surface portion of the memory film 50. In one embodiment, entirety of the first surface portion of the memory film extends straight along a vertical direction. In one embodiment, each of the insulating layers 32 comprises a horizontal surface that contacts a respective annular horizontal surface segment of the memory film 50. In one embodiment, the memory film 50 comprises a dielectric metal oxide blocking dielectric layer 5A. Direct contact between the seam 45 and the dielectric metal oxide blocking dielectric layer 5A can be avoided by the presence of the first tubular metal structures 46T and the second tubular metal structures 46V. The memory film 50 can be formed on inner sidewalls of the second tubular metal structures 46V or the tubular metal oxide structures 46S around each memory cavity 49'.

Figure 57B:
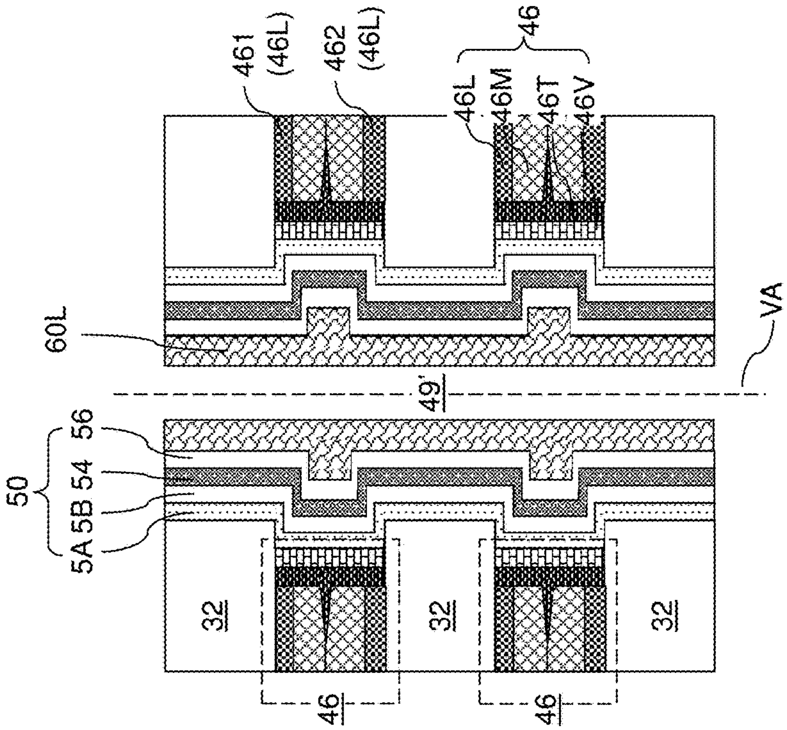
FIG. 57B is a magnified view of a region of the alternative configuration of the fifth exemplary structure of FIG. 57A around a memory opening.
Figure 57A:
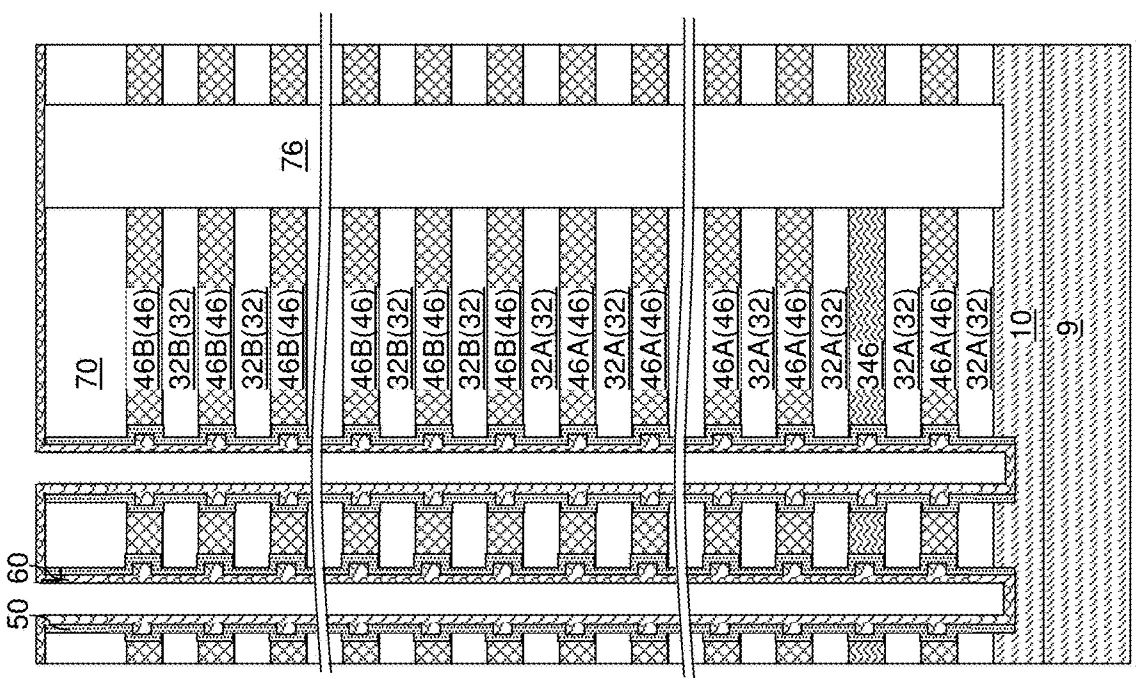
FIG. 57A is a vertical cross-sectional view of the alternative configuration of the fifth exemplary structure after formation of a semiconductor channel layer according to an embodiment of the present disclosure.

Referring to FIGS. 57A and 57B, the processing steps of FIGS. 42A and 42B can be performed to form a semiconductor channel layer 60L.

Figure 58B:
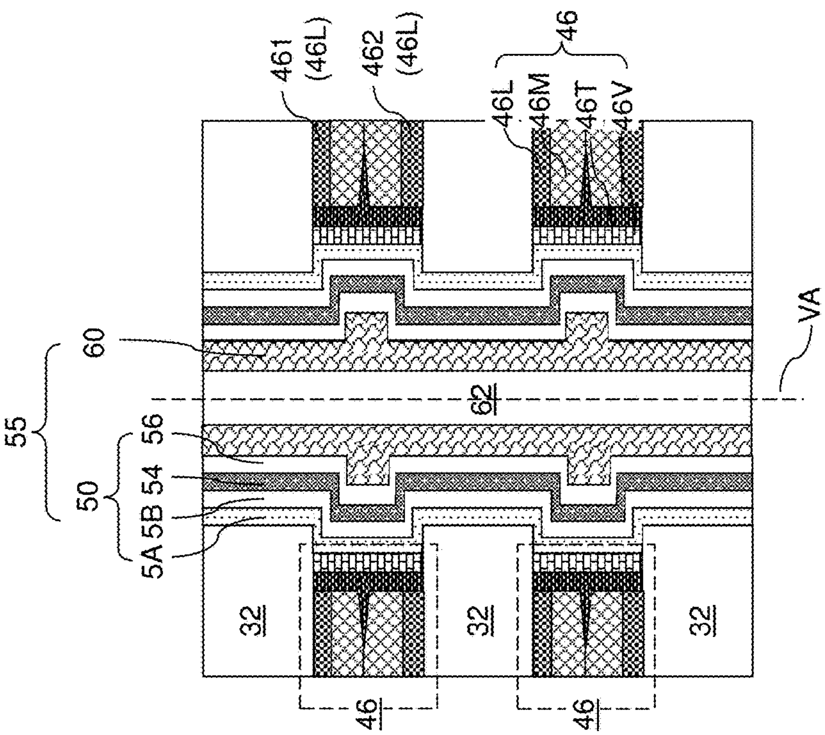
FIG. 58B is a magnified view of a region of the alternative configuration of the fifth exemplary structure of FIG. 58A around a memory opening.
Figure 58A:
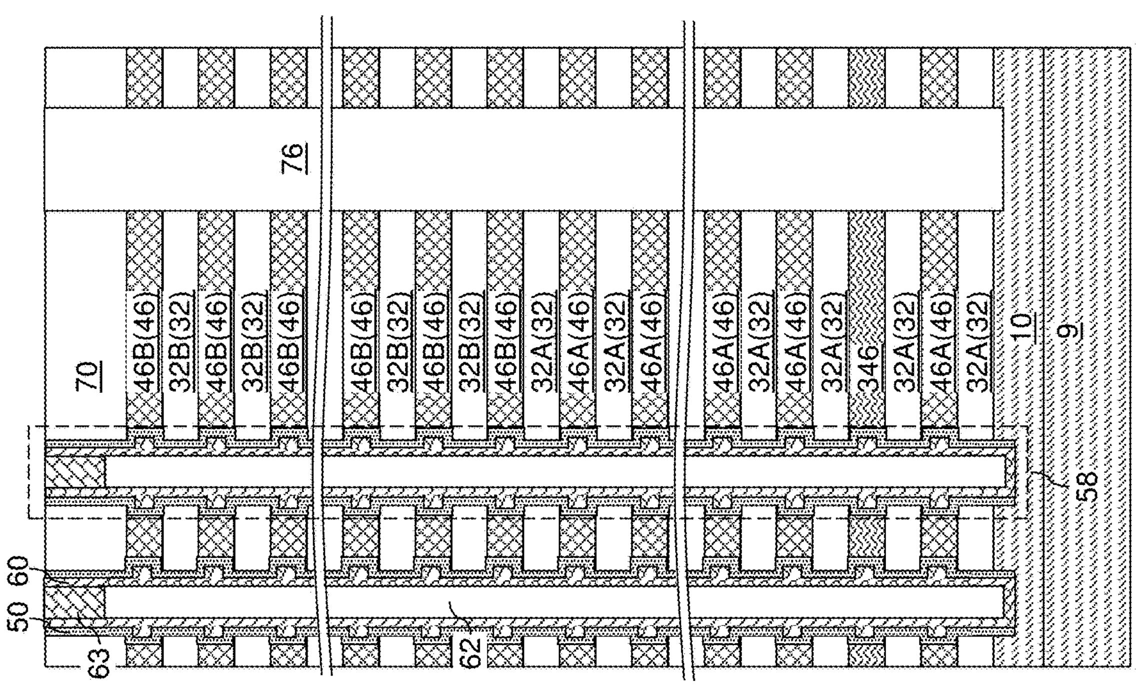
FIG. 58A is a vertical cross-sectional view of the alternative configuration of the fifth exemplary structure after formation of memory opening fill structures according to an embodiment of the present disclosure.

Referring to FIGS. 58A and 58B, the processing steps of FIGS. 43A and 43B can be performed to form dielectric cores 62, vertical semiconductor channels 60, and drain regions 63. Generally, a memory opening fill structure 58 can be formed in each memory cavity 49'. Each memory opening fill structure 58 comprises a memory film 50 and a vertical semiconductor channel 60. In one embodiment, the memory film 50 lateral protrudes outward farther from a vertical axis VA passing through a geometrical center of the memory opening fill structure 58 at interfaces with remaining portions of the electrically conductive layers 46 than at interfaces with the insulating layers 32.

Referring collectively to FIGS. 44A-58B and related drawings and according to various embodiments of the present disclosure, a three-dimensional memory device is provided, which comprises: an alternating stack of insulating layers 32 and electrically conductive layers 46; a memory opening extending through the alternating stack (32, 46); and a memory opening fill structure 58 located in the memory opening and comprising a vertical semiconductor channel 60 and a memory film 50. Each of the electrically conductive layers 46 comprises: a metallic fill material layer 46M comprising a metal; a lower metallic liner 462 comprising a first portion of a metallic liner material and contacting a bottom surface of the metallic fill material layer 46M; and an upper metallic liner 461 comprising a second portion of the metallic liner material and contacting a top surface of the metallic fill material layer 46M. The metallic fill material layer 46M, the lower metallic liner 462, and the upper metallic liner 461 are more distal than the insulating layers 32 from a vertical axis VA passing through a geometrical center of the memory opening fill structure 58.

Figure 59B:
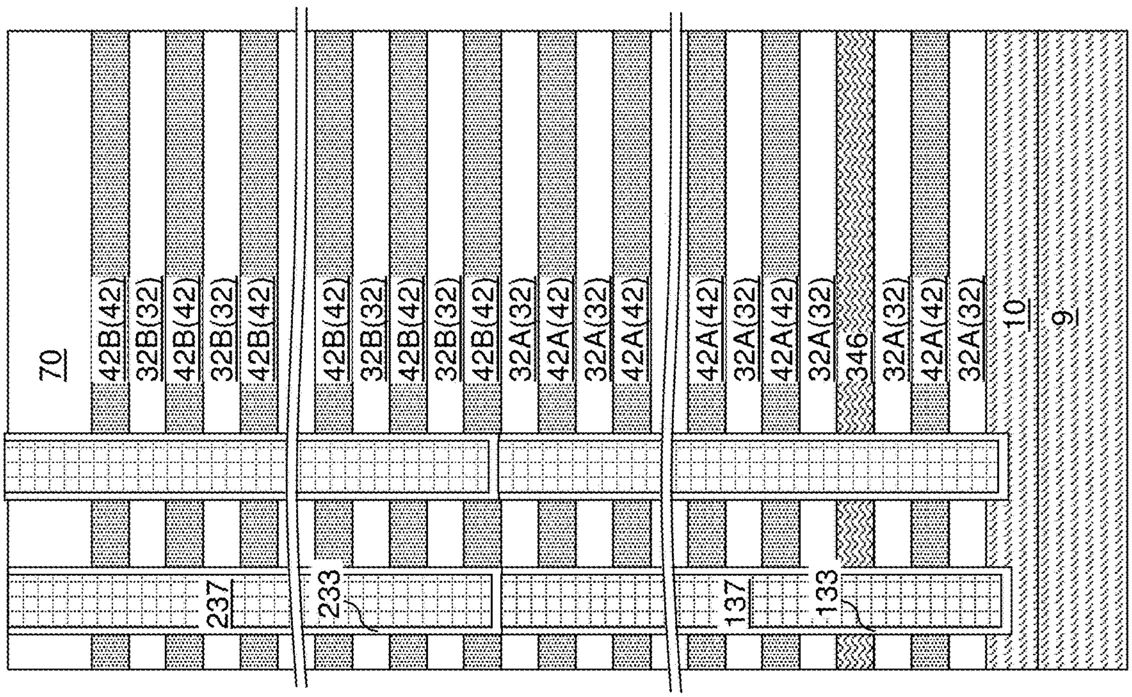
FIGS. 59A-59D are sequential vertical cross-sectional views of a sixth exemplary structure during formation of alternating stacks of insulating layers and sacrificial material layers, backside trenches, and backside recesses according to an embodiment of the present disclosure.
Figure 59A:
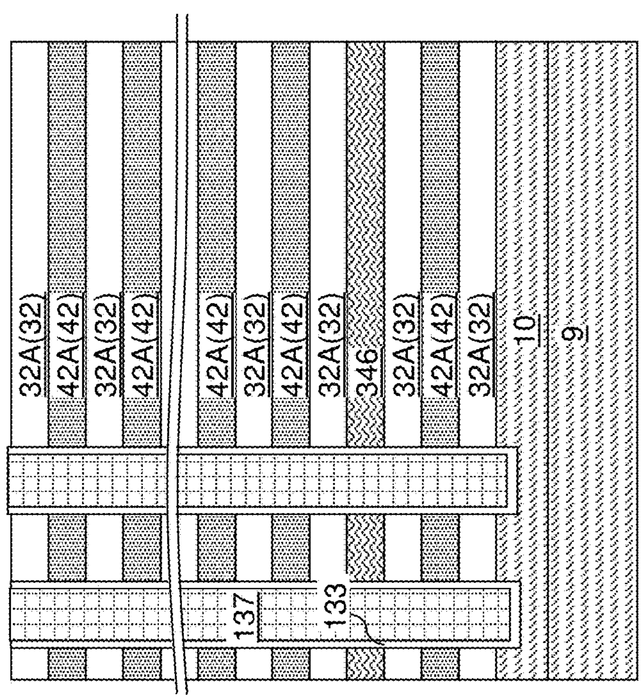

Referring to FIG. 59A, a sixth exemplary structure according to an embodiment of the present disclosure is illustrated. The sixth exemplary structure may be derived from the first exemplary structure illustrated in FIGS. 4A and 4B by employing an insulating layer 32 in lieu of an insulating cap layer 70, and by omitting formation of the drain-select-level isolation structures 72. In the sixth exemplary structure, the insulating layers 32 that are present at the processing steps of FIG. 59A are referred to as first-tier insulating layers 32A, and the sacrificial material layers 42 that are present at the processing steps of FIG. 59A are referred to as first-tier sacrificial material layers 42A. The alternating stack of the first-tier insulating layers 32A and the first-tier sacrificial material layers 42A is herein referred to as a first-tier alternating stack (32A, 42A). Optionally, one of the first-tier sacrificial material layers 42A that is proximal to the bottom surface of the first-tier alternating stack (32A, 32B) may be replaced with an electrically conductive semiconductor layer 346 comprising a heavily doped semiconductor material (such as heavily doped polysilicon). In this case, the electrically conductive semiconductor layer 346 may be employed as an etch stop material layer during subsequent formation of memory opening and support openings.

The memory openings formed through the first-tier alternating stack (32A, 42A) are herein referred to as first-tier memory openings. The support openings formed through the first-tier alternating stack (32A, 42A) are herein referred to as first-tier support openings (not illustrated). Generally, the first-tier alternating stack (32A, 42A) may be the same as the alternating stack (32, 42) of the first exemplary structure, or as the first-tier alternating stack of the second exemplary structure.

Each of the first-tier memory openings can be filled with a respective combination of a first-tier dielectric liner 133 and a first-tier sacrificial memory opening fill material portion 137. Each of the first-tier support openings (not illustrated) can be filled with a respective combination of a first-tier dielectric liner 133 and a first-tier sacrificial support opening fill material portion.

The first-tier dielectric liners 133, the first-tier sacrificial memory opening fill material portions 137, and the first-tier sacrificial support opening fill material portions can be formed by conformally depositing a dielectric liner material of the first-tier dielectric liners 133 in the first-tier memory openings and the first-tier support openings, by depositing the sacrificial fill material of the first-tier sacrificial memory opening fill material portions 137 and the first-tier sacrificial support opening fill material portions in remaining volumes of the first-tier memory openings and the first-tier support openings, and by removing excess portions of the sacrificial fill material and the dielectric liner material from above the horizontal plane including the top surface of the first-tier alternating stack (32A, 42A).

Referring to FIG. 59B the processing steps of FIGS. 2, 3, and 4A and 4B can be performed again with any needed changes to form a second-tier alternating stack of second-tier insulating layers 32B and second-tier sacrificial material layers 42B of the sixth exemplary structure. Generally, the second-tier insulating layers 32B may comprise the same material as, and may have the same thickness range as, the first-tier insulating layers 32A that are formed at the processing steps of FIG. 59A. The memory openings formed through the second-tier alternating stack (32B, 42B) are herein referred to as second-tier memory openings. The support openings formed through the second-tier alternating stack (32B, 42B) are herein referred to as second-tier support openings (not illustrated). Each of the second-tier memory openings can be formed directly on, and can have an areal overlap in a plan view with, an underlying first-tier memory opening (which is filled with a first-tier dielectric liner 133 and a first-tier sacrificial memory opening fill material portion 137). Each of the second-tier support openings can be formed directly on, and can have an areal overlap in a plan view with, an underlying first-tier support opening (which is filled with a first-tier dielectric liner and a first-tier sacrificial support opening fill material portion).

Each of the second-tier memory openings can be filled with a respective combination of a second-tier dielectric liner 233 and a second-tier sacrificial memory opening fill material portion 237. Each of the second-tier support openings (not illustrated) can be filled with a respective combination of a second-tier dielectric liner 233 and a second-tier sacrificial support opening fill material portion.

The second-tier dielectric liners 233, the second-tier sacrificial memory opening fill material portions 237, and the first-tier sacrificial support opening fill material portions can be formed by conformally depositing a dielectric liner material of the second-tier dielectric liners 233 in the second-tier memory openings and the second-tier support openings, by depositing the sacrificial fill material of the second-tier sacrificial memory opening fill material portions 237 and the first-tier sacrificial support opening fill material portions in remaining volumes of the second-tier memory openings and the second-tier support openings, and by removing excess portions of the sacrificial fill material and the dielectric liner material from above the horizontal plane including the top surface of the insulating cap layer 70. Each contiguous combination of a second-tier dielectric liner 233, a second-tier sacrificial memory opening fill material portion 237, a first-tier dielectric liner 133, and a first-tier sacrificial memory opening fill material portion 137 constitutes a sacrificial memory opening fill structure (133, 137, 233, 237). Each contiguous combination of a second-tier dielectric liner, a second-tier sacrificial support opening fill material portion, a first-tier dielectric liner, and a first-tier sacrificial support opening fill material portion constitutes a sacrificial support opening fill structure (not illustrated).

In one embodiment, the first-tier insulating layers 32A and the second-tier insulating layers 32B comprise a first silicon oxide material, and the first-tier dielectric liners 133 and the second-tier dielectric liners 233 comprise a second silicon oxide material having a higher etch rate in the etchant which is subsequently used to selectively etch the sacrificial material layers (42A, 42B). For example, liners (133, 233) may have an etch rate which is at least 3 times, such 4 to 15 times, for example as 5 to 10 times higher than the insulating layers (32A, 32B) in phosphoric acid (with or without additional etching solution additives). In one embodiment, the liners (133, 233) may comprise silicon oxide deposited by atomic layer deposition using a silicon bearing gas and oxygen containing gas in plural silicon deposition and silicon oxidation cycles. In contrast, the insulating layers (32A, 32B) may comprise silicon oxide deposited by plasma enhanced chemical vapor deposition from a TEOS source or silicon oxide formed by plasma oxidation of silicon nitride layers. The different deposition methods form silicon oxide layers with different etch resistance to phosphoric acid (i.e., a different etch rate in phosphoric acid).

In an alternative embodiment, the liners (133, 233) may be formed of a different material than the insulating layers (32A, 32B) and the sacrificial material layers (42A, 42B) such that the liners have a lower etch rate in phosphoric acid that of the sacrificial material layers (42A, 42B) but a higher etch rate in phosphoric acid than that of the insulating layers (32A, 32B). For example, the insulating layers (32A, 32B) may comprise silicon oxide, the sacrificial material layers (42A, 42B) may comprise silicon nitride, and the liners (133, 233) may comprise silicon oxynitride.

The first-tier and the second-tier sacrificial memory opening fill material portions (137, 237) and the second-tier sacrificial support opening fill material portions (not illustrated) may comprise a semiconductor material such as amorphous silicon, polysilicon, a silicon-germanium alloy, or a polymer material.

Figure 59D:
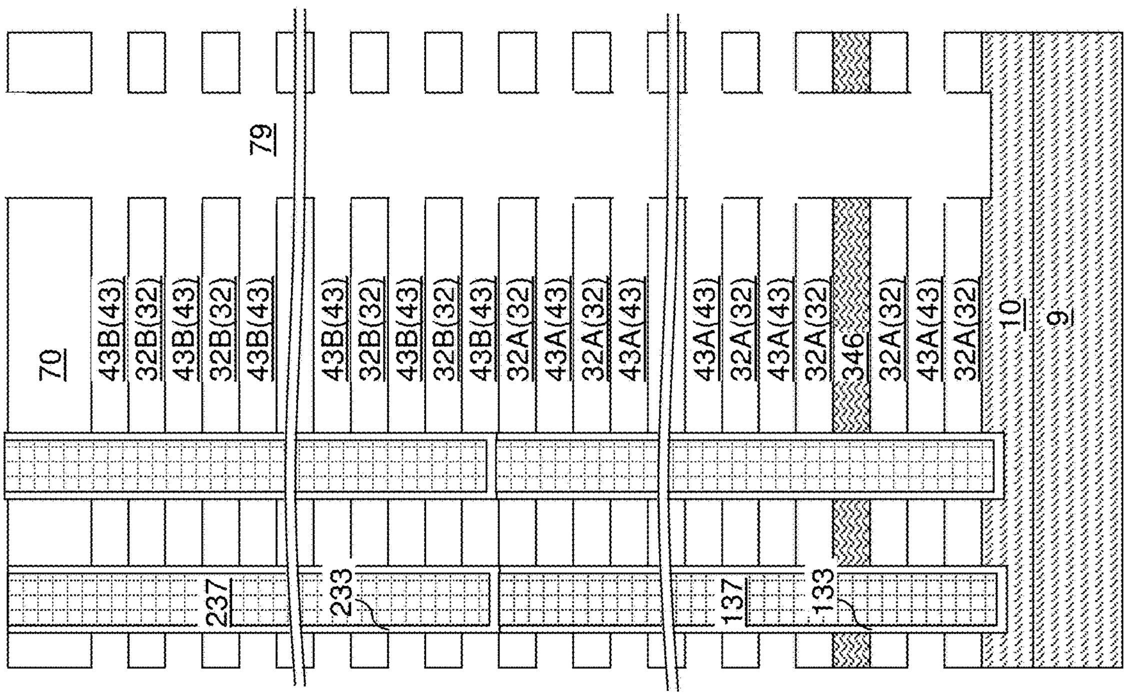
Figure 59C:
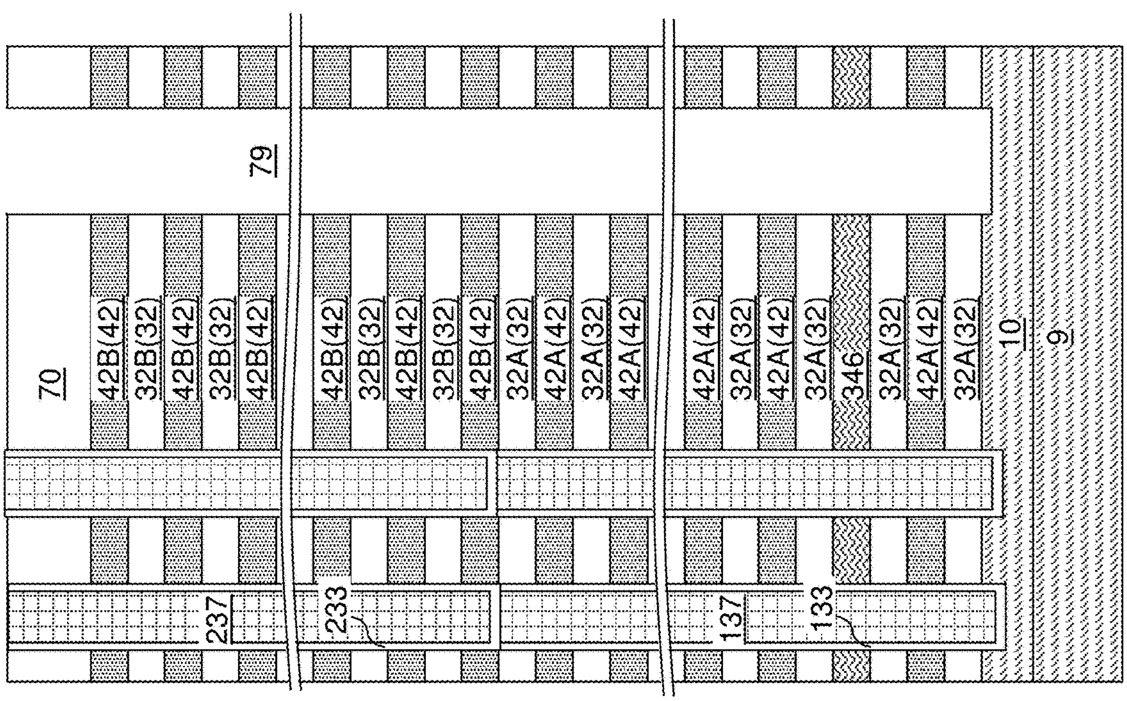

Referring to FIG. 59C, a photoresist layer (not shown) can be applied over the alternating stacks {(32A, 42A), (32B, 42B)} and can be lithographically patterned to form openings in areas between clusters of sacrificial memory opening fill structure (133, 137, 233, 237). The pattern in the photoresist layer can be transferred through the alternating stacks {(32A, 42A), (32B, 42B)} and the retro-stepped dielectric material portions (not illustrated) employing an anisotropic etch to form backside trenches 79, which vertically extend from the top surface of the insulating cap layer 70 at least to the top surface of the substrate (9, 10), and laterally extend through the memory array region and the contact region.

Referring to FIG. 59D, an etchant that selectively etches the materials of the sacrificial material layers (42A, 42B) with respect to the materials of the insulating layers (32A, 32B) can be introduced into the backside trenches 79, for example, employing an isotropic etch process. Backside recesses 43 are formed in volumes from which the sacrificial material layers 42 are removed. The removal of the materials of the sacrificial material layers (42A, 42B) can be selective to the materials of the insulating layers (32A, 32B), the materials of the retro-stepped dielectric material portions, the semiconductor material of the semiconductor material layer 10, and the materials of the dielectric liners (133, 233). In one embodiment, the sacrificial material layers (42A, 42B) can include silicon nitride, and the materials of the insulating layers (32A, 32B) and the retro-stepped dielectric material portions (not illustrated) can be selected from silicon oxide and dielectric metal oxides. In this case, the isotropic etch process may comprise a wet etch process employing hot phosphoric acid with or without additional etching solution additives.

The backside recesses 43 may comprise first-tier backside recesses 43A that are formed in volumes from which the first-tier sacrificial material layers 42A are removed, and second-tier backside recesses 43B that are formed in volumes from which the second-tier sacrificial material layers 42B are removed. Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which sacrificial memory opening fill structures (133, 137, 233, 237) are present are herein referred to as front-side openings or front-side cavities in contrast with the backside recesses 43. In this case, each backside recess 43 can define a space for receiving a respective word line of an array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Generally, a sacrificial memory opening fill material portion (137 and/or 237) can be formed in a memory opening over a dielectric liner (133 and/or 233), and the backside recesses 43 can be formed by removing the sacrificial material layers (42A, 42B) selective to the insulating layers (32A, 32B) and the dielectric liner (133 and/or 233).

Figure 60B:
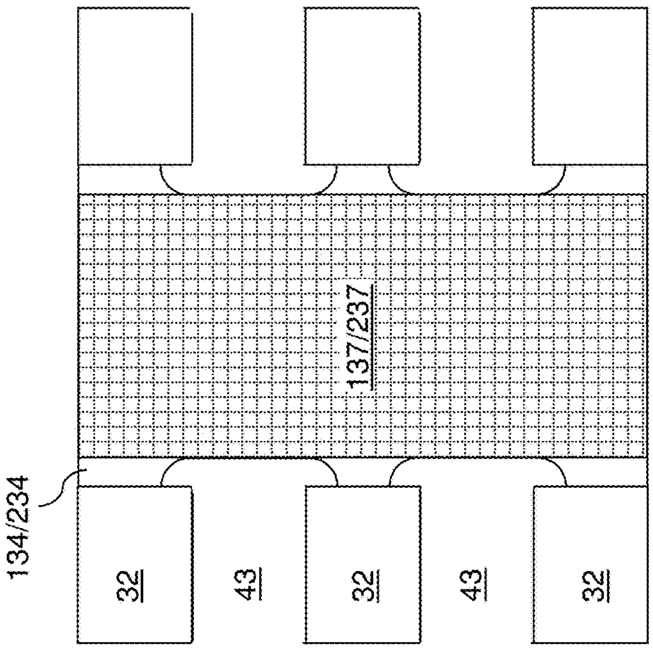
FIG. 60B is a magnified view of a region of the sixth exemplary structure of FIG. 50A around a memory opening.
Figure 60A:
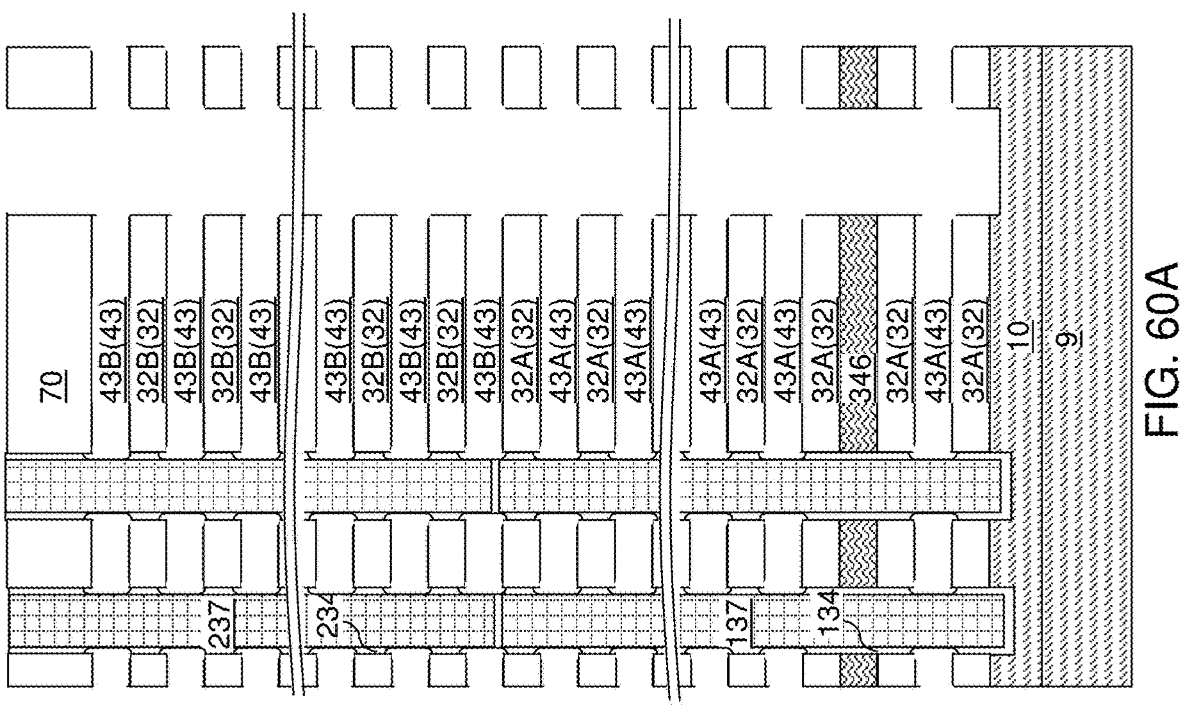
FIG. 60A is a vertical cross-sectional view of the sixth exemplary structure after etching portions of each dielectric liner at levels of the backside recesses according to an embodiment of the present disclosure.

Referring to FIGS. 60A and 60B, the selective isotropic etch process in phosphoric acid continues to isotropically etch portions of the dielectric liners (133, 233) around the backside recesses 43, i.e., at levels of the backside recesses 43. Specifically, the selective isotropic etch process etches portions of the dielectric liner (133, 233) at levels of the backside recesses 43 selective to the insulating layers 32 and the sacrificial memory opening fill material portions (137, 237). The backside recesses 43 are expanded in volume by the selective isotropic etch process. Alternatively, different etching solutions may be used to etch the sacrificial material layers (42A, 42B) and the dielectric liners (133, 233).

The duration of the selective isotropic etch process can be selected such that each dielectric liner (133, 233) is divided into a respective vertical stack of tubular dielectric spacers (134, 234). For example, each first-tier dielectric liner 133 can be divided into a vertical stack of first tubular dielectric spacers 134, and each second-tier dielectric liner 233 can be divided into a vertical stack of second tubular dielectric spacers 234. Each vertical stack of tubular dielectric spacers (134, 234) laterally surrounds a respective memory opening fill material portion (137 or 237). In one embodiment, one, a plurality, and/or each, of the tubular dielectric spacers (134, 234) may comprise a respective tapered concave annular top surface and/or a respective tapered concave annular bottom surface. First annular surface portions of each sacrificial memory opening fill material portion (137, 237) can be physically exposed to the expanded backside recesses 43. Remaining portions of the dielectric liners (133, 233) after the selective isotropic etch process comprise a horizontal portion of a respective first-tier dielectric liner 133 located at a bottom of each memory opening and contacting the substrate (9, 10).

Figure 61B:
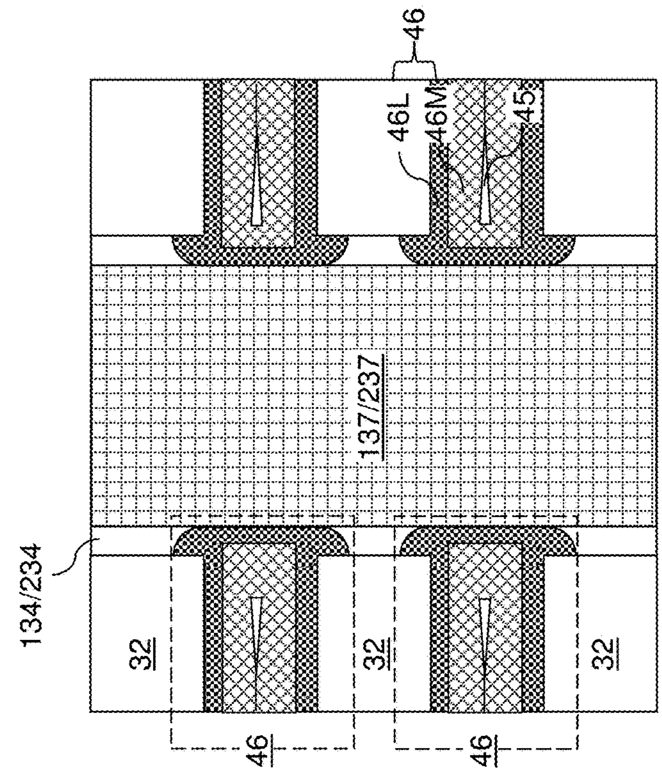
FIG. 61B is a magnified view of a region of the sixth exemplary structure of FIG. 61A around a memory opening.
Figure 61A:
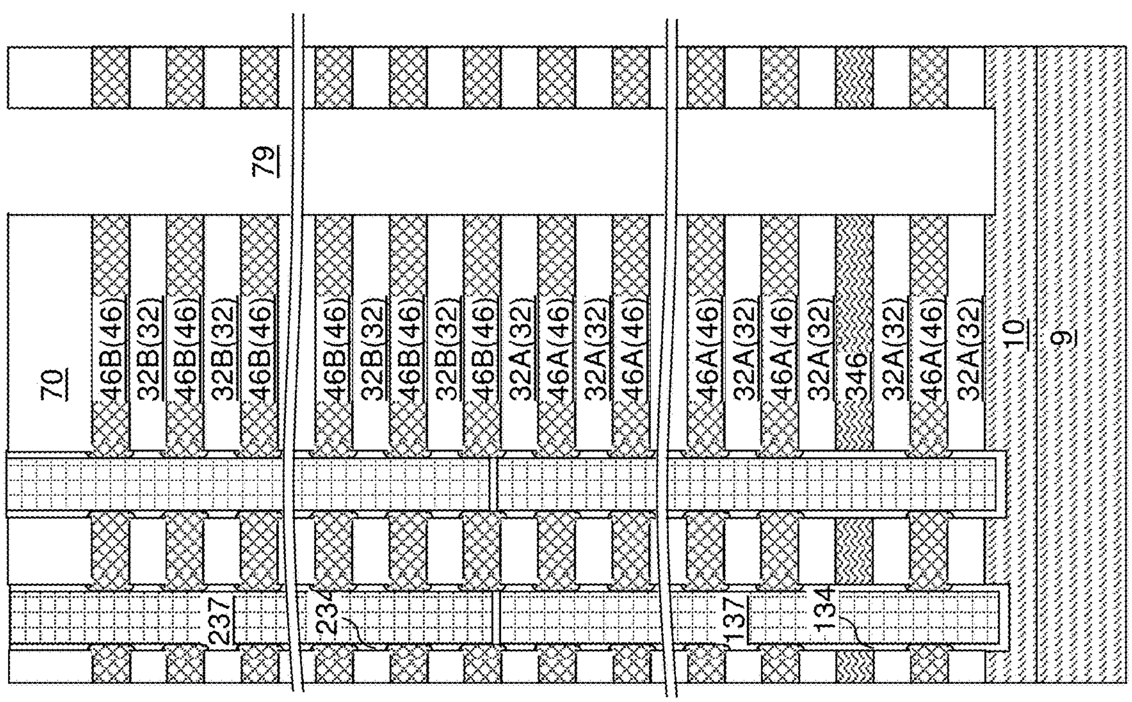
FIG. 61A is a vertical cross-sectional view of the sixth exemplary structure after formation of electrically conductive layers according to an embodiment of the present disclosure.

Referring to FIGS. 61A and 61B, a metallic liner material can be conformally deposited in the backside recesses 43 and on sidewalls of the backside trenches 79. The metallic liner material comprises a conductive metallic compound material such as TiN, TaN, WN, MoN, TiC, TaC, WC, or a stack thereof. The metallic liner material may be deposited by a conformal deposition process such as a chemical vapor deposition process or an atomic layer deposition process. The thickness of the metallic liner material may be in a range from 1 nm to 20 nm, such as from 2 nm to 10 nm, although lesser and greater thicknesses may also be employed.

A metallic fill material can be deposited over the deposited metallic liner material in remaining volumes of the backside recesses 43 and in peripheral regions of the backside trenches 79. The metallic fill material may include a metal such as tungsten, cobalt, ruthenium, molybdenum, or any other metal that may be deposited by thermal or plasma decomposition of a metal-containing precursor gas by a chemical vapor deposition process or an atomic layer deposition process. While the metallic fill material may be generally deposited with conformity, depletion of the metal-containing precursor gas in portions of the backside recesses 43 that are distal from the backside trenches 79 may cause reduction of the thickness of the deposited metallic fill material in proximity to the sacrificial memory opening fill structures (134, 137, 234, 237), and may cause formation of seams and/or air gaps 45 within the deposited metallic fill material portions. Alternatively, the seams and/or air gaps 45 may be omitted.

An anisotropic etch process can be performed to remove portions of the deposited metallic fill material and the metallic liner material from inside the backside trenches 79 and from above the insulating cap layer 70. Each contiguous set of remaining portions of the metallic fill material and the metallic liner material located within a respective one of the backside recesses 43 comprise an electrically conductive layer 46. The electrically conductive layers 46 comprise first-tier electrically conductive layers 46A formed within the first-tier backside recesses 43A and second-tier electrically conductive layers 46B formed within the second-tier backside recesses 43B. Each of the electrically conductive layers 46 may comprise a metallic fill material layer 46M comprising a portion of a metal, and a metallic liner 46L comprising a portion of a metallic liner material.

Generally, the sacrificial material layers 42 are replaced with the electrically conductive layers 46. In one embodiment, the metallic liners 46L may comprise, and/or may consist essentially of, a conductive metallic nitride material, and the metallic fill material layers 46M of the electrically conductive layers 46 may comprise, and/or may consist essentially of, a metal. In one embodiment, each of the metallic liners 46L may have a same material composition and a same thickness throughout.

In one embodiment, each of the electrically conductive layers 46 may have a hammerhead-shaped vertical cross-sectional profile, i.e., a vertical cross-sectional profile in which the vertical dimension in proximity to a memory opening fill material portion (137, 237) is greater than the vertical dimension in portions that are distal from the memory opening fill material portions (137, 237). The hammerhead-shaped electrically conductive layers 46 (e.g., word lines and select gate electrodes) suppress a short channel effect without increasing word line and select gate electrode capacitance.

In one embodiment, each of the electrically conductive layers 46 may have tubular portions in contact with a respective one of the sacrificial memory opening fill material portions (137, 237). The tubular portions have a greater vertical extent than horizontally-extending portions of the electrically conductive layer 46 that are distal from the sacrificial memory opening fill material portions (137, 237). The width of each tubular portion of the electrically conductive layers 46 may be the same as the lateral thickness of a dielectric spacer (134, 234) that the tubular portion contacts.

In one embodiment, each electrically conductive layer 46 within a subset of the electrically conducive layers 46 comprises a metallic fill material layer 46M comprising a metal, and a metallic liner 46L comprising an upper horizontally-extending portion overlying the metallic fill material layer 46M, a lower horizontally-extending portion underlying the metallic fill material layer 46M, and a vertically-extending portion connecting the upper horizontally-extending portion and the lower horizontally-extending portion and having a greater vertical extent than a vertical distance between a top surface of the upper horizontally-extending portion and a bottom surface of the lower horizontally-extending portion.

In one embodiment, the metallic liner 46L within each of the electrically conductive layers 46 comprises an inner cylindrical surface segment in contact with an outer sidewall of a memory opening fill material portion (137, 237). In one embodiment, the metallic liner 46L comprises an upper convex surface segment adjoined to an upper end of the inner cylindrical surface segment and having a first convex vertical cross-sectional profile, and a lower convex surface segment adjoined to a lower end of the inner cylindrical surface segment and having a second convex vertical cross-sectional profile.

In one embodiment, the metallic liner 46L comprises an upper horizontal surface in contact with a bottom surface of a respective first insulating layer 32 of the insulating layers 32, and a lower horizontal surface in contact with a top surface of a respective second insulating layer 32 of the insulating layers 32. In one embodiment, the metallic liner 46L comprises an upper outer cylindrical sidewall segment adjoined to a periphery of the upper horizontal surface and contacting a sidewall of the respective first insulating layer 32, and a lower outer cylindrical sidewall segment adjoined to a periphery of the lower horizontal surface and contacting a sidewall of the respective second insulating layer 32.

In one embodiment, a vertical stack of tubular dielectric spacers (134, 234) laterally surrounds a memory opening fill material portion (137, 237) in each memory opening. The vertical stack of tubular dielectric spacers (134, 234) comprises tapered concave surface segments in contact with concave surface segments of the metallic liners 46L of the electrically conductive layers 46.

In one embodiment, the insulating layers 32 comprise a first silicon oxide material, the vertical stack of tubular dielectric spacers (134, 234) comprises a second silicon oxide material having a higher etch ratio is phosphoric acid.

In one embodiment, outer sidewalls of the tubular dielectric spacers (134, 234) within the vertical stack of tubular dielectric spacers (134, 234) are vertically coincident with cylindrical interfaces between the insulating layers 32 and the vertically-extending portions of the metallic liners 46L of the electrically conductive layers 46.

In one embodiment, at least one of the electrically conductive layers 46 comprises a seam and/or air gap 45 embedded within a respective metallic fill material layer 46M. In one embodiment, the metallic liners 46L of the electrically conductive layers 46 comprise a conductive metallic nitride material, and the metallic fill material layers 46M of the electrically conductive layers 46 consist essentially of a metal.

Figure 62B:
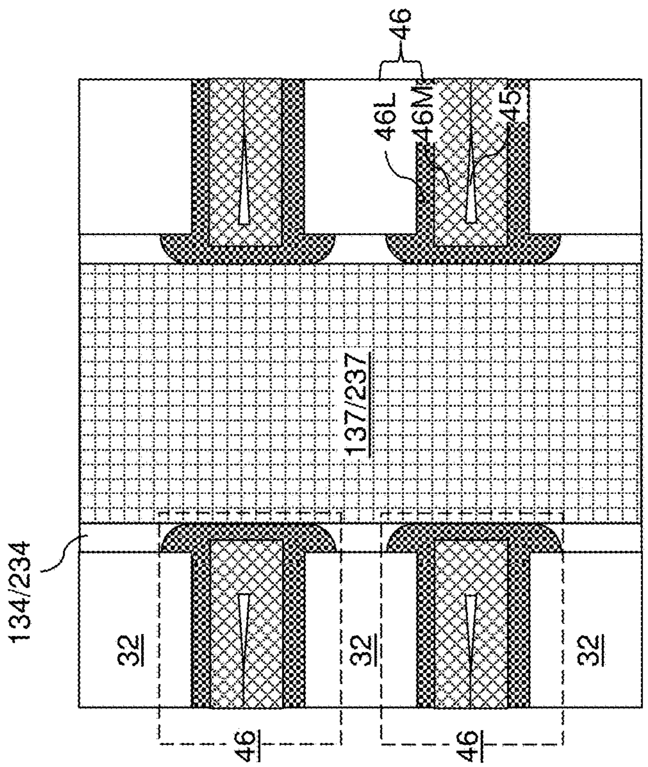
FIG. 62B is a magnified view of a region of the sixth exemplary structure of FIG. 62A around a memory opening.
Figure 62A:
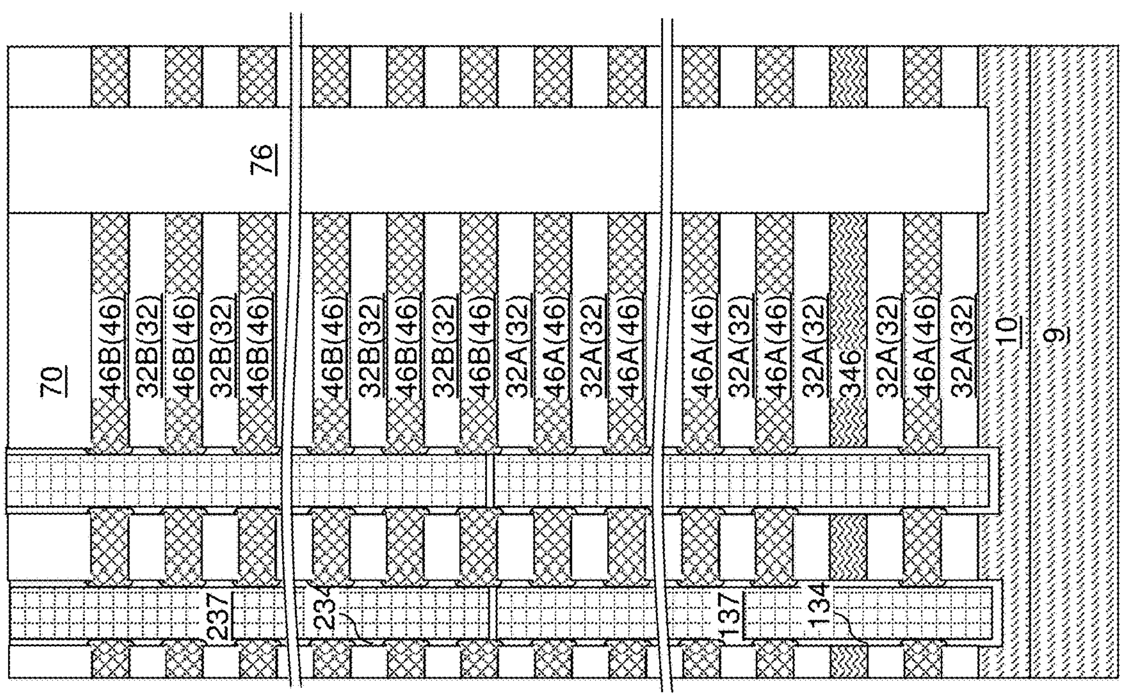
FIG. 62A is a vertical cross-sectional view of the sixth exemplary structure after formation of backside trench fill structures according to an embodiment of the present disclosure.

Referring to FIGS. 62A and 62B, a dielectric fill material, such as silicon oxide can be deposited in the backside trenches 79 by a conformal deposition process. Excess portions of the dielectric fill material can be removed from above the top surface of the insulating cap layer 70 by a planarization process, which may employ a chemical mechanical polishing (CMP) process and/or a recess etch process. Each remaining portion of the dielectric fill material filling a respective backside trench 79 constitutes a backside trench fill structure 76.

Figure 63B:
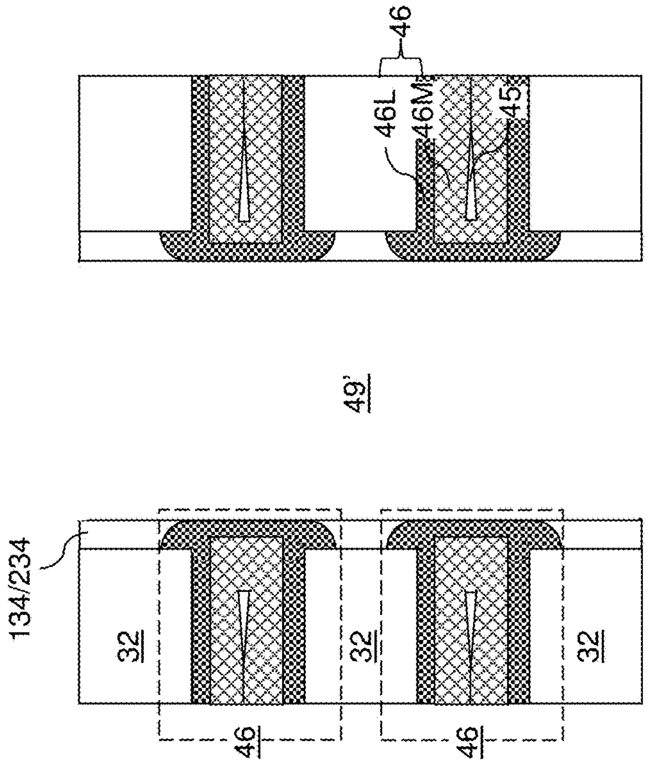
FIG. 63B is a magnified view of a region of the sixth exemplary structure of FIG. 63A around a memory opening.
Figure 63A:
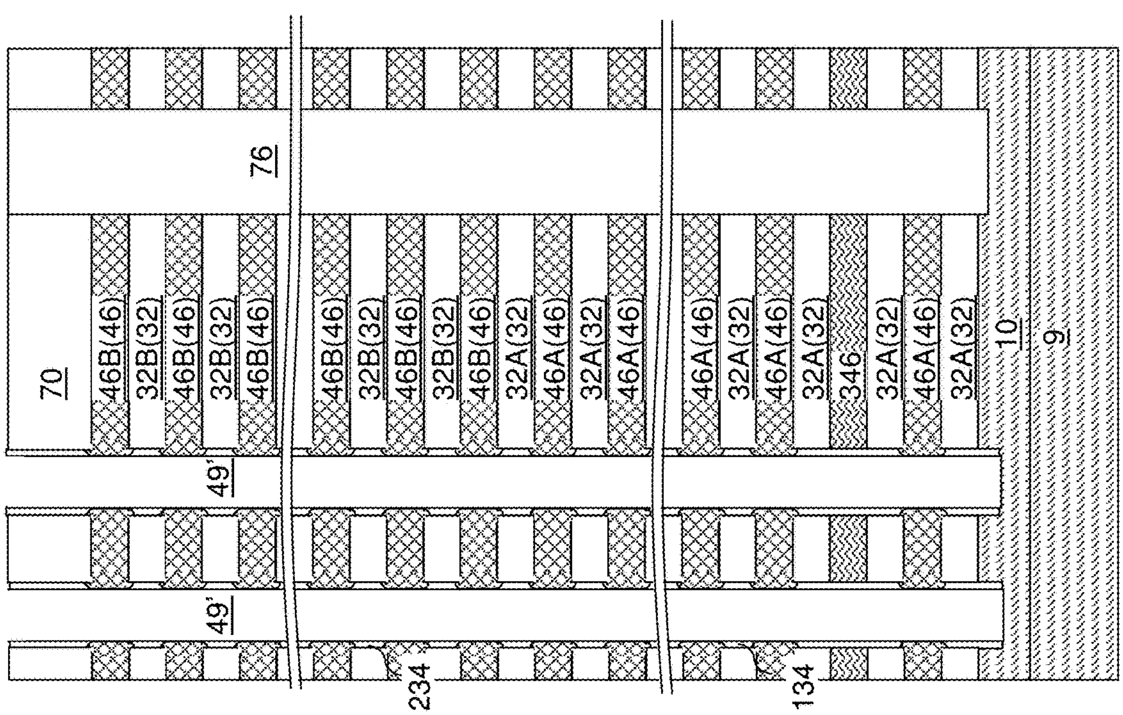
FIG. 63A is a vertical cross-sectional view of the sixth exemplary structure after removal of sacrificial memory opening fill structures according to an embodiment of the present disclosure.

Referring to FIGS. 63A and 63B, the sacrificial memory opening fill material portions (137, 237) can be removed selective to the electrically conductive layers 46 and the tubular dielectric spacers (134, 234) and a remaining horizontal bottom portion of each first-tier dielectric liner 133, and to physically expose a horizontal surface of the semiconductor material layer 10 underneath each memory cavity 49', as described above.

Generally, the horizontal portion of each first-tier dielectric liner 133 can be removed after removing the sacrificial memory opening fill material portions (137, 237) by an anisotropic etch process. A surface of the substrate (9, 10) is exposed upon removal of the horizontal portions of the first-tier dielectric liners 133. Each memory cavity 49' includes the volumes from which a second memory opening fill material portion 237 and a first memory opening fill material portion 137 are removed.

Generally, the sacrificial memory opening fill material portions (237, 137) can be removed selective to the electrically conductive layers 46 and the tubular dielectric spacers (134, 234) by an etch process. The etch process etches materials of the sacrificial memory opening fill material portions (237, 137) selective to the material of remaining portions of the dielectric liners (133, 233), which may be the second silicon oxide material. A memory cavity 49' is formed within a volume of a memory opening.

Remaining portions of the dielectric liners (133, 233) after formation of the memory cavities 49' comprise vertical stacks of tubular dielectric spacers (134, 234). Each of the tubular dielectric spacers (134, 234) can be in contact with a cylindrical sidewall of a respective one of the insulating layers 32.

Figure 64B:
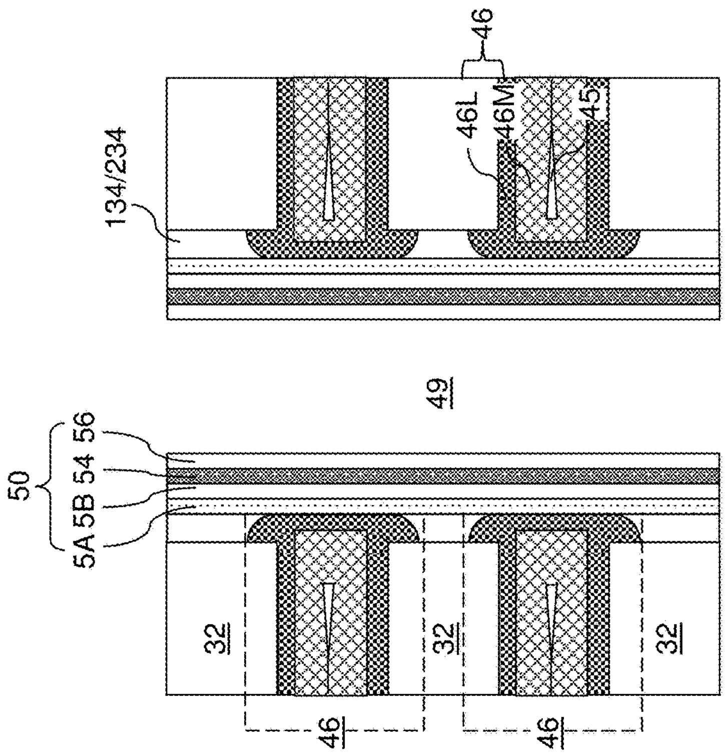
FIG. 64B is a magnified view of a region of the sixth exemplary structure of FIG. 64A around a memory opening.
Figure 64A:
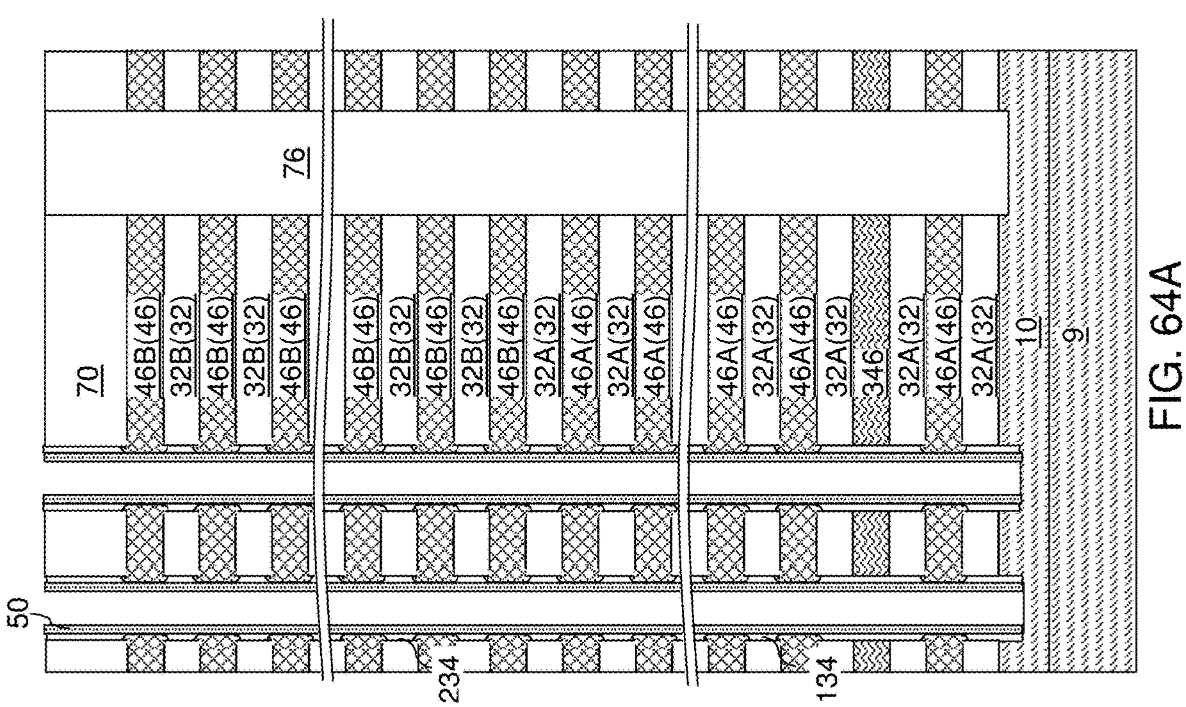
FIG. 64A is a vertical cross-sectional view of the sixth exemplary structure after formation of memory films according to an embodiment of the present disclosure.

Referring to FIGS. 64A and 64B, the processing steps of FIGS. 41A and 41B can be performed to form a memory film 50 within each memory cavity 49'. In one embodiment, each memory film 50 may comprise, from outside to inside, an optional dielectric metal oxide blocking dielectric layer 5A, an optional silicon oxide blocking dielectric layer 5B, a memory material layer 54, and an optional tunneling dielectric layer 56.

Each memory film 50 may comprise a straight outer sidewall and a straight inner sidewall. The outer sidewall of each memory film 50 may comprise first portions contacting cylindrical sidewalls of the electrically conductive layers 46, and second portions contacting cylindrical inner sidewalls of the tubular dielectric spacers (134, 234). In one embodiment, an outer sidewall of each memory film 50 extends straight along a vertical direction through each of the electrically conductive layers 46 and the insulating layers 32 in the alternating stack (32, 46). The outer sidewall of each memory film 50 contacts each of the electrically conductive layers 46 and each tubular dielectric spacer (134, 234) in a vertical stack of tubular dielectric spacers (134, 234).

In one embodiment, each memory film 50 comprises a layer stack including, from outside to inside, a dielectric metal oxide blocking dielectric layer 5A, a silicon oxide blocking dielectric layer 5B, a memory material layer (such as a charge storage layer), and a tunneling dielectric layer 56. In one embodiment, the dielectric metal oxide blocking dielectric layer 5A comprises an outer cylindrical sidewall that extends straight through the alternating stack (32, 46) along a vertical direction, and an inner cylindrical sidewall that extends straight through the alternating stack (32, 46) along the vertical direction.

Figure 65B:
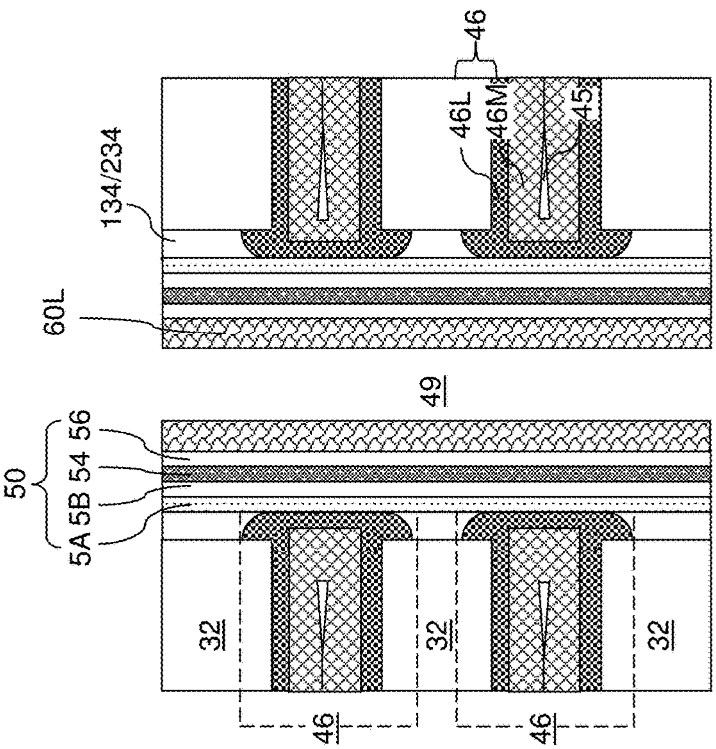
FIG. 65B is a magnified view of a region of the sixth exemplary structure of FIG. 65A around a memory opening.
Figure 65A:
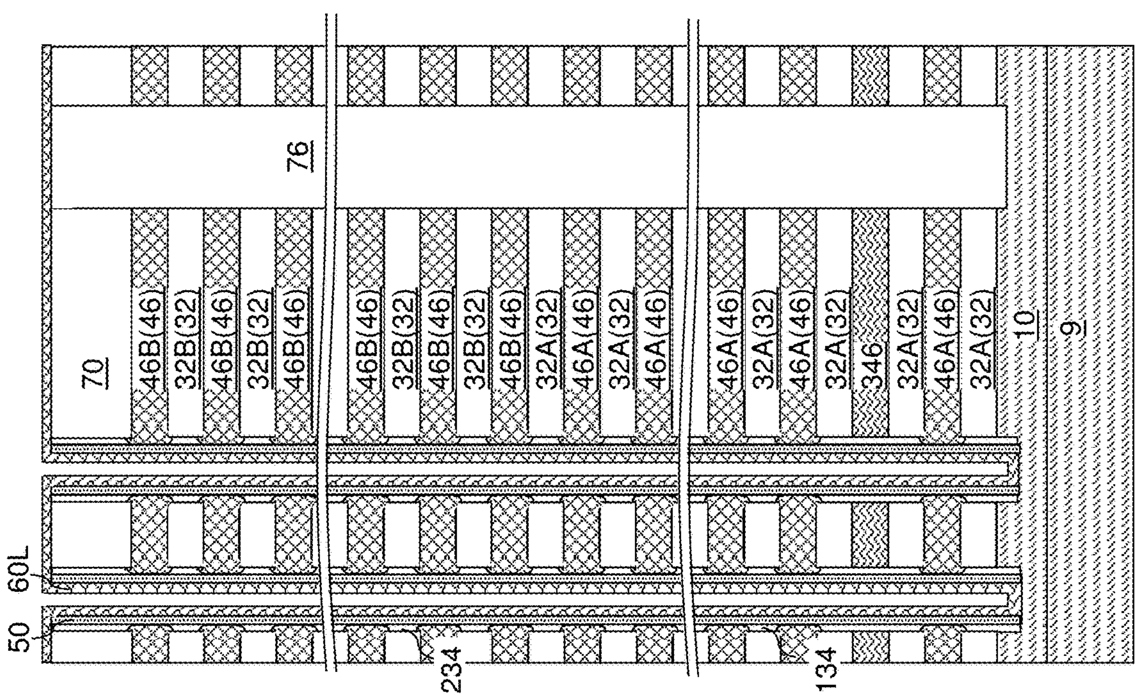
FIG. 65A is a vertical cross-sectional view of the sixth exemplary structure after formation of a semiconductor channel layer according to an embodiment of the present disclosure.

Referring to FIGS. 65A and 65B, the processing steps of FIGS. 42A and 42B can be performed to form a semiconductor channel layer 60L.

Figure 66B:
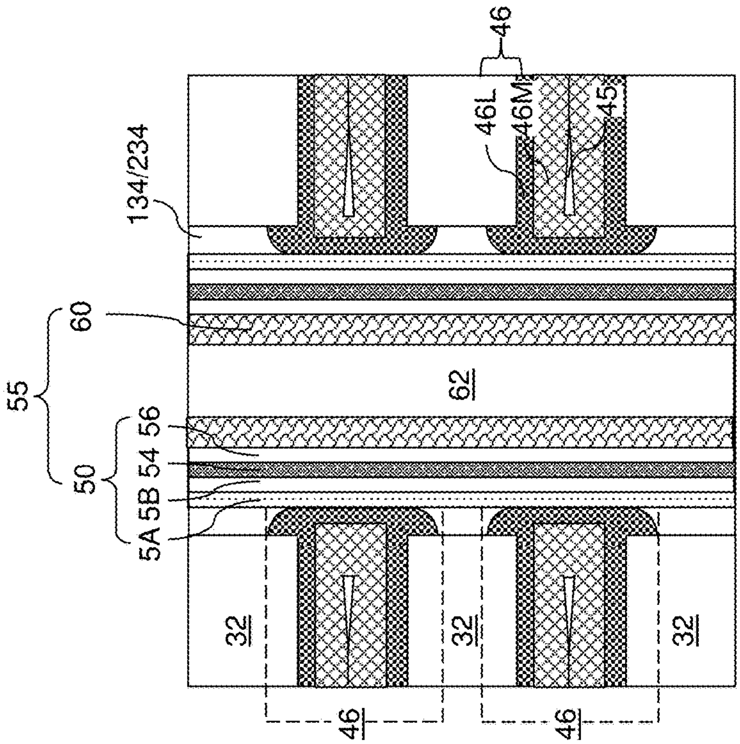
FIG. 66B is a magnified view of a region of the sixth exemplary structure of FIG. 66A around a memory opening.
Figure 66A:
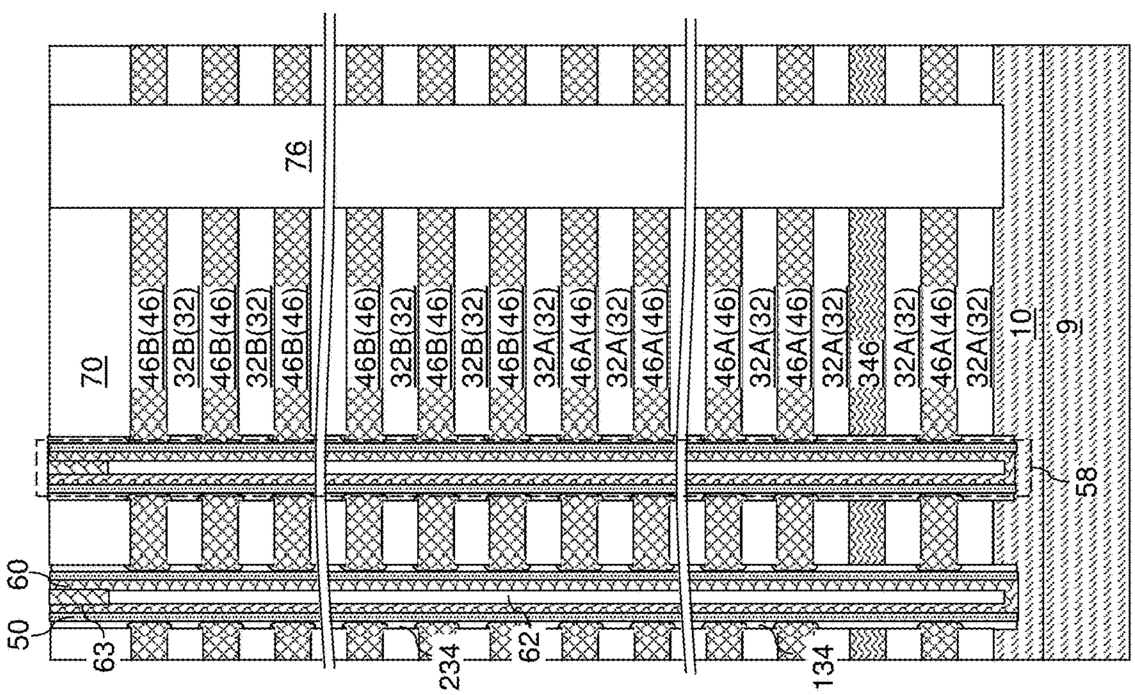
FIG. 66A is a vertical cross-sectional view of the sixth exemplary structure after formation of memory opening fill structures according to an embodiment of the present disclosure.

Referring to FIGS. 66A and 66B, the processing steps of FIGS. 43A and 43B can be performed to form dielectric cores 62, vertical semiconductor channels 60, and drain regions 63. Generally, a memory opening fill structure 58 can be formed in each memory cavity 49'. Each memory opening fill structure 58 comprises a memory film 50 and a vertical semiconductor channel 60.

Referring to FIGS. 59A-66B and related drawings and according to various embodiments of the present disclosure, a three-dimensional memory device is provided, which comprises: an alternating stack of insulating layers 32 and electrically conductive layers 46; memory openings extending through the alternating stack (32, 46); and memory opening fill structures 58 located in the memory openings and comprising a respective vertical semiconductor channel 60 and a respective memory film 50, wherein each electrically conductive layer 46 within a subset of the electrically conducive layers 46 comprises: a metallic fill material layer 46M comprising a metal; and a metallic liner 46L comprising an upper horizontally-extending portion overlying the metallic fill material layer 46M, a lower horizontally-extending portion underlying the metallic fill material layer 46M, and a vertically-extending portion connecting the upper horizontally-extending portion and the lower horizontally-extending portion and having a greater vertical extent than a vertical distance between a top surface of the upper horizontally-extending portion and a bottom surface of the lower horizontally-extending portion.

In one embodiment, the metallic liner 46L comprises an inner cylindrical surface segment in contact with an outer sidewall of the memory film 50. In one embodiment, a vertical stack of tubular dielectric spacers (134, 234) laterally surrounds the memory opening fill structure 58, and comprises tapered concave surface segments in contact with concave surface segments of the metallic liners 46L of the electrically conductive layers 46.

In one embodiment, an outer sidewall of the memory film 50 extends straight along a vertical direction through each of the electrically conductive layers 46 and the insulating layers 32 in the alternating stack (32, 46), and contacts each of the electrically conductive layers 46 and each tubular dielectric spacer (134, 234). In one embodiment, outer sidewalls of the tubular dielectric spacers (134, 234) are vertically coincident with cylindrical interfaces between the insulating layers 32 and the vertically-extending portions of the metallic liners 46L of the electrically conductive layers 46. In one embodiment, at least one of the electrically conductive layers 46 comprises at least one of a seam or air gap 45 embedded within a respective metallic fill material layer 46M.

The various embodiments of the present disclosure can be employed to provide an integration scheme in which the sacrificial material layers 42 are replaced with electrically conductive layers 46 prior to replacing sacrificial memory opening fill material portions (137, 237) with memory opening fill structures 58. The lateral extents and the shapes of the electrically conductive layers 46 can have various configurations depending on the various embodiments of the present disclosure. Replacement of the selective material layers 42 with electrically conductive layers 46 prior to replacement of the sacrificial memory opening fill material portions (137, 237) with the memory opening fill structures 58 prevents collateral expansion of the size of the memory openings during formation of the memory opening fill structures 58 because the electrically conductive layers 46 are generally more resistant to isotropic etch processes than sacrificial material layers 42. Thus, the electrically conductive layers 46 of the embodiments of the present disclosure may have enhanced metal fill characteristics, and may provide lower resistance to reduce RC delays.

Although the foregoing refers to particular preferred embodiments, it will be understood that the claims are not so limited. It will occur to those of ordinary skill in the art that various modifications may be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A method of forming a three-dimensional memory device, comprising:

forming an alternating stack of insulating layers and sacrificial material layers over a substrate;

forming a memory opening extending through the alternating stack;

forming a sacrificial memory opening fill structure in the memory opening;

replacing the sacrificial material layers with electrically conductive layers;

removing the sacrificial memory opening fill structure selective to the electrically conductive layers; and forming a memory opening fill structure in the memory opening after replacing the sacrificial material layers with electrically conductive layers and after removing the sacrificial memory opening fill structure, wherein the memory opening fill structure comprises a memory film and a vertical semiconductor channel.

2. The method of claim 1, wherein a memory cavity is formed within a volume of the memory opening after the step of removing the sacrificial memory opening fill structure.

3. The method of claim 2, further comprising:

laterally recessing the insulating layers selective to the electrically conductive layers around the memory cavity; and forming a vertical stack of tubular dielectric spacers on recessed sidewalls of the insulating layers in the memory cavity.

4. The method of claim 3, further comprising anisotropically etching portions of the electrically conductive layers that are not covered by the vertical stack of tubular dielectric spacers.

5. The method of claim 4, wherein the anisotropically etching portions of the electrically conductive layers comprises performing an anisotropic etch process during formation of the vertical stack of tubular dielectric spacers and prior to formation of the memory opening fill structure.

6. The method of claim 4, wherein the anisotropically etching portions of the electrically conductive layers comprises performing an anisotropic etch process after formation of the vertical stack of tubular dielectric spacers and prior to formation of the memory opening fill structure.

7. The method of claim 4, further comprising:

forming a backside trench;

forming backside recesses by removing the sacrificial material layers through the backside trench selective to the insulating layers and the sacrificial memory opening fill structure;

depositing a metallic liner material in the backside recesses through the backside trench; and depositing a metal in remaining volumes of the backside recesses through the backside trench, wherein each of the electrically conductive layers comprises a metallic fill material layer comprising a portion of the metal, and a metallic liner comprising a portion of the metallic liner material.

8. The method of claim 7, wherein sidewalls of the metallic fill material layers are exposed upon anisotropically etching the portions of the electrically conductive layers that are not covered by the vertical stack of tubular dielectric spacers.

9. The method of claim 4, wherein:

each of the electrically conductive layers comprises a metallic fill material layer embedded within a metallic liner prior to the anisotropic etching;

the anisotropic etching removes vertically-extending portions of the metallic liners; and each of the metallic liners is divided into a respective upper metallic liner and a lower metallic liner by the anisotropic etch process.

10. The method of claim 9, wherein:

one of the electrically conductive layers comprises a seam or air gap prior to the anisotropic etch process;

the seam or air gap is laterally spaced from the memory cavity by a portion of the metallic fill material layer of the one of the electrically conductive layers after the anisotropic etching.

* * * * *